(12) United States Patent
Matsubayashi et al.

(10) Patent No.: US 8,963,148 B2
(45) Date of Patent: Feb. 24, 2015

(54) SEMICONDUCTOR DEVICE

(71) Applicant: Semiconductor Energy Laboratory Co., Ltd., Atsugi (JP)

(72) Inventors: Daisuke Matsubayashi, Kanagawa (JP); Satoshi Shinohara, Kanagawa (JP); Wataru Sekine, Kanagawa (JP); Naoto Kusumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/079,694

(22) Filed: Nov. 14, 2013

(65) Prior Publication Data

US 2014/0131702 A1    May 15, 2014

(30) Foreign Application Priority Data

Nov. 15, 2012    (JP) .................................. 2012-251496

(51) Int. Cl.
*H01L 29/786*    (2006.01)
(52) U.S. Cl.
CPC ...... *H01L 29/7869* (2013.01); *H01L 29/78648* (2013.01); *H01L 29/78645* (2013.01)
USPC ........................................................ 257/43
(58) Field of Classification Search
CPC .................... H01L 29/7869; H01L 29/78648; H01L 29/78645
USPC ................................ 257/43, 59, 72
See application file for complete search history.

(56) References Cited

U.S. PATENT DOCUMENTS

| | | | |
|---|---|---|---|
| 4,466,081 | A | 8/1984 | Masuoka |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Nikolay Yushin
(74) *Attorney, Agent, or Firm* — Fish & Richardson P.C.

(57) ABSTRACT

Provided is a semiconductor device having a structure which can suppress a decrease in electrical characteristics, which becomes more significant with miniaturization. The semiconductor device includes a plurality of gate electrode layers separated from each other. One of the plurality of gate electrode layers includes a region which overlaps with a part of an oxide semiconductor layer, a part of a source electrode layer, and a part of a drain electrode layer. Another of the plurality of gate electrode layers overlaps with a part of an end portion of the oxide semiconductor layer. The length in the channel width direction of each of the source electrode layer and the drain electrode layer is shorter than that of the one of the plurality of gate electrode layers.

20 Claims, 30 Drawing Sheets

(56) References Cited

U.S. PATENT DOCUMENTS

| | | | |
|---|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi |
| 7,884,360 B2 | 2/2011 | Takechi |
| 7,892,898 B2 | 2/2011 | Oba |
| 7,994,579 B2 | 8/2011 | Itai |
| 8,148,779 B2 | 4/2012 | Jeong |
| 8,203,143 B2 | 6/2012 | Imai |
| 8,237,166 B2 | 8/2012 | Kumomi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2014/0110704 A1 | 4/2014 | Yamazaki et al. |
| 2014/0110706 A1 | 4/2014 | Yamazaki |
| 2014/0131700 A1 | 5/2014 | Yamazaki |

FOREIGN PATENT DOCUMENTS

| | | | |
|---|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-206306 A | 9/2009 |
| JP | 2011-171702 A | 9/2011 |
| JP | 2011-181801 A | 9/2011 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

(56) References Cited

OTHER PUBLICATIONS

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

(56) References Cited

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

SEMICONDUCTOR DEVICE

BACKGROUND OF THE INVENTION

1. Field of the Invention

The present invention relates to a semiconductor device including an oxide semiconductor.

In this specification, a "semiconductor device" refers to a device that can function by utilizing semiconductor characteristics; an electro-optical device, a semiconductor circuit, and an electronic device are all included in the category of the semiconductor device.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another example, an oxide semiconductor has been attracting attention.

For example, a transistor whose active layer includes an amorphous oxide semiconductor containing indium (In), gallium (Ga), and zinc (Zn) is disclosed in Patent Document 1.

REFERENCE

Patent Document

[Patent Document 1] Japanese Published Patent Application No. 2006-165528

SUMMARY OF THE INVENTION

As one way to reduce an off-state current of a transistor, the use of an oxide semiconductor material for an active layer of the transistor is proposed. Such a transistor has an extremely low off-state current compared with a transistor including a silicon-based semiconductor material.

It is known that miniaturization of a transistor causes deterioration of electrical characteristics of the transistor, such as threshold voltage and an S value (subthreshold value).

As measures against the above problem, the following structure is considered: an oxide semiconductor layer (an active layer) is provided between an upper gate electrode layer and a lower gate electrode layer with an insulating film provided between the oxide semiconductor layer and each of the gate electrode layers, and one gate electrode layer is used to control the operation and the other gate electrode layer is used to control the threshold voltage. However, although it is preferable that a thick oxide insulating film which supplies much oxygen to the active layer be formed between the active layer and the other gate electrode layer, there has been a problem in that the electric field from the other gate electrode layer is less likely to reach the oxide semiconductor layer.

One object of one embodiment of the present invention is to provide a semiconductor device in which deterioration of electrical characteristics which becomes more noticeable as the transistor is miniaturized can be suppressed. Another object of one embodiment of the present invention is to provide a semiconductor device with high reliability.

One embodiment of the present invention relates to a semiconductor device including a plurality of gate electrode layers: a gate electrode layer for controlling on/off of a transistor and a gate electrode layer for controlling the threshold voltage of the transistor.

One embodiment of the present invention is a semiconductor device including an oxide semiconductor layer over a substrate; a source electrode layer and a drain electrode layer in contact with the oxide semiconductor layer; a gate insulating film over the oxide semiconductor layer, the source electrode layer, and the drain electrode layer; and a plurality of gate electrode layers over the gate insulating film. The plurality of gate electrode layers are separated from each other. One of the plurality of gate electrode layers includes a region which overlaps with a part of the oxide semiconductor layer, a part of the source electrode layer, and a part of the drain electrode layer. Another of the plurality of gate electrode layers overlaps with a part of an end portion of the oxide semiconductor layer. The length of each of the source electrode layer and the drain electrode layer in a channel width direction is shorter than the length of the one of the plurality of gate electrode layers in the channel width direction.

In the above structure, the oxide semiconductor layer has a structure in which a first oxide semiconductor layer, a second oxide semiconductor layer, and a third oxide semiconductor layer are stacked in this order from the substrate side. Energy of a bottom of a conduction band of each of the first oxide semiconductor layer and the third oxide semiconductor layer is preferably closer to a vacuum level than energy of a bottom of a conduction band of the second oxide semiconductor layer is. An energy difference between the second oxide semiconductor layer and the first oxide semiconductor layer and an energy difference between the second oxide semiconductor layer and the third oxide semiconductor layer are each preferably greater than or equal to 0.05 eV and smaller than or equal to 2 eV.

It is preferable that the first oxide semiconductor layer, the second oxide semiconductor layer, and the third oxide semiconductor layer each include In-M-Zn oxide (M is Al, Ti, Ga, Y, Zr, La, Ce, Nd, or Hf), and that an atomic ratio of M with respect to In in each of the first oxide semiconductor layer and the third oxide semiconductor layer be higher than an atomic ratio of M with respect to In in the second oxide semiconductor layer.

The source electrode layer may include a first source electrode layer which is in contact with the oxide semiconductor layer and a second source electrode layer which covers the first source electrode layer and is in contact with the oxide semiconductor layer. The drain electrode layer may include a first drain electrode layer which is in contact with the oxide semiconductor layer and a second drain electrode layer which covers the first drain electrode layer and is in contact with the oxide semiconductor layer.

The source electrode layer may include a second source electrode layer which is in contact with the oxide semiconductor layer and a first source electrode layer which is over the second source electrode layer and is in contact with the oxide semiconductor layer. The drain electrode layer may include a second drain electrode layer which is in contact with the oxide semiconductor layer and a first drain electrode layer which is over the second drain electrode layer and is in contact with the oxide semiconductor layer.

Here, the first source electrode layer and the first drain electrode layer are each preferably formed using Al, Cr, Cu, Ta, Ti, Mo, and W, or an alloy material including any of these materials as its main component, and the second source electrode layer and the second drain electrode layer are each preferably formed using a material including tantalum nitride, titanium nitride, or ruthenium.

Another embodiment of the present invention is a semiconductor device including a first oxide semiconductor layer over a substrate; a second oxide semiconductor layer over the first oxide semiconductor layer; a first source electrode layer and a first drain electrode layer over the second oxide semiconductor layer; a third oxide semiconductor layer over the second oxide semiconductor layer, the first source electrode layer, and the first drain electrode layer; a second source electrode layer covering the first source electrode layer; a second drain electrode layer covering the first drain electrode layer; a gate insulating film over the third oxide semiconductor layer, the second source electrode layer, and the second drain electrode layer; and a plurality of gate electrode layers over the gate insulating film. The first source electrode layer and the first drain electrode layer are each in contact with the first oxide semiconductor layer, the second oxide semiconductor layer, and the third oxide semiconductor layer. The second source electrode layer and the second drain electrode layer are in contact with the third oxide semiconductor layer. The plurality of gate electrode layers are separated from each other. One of the plurality of gate electrode layers includes a region which overlaps with a part of the first oxide semiconductor layer, a part of the second oxide semiconductor layer, a part of the third oxide semiconductor layer, a part of the first source electrode layer, a part of the second source electrode layer, a part of the first drain electrode layer, and a part of the second drain electrode layer. Another of the plurality of gate electrode layers overlaps with a part of an end portion of the first oxide semiconductor layer, a part of an end portion of the second oxide semiconductor layer, and a part of an end portion of the third oxide semiconductor layer. The length of each of the first source electrode layer, the second source electrode layer, the first drain electrode layer, and the second drain electrode layer in a channel width direction is shorter than the length of the one of the plurality of gate electrode layers in a channel width direction.

In the above structure, energy of a bottom of a conduction band of each of the first oxide semiconductor layer and the third oxide semiconductor layer is preferably closer to a vacuum level than energy of a bottom of a conduction band of the second oxide semiconductor layer is. Further, an energy difference between the second oxide semiconductor layer and the first oxide semiconductor layer and an energy difference between the second oxide semiconductor layer and the third oxide semiconductor layer are each preferably greater than or equal to 0.05 eV and smaller than or equal to 2 eV.

It is preferable that the first to third oxide semiconductor layers each include an In-M-Zn oxide (M is Al, Ti, Ga, Y, Zr, La, Ce, Nd, or Hf), and that an atomic ratio of M with respect to In in each of the first and third oxide semiconductor layers be higher than an atomic ratio of M with respect to In in the second oxide semiconductor layer.

In the above structure, it is preferable that the first source electrode layer and the first drain electrode layer be each formed using Al, Cr, Cu, Ta, Ti, Mo, W, or an alloy material containing any of Al, Cr, Cu, Ta, Ti, Mo, and W as its main component.

The second source electrode layer and the second drain electrode layer are each preferably formed using a material comprising tantalum nitride, titanium nitride, or ruthenium.

In the above two modes of the semiconductor device, the plurality of gate electrode layers can include a first gate electrode layer, a second gate electrode layer, and a third gate electrode layer. Alternatively, the plurality of gate electrode layers can include a first gate electrode layer and a second gate electrode layer.

According to one embodiment of the present invention, a semiconductor device can be provided in which deterioration of electrical characteristics which becomes more noticeable as the transistor is miniaturized can be suppressed. Further, a semiconductor device with high reliability can be provided.

DETAILED DESCRIPTION OF THE INVENTION

Figure 1A:
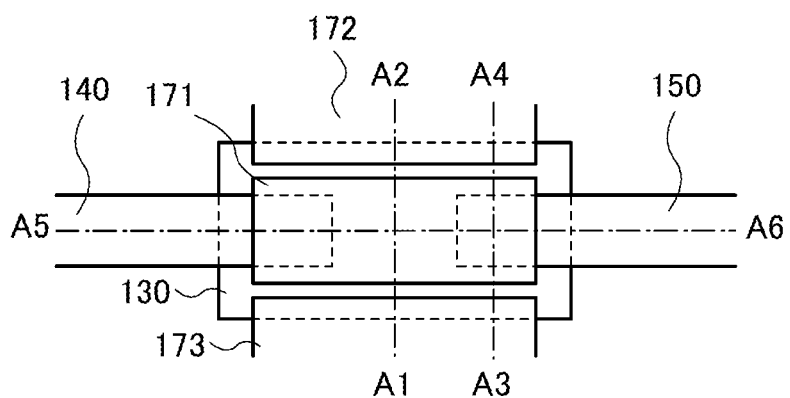
FIGS. 1A to 1D are a top view and cross-sectional views illustrating a transistor.

Embodiments are described in detail with reference to the drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiments below. Note that in structures of the present invention described below, the same portions or portions having similar functions are denoted by the same reference numerals in different drawings, and description thereof is omitted in some cases.

Note that in this specification and the like, when it is explicitly described that X and Y are connected, the case where X and Y are electrically connected, the case where X and Y are functionally connected, and the case where X and Y are directly connected are included therein. Here, each of X and Y denotes an object (e.g., a device, an element, a circuit, a wiring, an electrode, a terminal, a conductive film, a layer, or the like). Accordingly, another connection relation shown in drawings and texts is included without being limited to a predetermined connection relation, for example, the connection relation shown in the drawings and the texts.

For example, in the case where X and Y are electrically connected, one or more elements which enable electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, the switch has a function of determining whether current flows or not by being turning on or off (becoming an on state and an off state). Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "A and B are electrically connected", the description is the same as the case where it is explicitly only described that "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, or the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of an attachment film are attachment films formed using polypropylene, polyester, polyvinyl fluoride, polyvinyl chloride, and the like. Examples of a base film are a base film formed using polyester, polyamide, polyimide, inorganic vapor deposition film, paper, and the like. Specifically, when a transistor is formed using a semiconductor substrate, a single crystal substrate, an SOI substrate, or the like, a transistor with few variations in characteristics, size, shape, or the like, high current supply capability, and a small size can be formed. By forming a circuit using such transistors, power consumption of the circuit can be reduced or the circuit can be highly integrated.

Note that the transistor may be formed using one substrate, and then, the transistor may be transferred to another substrate. Example of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, transistors with excellent properties or transistors with low power consumption can be formed, a device with high durability or high heat resistance can be formed, or reduction in weight or thinning can be achieved.

Embodiment 1

In this embodiment, a semiconductor device of one embodiment of the present invention will be described with reference to drawings.

FIGS. 1A to 1D are a top view and cross-sectional views which illustrate a transistor of one embodiment of the present invention. FIG. 1A is the top view. A cross section taken along dashed-dotted line A1-A2 in FIG. 1A corresponds to FIG. 1B. A cross section taken along dashed-dotted line A3-A4 in FIG. 1A corresponds to FIG. 1C. A cross section taken along dashed-dotted line A5-A6 in FIG. 1A corresponds to FIG. 1D. Note that for simplification of the drawing, some components in the top view in FIG. 1A are not illustrated. In some cases, the direction of the dashed-dotted line A1-A2 is referred to as a channel width direction, and the direction of the dashed-dotted line A5-A6 is referred to as a channel length direction.

A transistor 100 illustrated in FIGS. 1A to 1D includes a base insulating film 120 formed over a substrate 110; an oxide semiconductor layer 130 formed over the base insulating film 120; a source electrode layer 140 and a drain electrode layer 150 formed over the oxide semiconductor layer 130; a gate insulating film 160 formed over the source electrode layer 140, the drain electrode layer 150, and the oxide semiconductor layer 130; and a first gate electrode layer 171, a second gate electrode layer 172, and a third gate electrode layer 173 formed over the gate insulating film 160. Further, an oxide insulating layer 180 may be formed over the gate insulating film 160 and the gate electrode layers. Note that the oxide insulating layer 180 may be provided as needed and another insulating layer may be further provided thereover.

Note that functions of a "source" and a "drain" of a transistor are sometimes replaced with each other when a transistor of opposite polarity is used or when the direction of current flowing is changed in circuit operation, for example. Thus, the terms "source" and "drain" can be used to denote the drain and the source, respectively, in this specification.

The substrate 110 is not limited to a simple supporting substrate, and may be a substrate where another device such as a transistor is formed. In that case, at least one of the first gate electrode layer 171, the second gate electrode layer 172, the third gate electrode layer 173, the source electrode layer 140, and the drain electrode layer 150 of the transistor 100 may be electrically connected to the above device.

The base insulating film 120 can have a function of supplying oxygen to the oxide semiconductor layer 130 as well as a function of preventing diffusion of an impurity from the substrate 110; thus, the base insulating film 120 is preferably an insulating film containing oxygen, further preferably an insulating film containing excess oxygen. Note that in the case where the substrate 110 is a substrate where another device is formed as described above, the base insulating film 120 also has a function as an interlayer insulating film. In that case, the base insulating film 120 is preferably subjected to planarization treatment such as chemical mechanical polishing (CMP) treatment so as to have a flat surface.

Further, the oxide semiconductor layer 130 has a structure in which a first oxide semiconductor layer 131, a second oxide semiconductor layer 132, and a third oxide semiconductor layer 133 are stacked in this order from the substrate 110 side. Here, for the second oxide semiconductor layer 132, an oxide semiconductor whose electron affinity (a difference in energy between a vacuum level and a bottom of a conduction band) is higher than those of the first oxide semiconductor layer 131 and the third oxide semiconductor layer 133 is used. The electron affinity can be obtained by subtracting an energy difference between a bottom of a conduction band and a top of a valence band (what is called an energy gap) from an energy difference between the vacuum level and the top of the valence band (what is called an ionization potential).

Although the case where the oxide semiconductor layer 130 is a stack including three layers is described in this embodiment, the oxide semiconductor layer 130 may be a single layer or a stack including two layers or four or more layers. In the case of a single layer, a layer corresponding to the second oxide semiconductor layer 132 is used. In the case of the two-layer stacked structure, a layer corresponding to the second oxide semiconductor layer 132 is provided on the substrate 110 side and a layer corresponding to the first oxide semiconductor layer 131 or the third oxide semiconductor layer 133 is provided on the gate insulating film 160 side. In the case of four or more layers, the second oxide semiconductor layer 132 is provided between layers each corresponding to the first oxide semiconductor layer 131 or the third oxide semiconductor layer 133 as described in this embodiment.

The first oxide semiconductor layer 131 and the third oxide semiconductor layer 133 each contain one or more kinds of metal elements forming the second oxide semiconductor layer 132. The first oxide semiconductor layer 131 and the third oxide semiconductor layer 133 are preferably formed using an oxide semiconductor whose energy of the bottom of the conduction band is closer to a vacuum level than that of the second oxide semiconductor layer 132. Further, the energy difference between the second oxide semiconductor layer 132 and the first oxide semiconductor layer 131 and the energy difference between the second oxide semiconductor layer 132 and the third oxide semiconductor layer 133 are each preferably greater than or equal to 0.05 eV, 0.07 eV, 0.1 eV, or 0.15 eV and smaller than or equal to 2 eV, 1 eV, 0.5 eV, or 0.4 eV.

In such a structure, when an electric field is applied to the first gate electrode layer 171, a channel is formed in the second oxide semiconductor layer 132 of the oxide semiconductor layer 130, whose energy at the bottom of the conduction band is the lowest. In other words, the third oxide semiconductor layer 133 is formed between the second oxide semiconductor layer 132 and the gate insulating film 160, whereby a structure in which the channel of the transistor is not in contact with the gate insulating film 160 can be obtained.

Further, since the first oxide semiconductor layer 131 includes one or more metal elements included in the second oxide semiconductor layer 132, an interface state is less likely to be formed at the interface between the second oxide semiconductor layer 132 and the first oxide semiconductor layer 131. The interface state sometimes forms a channel; therefore, the threshold voltage of the transistor is changed in some cases. Thus, with the first oxide semiconductor layer 131, fluctuation in electrical characteristics of the transistors, such as a threshold voltage, can be reduced.

Furthermore, since the third oxide semiconductor layer 133 includes one or more metal elements included in the second oxide semiconductor layer 132, scattering of carriers is less likely to occur at the interface between the second oxide semiconductor layer 132 and the third oxide semiconductor layer 133. Therefore, with the third oxide semiconductor layer 133, the field-effect mobility of the transistor can be increased.

For the first oxide semiconductor layer 131 and the third oxide semiconductor layer 133, for example, a material containing Al, Ti, Ga, Ge, Y, Zr, Sn, La, Ce, or Hf with a higher atomic ratio than that used for the second oxide semiconductor layer 132 can be used. Specifically, an atomic ratio of any of the above metal elements in the first oxide semiconductor layer 131 and the third oxide semiconductor layer 133 is 1.5 times or more, preferably 2 times or more, further preferably 3 times or more as much as that in the second oxide semiconductor layer 132. Any of the above metal elements is strongly bonded to oxygen and thus has a function of suppressing generation of an oxygen vacancy in the first oxide semiconductor layer 131 and the third oxide semiconductor layer 133. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, a transistor can have stable electrical characteristics. However, when $y_2$ is 3 times or more as great as $x_2$, the field-effect mobility of the transistor is reduced; accordingly, $y_2$ is preferably less than 3 times $x_2$.

Further, when summation of In and M is assumed to be 100 atomic %, the proportions of In and M in each of the first oxide semiconductor layer 131 and the third oxide semiconductor layer 133 are preferably less than 50 atomic % and greater than or equal to 50 atomic %, respectively, and further preferably less than 25 atomic % and greater than or equal to 75 atomic %. In addition, when summation of In and M is assumed to be 100 atomic %, the proportions of In and M in the second oxide semiconductor layer 132 are preferably greater than or equal to 25 atomic % and less than 75 atomic %, respectively, and further preferably greater than or equal to 34 atomic % and less than 66 atomic %.

The thicknesses of the first oxide semiconductor layer 131 and the third oxide semiconductor layer 133 are each greater than or equal to 3 nm and less than or equal to 100 nm, preferably greater than or equal to 3 nm and less than or equal to 50 nm. The thickness of the second oxide semiconductor layer 132 is greater than or equal to 3 nm and less than or equal to 200 nm, preferably greater than or equal to 3 nm and less than or equal to 100 nm, further preferably greater than or equal to 3 nm and less than or equal to 50 nm.

For the first oxide semiconductor layer 131, the second oxide semiconductor layer 132, and the third oxide semiconductor layer 133, an oxide semiconductor containing indium, zinc, and gallium can be used, for example. Note that the second oxide semiconductor layer 132 preferably contains indium because carrier mobility can be increased.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

Further, in the oxide semiconductor layer, hydrogen, nitrogen, carbon, silicon, and a metal element other than main components are impurities. For example, hydrogen and nitrogen form donor levels to increase the carrier density. Silicon forms impurity levels in an oxide semiconductor layer. The impurity levels serve as traps and might cause electrical characteristics of the transistor to deteriorate. Therefore, it is preferable to reduce the concentration of the impurities in the first oxide semiconductor layer 131, the second oxide semiconductor layer 132, and the third oxide semiconductor layer 133 and at interfaces between the layers.

In order to make the oxide semiconductor layer intrinsic or substantially intrinsic, in SIMS (secondary ion mass spectrometry), the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of hydrogen is preferably lower than or equal to $2\times10^{20}$ atoms/cm$^3$, further preferably lower than or equal to $5\times10^{19}$ atoms/cm$^3$, still further preferably lower than or equal to $1\times10^{19}$ atoms/cm$^3$, yet still further preferably lower than $5\times10^{18}$ atoms/cm$^3$. Further, the concentration of nitrogen is preferably lower than $5\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, the concentration of silicon is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon is lower than $1\times10^{19}$ atoms/cm$^3$, preferably lower than $5\times10^{18}$ atoms/cm$^3$, further preferably lower than $1\times10^{18}$ atoms/cm$^3$.

A transistor in which a highly purified oxide semiconductor layer is used for a channel formation region as described above has an extremely low off-state current. The off-state current standardized on the channel width of the transistor can be as low as several yoktoamperes per micrometer to several zeptoamperes per micrometer when the drain voltage is about 0.1 V to 10 V.

Note that as the gate insulating film of the transistor, an insulating film containing silicon is used in many cases; therefore, it is preferable that a region of the oxide semiconductor layer, which serves as a channel, be not in contact with the gate insulating film for the above-described reason. In the case where a channel is formed at the interface between a gate insulating film and an oxide semiconductor layer, scattering of carriers occurs at the interface, whereby the field-effect mobility of a transistor is reduced in some cases. Also from the view of the above, it is preferable that a region of the oxide semiconductor layer, which serves as a channel, be separated from the gate insulating film.

Therefore, with the oxide semiconductor layer 130 having a stacked-layer structure including the first oxide semiconductor layer 131, the second oxide semiconductor layer 132, and the third oxide semiconductor layer 133, the second oxide semiconductor layer 132 where a channel of the transistor is formed can be separated from the gate insulating film; accordingly, the transistor can have a high field-effect mobility and stable electrical characteristics.

Next, the band structure of the oxide semiconductor layer 130 will be described. A stack corresponding to the oxide semiconductor layer 130 in which an In—Ga—Zn oxide having an energy gap of 3.15 eV is used as a layer corresponding to each of the first oxide semiconductor layer 131 and the third oxide semiconductor layer 133 and an In—Ga—Zn oxide having an energy gap of 2.8 eV is used as a layer corresponding to the second oxide semiconductor layer 132 is formed, and the band structure thereof is analyzed. Note that for convenience, the stack is referred to as the oxide semiconductor layer 130, and the layers forming the stack are referred to as the first oxide semiconductor layer 131, the second oxide semiconductor layer 132, and the third oxide semiconductor layer 133.

The thickness of each of the first oxide semiconductor layer 131, the second oxide semiconductor layer 132, and the third oxide semiconductor layer 133 was 10 nm. The energy gap was measured with the use of a spectroscopic ellipsometer (UT-300 manufactured by HORIBA Jobin Yvon). Further, the energy gap in the vicinity of the interface between the first oxide semiconductor layer 131 and the second oxide semiconductor layer 132 and the energy gap in the vicinity of the interface between the third oxide semiconductor layer 133 and the second oxide semiconductor layer 132 were each 3 eV. The energy difference between the vacuum level and the top of the valence band was measured using an ultraviolet photoelectron spectroscopy (UPS) device (VersaProbe, ULVAC-PHI, Inc.).

Figure 2A:
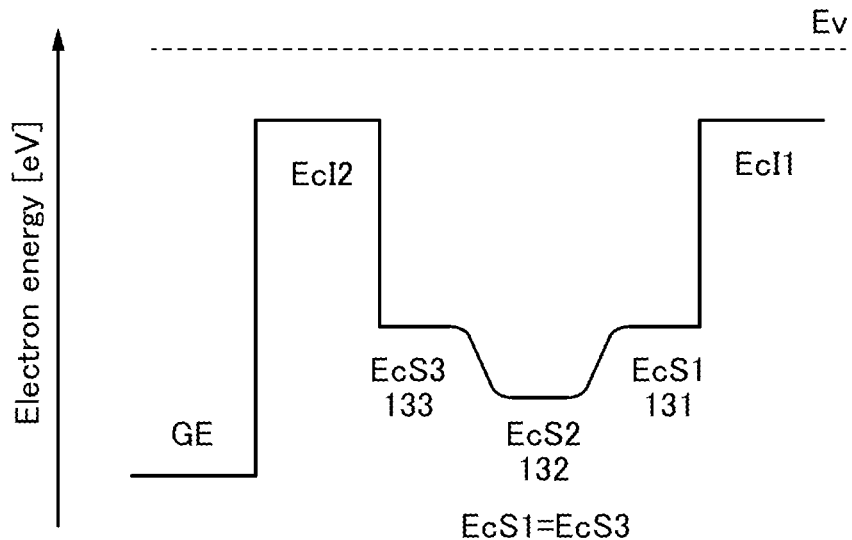
FIGS. 2A and 2B each illustrate a band structure of an oxide semiconductor layer.

FIG. 2A schematically shows part of a band structure of an energy gap (electron affinity) between the vacuum level and a bottom of a conduction band of each layer, which is calculated by subtracting the energy gap of each layer from the energy gap between the vacuum level and the top of the valence band. FIG. 2A is a band diagram showing the case where a silicon oxide film is provided in contact with the first oxide semiconductor layer 131 and the third oxide semiconductor layer 133. Here, Ev represents energy of the vacuum level, EcI1 and EcI2 represent energy at the bottom of the conduction band of the silicon oxide film, EcS1 represents energy at the bottom of the conduction band of the first oxide semiconductor layer 131, EcS2 represents energy at the bottom of the conduction band of the second oxide semiconductor layer 132, and EcS3 represents energy at the bottom of the conduction band of the third oxide semiconductor layer 133. Further, in forming a transistor, a gate electrode layer (the first gate electrode layer 171 in the transistor 100) is to be in contact with a silicon oxide film having EcI2.

As shown in FIG. 2A, the energies of the bottoms of the conduction bands of the first oxide semiconductor layer 131, the second oxide semiconductor layer 132, and the third oxide semiconductor layer 133 are changed continuously. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133.

The oxide semiconductor layer 130 in which layers containing the same main components are stacked is formed to have not only a simple stacked-layer structure of the layers but also a continuous energy band (here, in particular, a well structure having a U shape in which energies of the bottoms of the conduction bands are changed continuously between layers). In other words, the stacked-layer structure is formed such that there exists no impurities which form a defect level such as a trap center or a recombination center at each interface. If impurities are mixed between the layers of the oxide semiconductor layer, the continuity of the energy band is lost and carriers disappear by a trap or recombination.

In order to form continuous junction, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $1\times10^{-4}$ Pa to $5\times10^{-7}$ Pa) by an adsorption vacuum pump such as a cryopump and that the chamber be able to heat a substrate over which a film is to be deposited to 100° C. or higher, preferably 500° C. or higher, so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into a chamber.

Not only high vacuum evaporation in a chamber but also high purity of a sputtering gas is necessary to obtain a highly purified intrinsic oxide semiconductor. As an oxygen gas or an argon gas used as the sputtering gas, a gas that is highly purified to have a dew point of −40° C. or lower, preferably −80° C. or lower, further preferably −100° C. or lower is used, so that entry of moisture or the like into the oxide semiconductor film can be prevented as much as possible.

Note that FIG. 2A shows the case where EcS1 and EcS3 are similar to each other; however, EcS1 and EcS3 may be different from each other. For example, part of the band structure in the case where EcS1 is higher than EcS3 is shown as in FIG. 2B.

For example, when EcS1 is equal to EcS3, an In—Ga—Zn oxide whose atomic ratio of In to Ga and Zn is 1:3:2, 1:6:4, or 1:9:6 can be used for the first oxide semiconductor layer 131 and the third oxide semiconductor layer 133 and an In—Ga—Zn oxide whose atomic ratio of In to Ga and Zn is 1:1:1 or 3:1:2 can be used for the second oxide semiconductor layer 132. Further, when EcS1 is higher than EcS3, an In—Ga—Zn oxide whose atomic ratio of In to Ga and Zn is 1:6:4 or 1:9:6 can be used for the first oxide semiconductor layer 131, an In—Ga—Zn oxide whose atomic ratio of In to Ga and Zn is 1:1:1 or 3:1:2 can be used for the second oxide semiconductor layer 132, and an In—Ga—Zn oxide whose atomic ratio of In to Ga and Zn is 1:3:2 can be used for the third oxide semiconductor layer 133, for example.

Figure 2B:
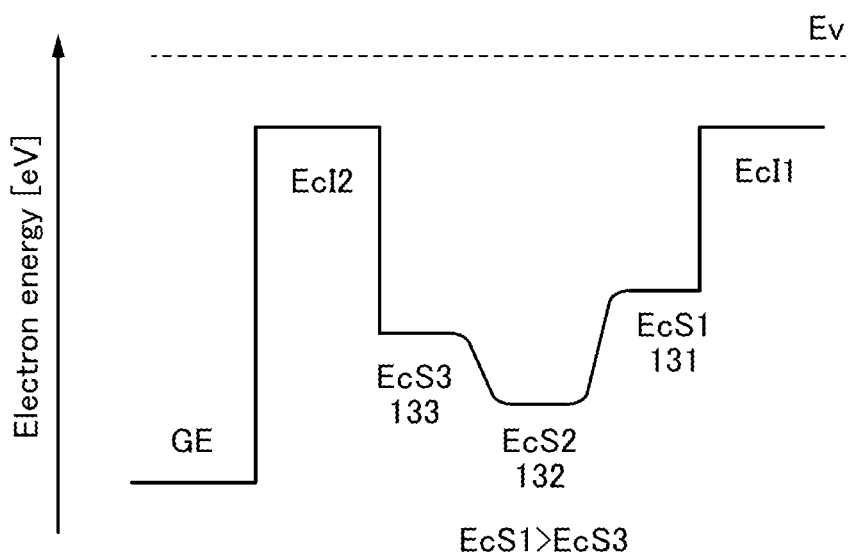

According to FIGS. 2A and 2B, the second oxide semiconductor layer 132 of the oxide semiconductor layer 130 serves as a well, so that a channel is formed in the second oxide semiconductor layer 132 in a transistor including the oxide semiconductor layer 130. Note that since the energies of the bottoms of the conduction bands are changed continuously, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 131 and the third oxide semiconductor layer 133. The second oxide semiconductor layer 132 can be distanced away from the trap levels owing to existence of the first oxide semiconductor layer 131 and the third oxide semiconductor layer 133. However, when the energy difference between EcS1 and EcS2 and the energy difference between EcS3 and EcS2 is small, an electron in the second oxide semiconductor layer 132 might reach the trap level by passing over the energy difference. By being trapped in the trap level, a negative fixed charge is caused at the interface with the insulating film, whereby the threshold voltage of the transistor is shifted in the positive direction.

Thus, the energy difference between EcS1 and EcS2 and the energy difference between EcS3 and EcS2 are each preferably greater than or equal to 0.1 eV, further preferably greater than or equal to 0.15 eV, so that the amount of change of the threshold voltage of the transistor is reduced and stable electrical characteristics can be obtained.

Note that at least one of the first oxide semiconductor layer 131, the second oxide semiconductor layer 132, and the third oxide semiconductor layer 133 preferably contains a crystal part. For example, the first oxide semiconductor layer 131 is amorphous, and the second oxide semiconductor layer 132 and the third oxide semiconductor layer 133 each include a crystal part. Since the second oxide semiconductor layer 132 where a channel is formed includes a crystal part, the transistor can have stable electrical characteristics.

In particular, a crystal part included in each of the second oxide semiconductor layer 132 and the third oxide semiconductor layer 133 preferably includes a crystal whose c-axis is aligned in a direction approximately perpendicular to its surface.

Figure 1B:
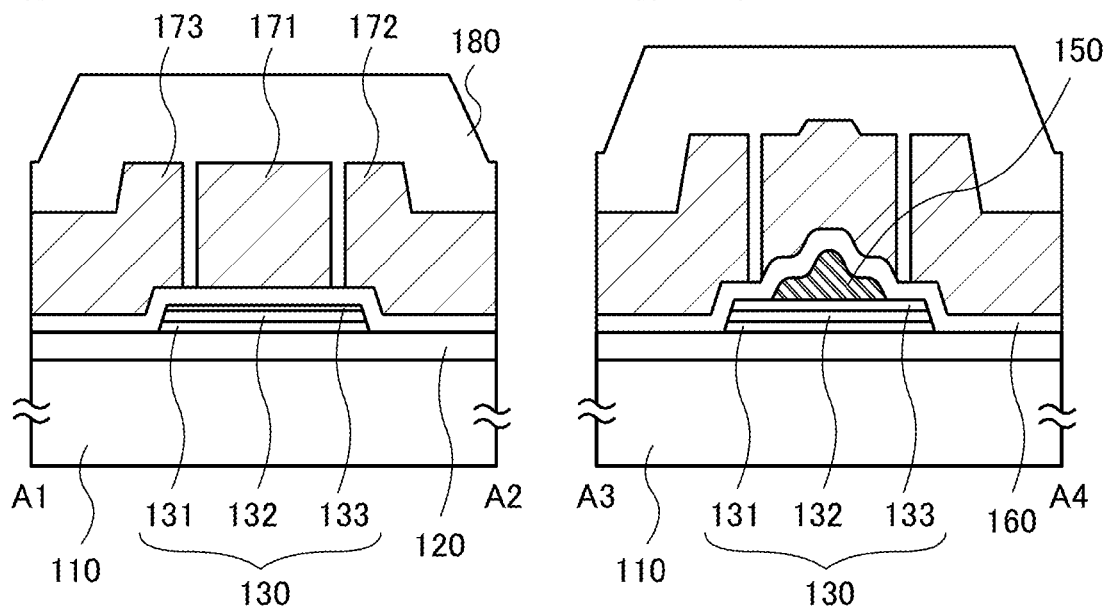
Figure 1C:
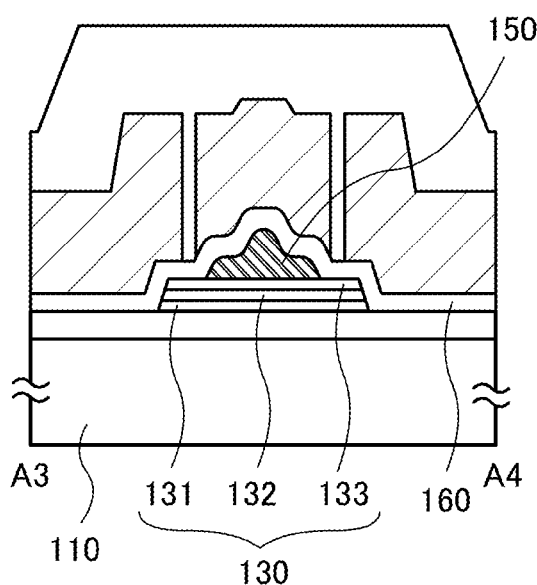
Figure 1D:
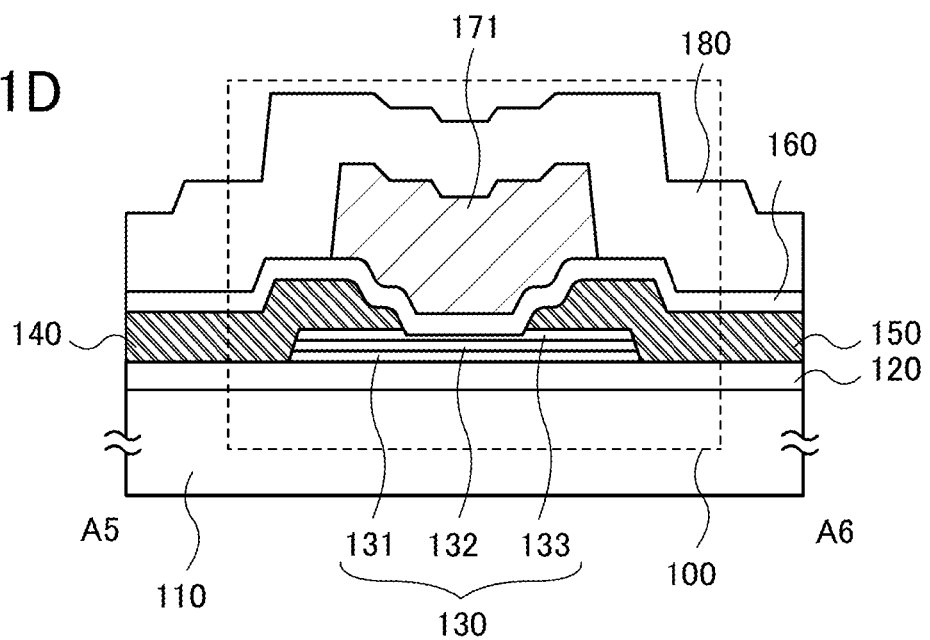

In the transistor having the structure in FIGS. 1A to 1C, the third oxide semiconductor layer 133 is in contact with the source electrode layer 140 and the drain electrode layer 150, and it is preferable that the energy gap of the third oxide semiconductor layer 133 be not large like an insulator and the film thickness of the third oxide semiconductor layer 133 be small in order that current can be extracted efficiently. Further, in the case where an In—Ga—Zn oxide is used for the oxide semiconductor layer 130, it is preferable that the third oxide semiconductor layer 133 contain less In than the second oxide semiconductor layer 132 so that diffusion of In to the gate insulating film can be prevented.

Figure 3A:
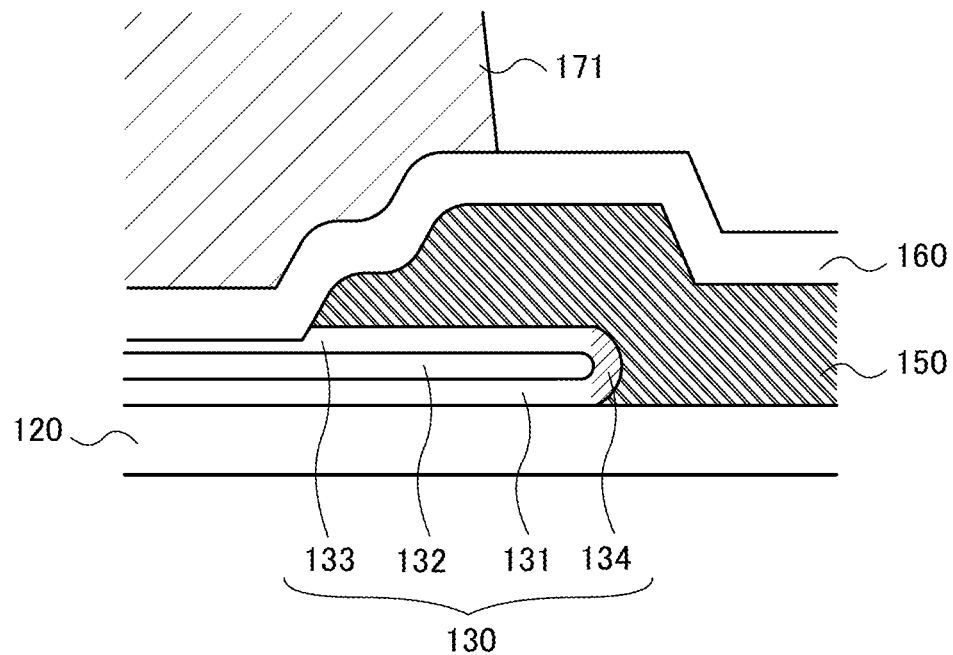
FIGS. 3A and 3B illustrate enlarged cross-sectional views of a transistor.

As illustrated in the enlarged cross-sectional view (part of a cross section in the channel length direction) of the transistor of FIG. 3A, a region 134 having a curved surface may be provided at an end portion of the oxide semiconductor layer 130. In the case where the oxide semiconductor layer 130 is formed using an In-M-Zn oxide (M is Al, Ti, Ga, Y, Zr, La, Ce, Nd, or Hf), the atomic proportion of M ($M_{S4}$) contained in the region 134 is preferably larger than that of M ($M_{S2}$) contained in the second oxide semiconductor layer 132. Further preferably, the atomic proportion of $M_{S4}$ is the same as that of M ($M_{S1}$) contained in the first oxide semiconductor layer 131. With such a structure, the second oxide semiconductor layer 132 can be protected.

The region 134 at the end portion of the oxide semiconductor layer 130 can be formed in such a manner that the components of the first oxide semiconductor layer 131 are attached to the second oxide semiconductor layer 132 and the third oxide semiconductor layer 133 by a dry etching method, i.e., by utilizing what is called a rabbit ear. Further, when the etching gas component attached at the formation of the rabbit ear is removed and the M component is oxidized by oxidation treatment, the insulating property of the region 134 can be improved.

Figure 3B:
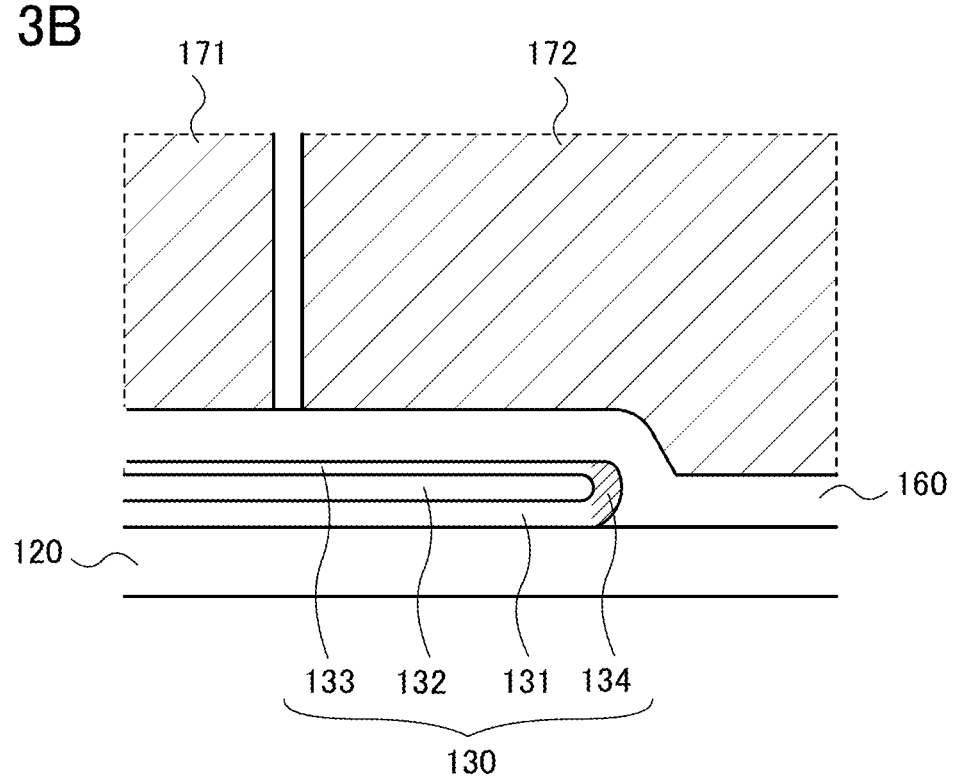

The end portion of oxide semiconductor layer 130 overlapping with the gate electrode layer easily becomes n-type because of mixture of impurities or occurrence of oxygen vacancies due to an external factor, and may become a parasitic channel. In particular, the second oxide semiconductor layer 132 having a small energy gap is likely to be changed to an n-type. Thus, formation of the region 134 as illustrated in the enlarged cross-sectional view (part of a cross section in the channel width direction) of the transistor of FIG. 3B can suppress generation of a parasitic channel.

Figure 4A:
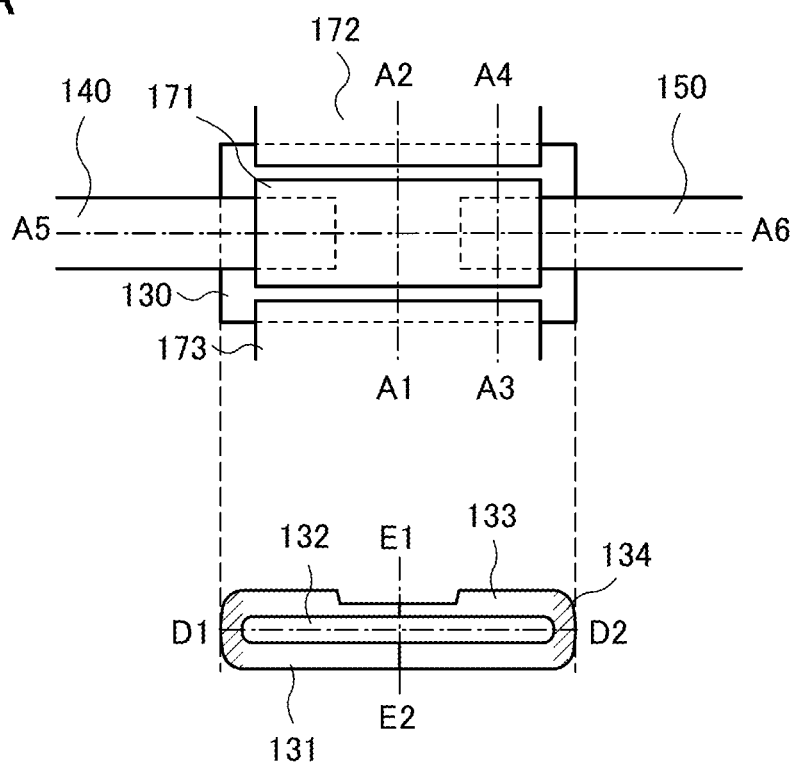
FIG. 4A is a top view and a cross-sectional view illustrating a transistor.

FIG. 4A is a top view of the transistor including the region 134 and a cross-sectional view of the oxide semiconductor layer 130. When the main components of the first oxide semiconductor layer 131 are the same as those of the region 134, the effect of suppressing generation of a parasitic channel can be more enhanced as a difference (ΔE) between energy (EcS2) at the bottom of the conduction band of the second oxide semiconductor layer 132 and energy (EcS4) at a bottom of a conduction band of the region 134 gets larger. Further, the region 134 is preferably thicker than the first oxide semiconductor layer 131 or the third oxide semiconductor layer 133, and generation of a parasitic channel due to change of an end portion of the second oxide semiconductor layer 132 to an n-type can be suppressed as the region 134 gets thicker.

Figure 4B:
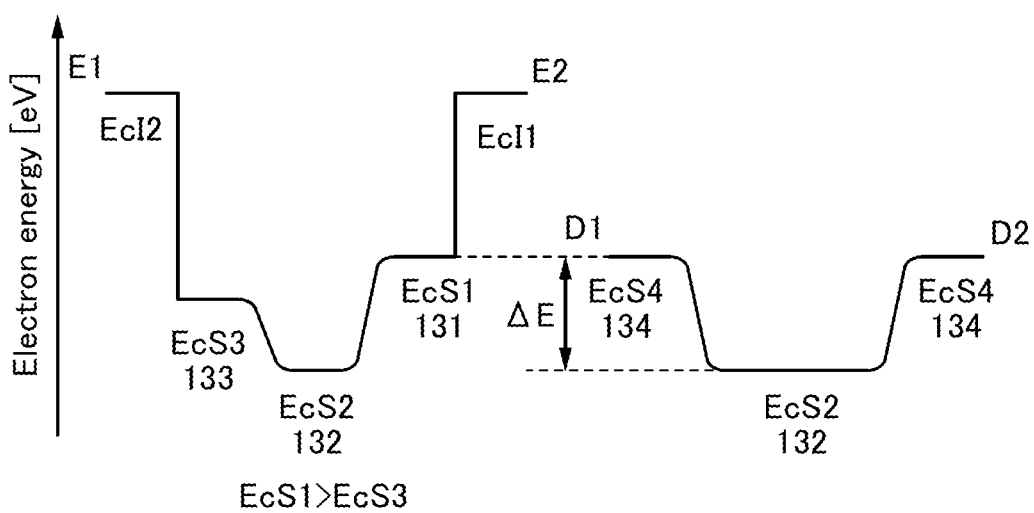
FIG. 4B illustrates a band structure of an oxide semiconductor layer.

When the compositions of the first oxide semiconductor layer 131, the second oxide semiconductor layer 132, and the third oxide semiconductor layer 133 are approximate to one another, in the region 134, the energies at the bottoms of the conduction bands of the oxide semiconductor layers are changed continuously as in FIG. 4B which illustrates part of the band structure of the oxide semiconductor layer 130. That is, it can be said that the first oxide semiconductor layer 131, the second oxide semiconductor layer 132, the third oxide semiconductor layer 133, and the region 134 form continuous junctions. Note that the direction of a dashed-dotted line D1-D2 and the direction of a dashed-dotted line E1-E2 in FIG. 4B corresponds to the direction of a dashed-dotted line D1-D2 and the direction of a dashed-dotted line E1-E2 in the cross-sectional view of the oxide semiconductor layer 130 in FIG. 4A, respectively.

As illustrated in the top view of the transistor in FIG. 1A, the length in the channel width direction of each of the source electrode layer 140 and the drain electrode layer 150 is shorter than that of the oxide semiconductor layer 130, and the source electrode layer 140 and the drain electrode layer 150 are formed so as to cover the end portions of the oxide semiconductor layer 130. Further, it is preferable that the length in the channel width direction of each of the source electrode layer 140 and the drain electrode layer 150 be shorter than that of the first gate electrode layer 171, which overlaps with the source electrode layer 140 and the drain electrode layer 150.

For the source electrode layer 140 and the drain electrode layer 150, a conductive material which is easily bonded to oxygen is preferably used. For example, Al, Cr, Cu, Ta, Ti, Mo, or W can be used. Among the materials, in particular, it is preferable to use Ti which is easily bonded to oxygen or W with a high melting point, which allows subsequent process temperatures to be relatively high. Note that the conductive material which is easily bonded to oxygen includes, in its category, a material to which oxygen is easily diffused.

When the conductive material which is easily bonded to oxygen is in contact with an oxide semiconductor layer, a phenomenon occurs in which oxygen of the oxide semiconductor layer is diffused to the conductive material which is easily bonded to oxygen. The phenomenon noticeably occurs when the temperature is high. Since the formation process of the transistor involves some heat treatment steps, the above phenomenon causes generation of oxygen vacancies in a region of the oxide semiconductor layer, which is in contact with the source electrode or the drain electrode, and the region is changed to an n-type. Thus, the n-type region can serve as a source or a drain of the transistor.

Figure 5:
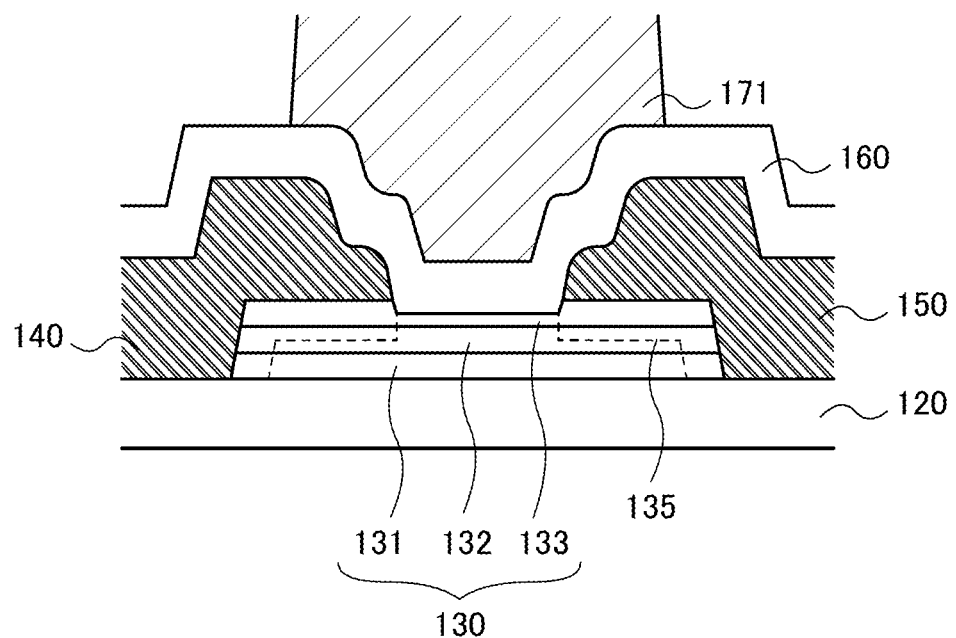
FIG. 5 is an enlarged cross-sectional view of a transistor.

The n-type region is illustrated in the enlarged cross-sectional view (a cross section in the channel width direction) of the transistor of FIG. 5. A boundary 135 indicated by a dotted line in the oxide semiconductor layer 130 is a boundary between an intrinsic semiconductor region and the n-type semiconductor region. In the oxide semiconductor layer 130, a region near and in contact with the source electrode layer 140 or the drain electrode layer 150 becomes the n-type region. The boundary 135 is schematically illustrated here, but actually the boundary is not clearly seen in some cases. Further, the boundary 135 extends in the lateral direction in the second oxide semiconductor layer 132 in FIG. 5; however, the boundary 135 may extend in the lateral direction in the first oxide semiconductor layer 131 or the third oxide semiconductor layer 133. In the oxide semiconductor layer 130, a region sandwiched between the base insulating film 120 and the source electrode layer 140 or between the base insulating film 120 and the drain electrode layer 150 may become n-type entirely in the film thickness direction.

However, in the case of forming a transistor with an extremely short channel length, the n-type region which is formed by the generation of oxygen vacancies sometimes extends in the channel length direction of the transistor. In that case, electrical characteristics of the transistor change; for example, the threshold voltage is shifted or on and off states of the transistor cannot be controlled with the gate voltage (i.e., the transistor is on). Accordingly, when a transistor with an extremely short channel length is formed, it is not always preferable that the conductive material which is easily bonded to oxygen be used for a source electrode layer and a drain electrode layer.

Figure 6A:
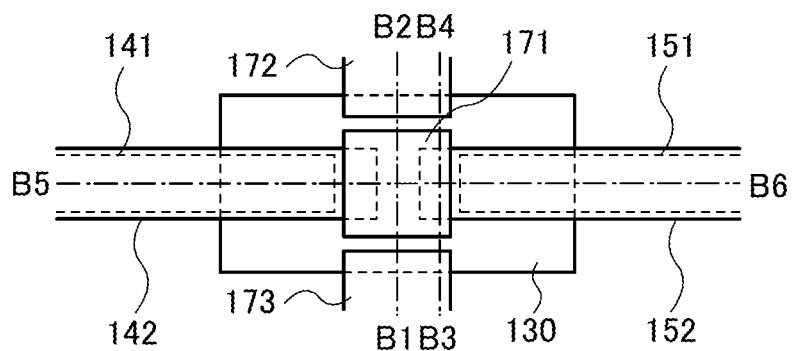
FIGS. 6A to 6D are a top view and cross-sectional views illustrating a transistor.

Thus, as in a transistor 200 illustrated in FIGS. 6A to 6D, the source electrode layer and the drain electrode layer may each have a stacked-layer structure. FIG. 6A is a top view. A cross section taken along dashed-dotted line B1-B2 in FIG. 6A corresponds to FIG. 6B. A cross section taken along dashed-dotted line B3-B4 in FIG. 6A corresponds to FIG. 6C. A cross section taken along dashed-dotted line B5-B6 in FIG. 6A corresponds to FIG. 6D. In some cases, the direction of the dashed-dotted line B1-B2 is referred to as a channel width direction, and the direction of the dashed-dotted line B5-B6 is referred to as a channel length direction. A titanium film is used for a first source electrode layer 141 and a first drain electrode layer 151, and a conductive material which is not easily bonded to oxygen is used for a second source electrode layer 142 and a second drain electrode layer 152 which determine the channel length. As the conductive material which is not easily bonded to oxygen, for example, tantalum nitride, titanium nitride, ruthenium, or the like is preferably used. Note that the conductive material which is not easily bonded to oxygen includes, in its category, a material to which oxygen is not easily diffused.

Figure 6B:
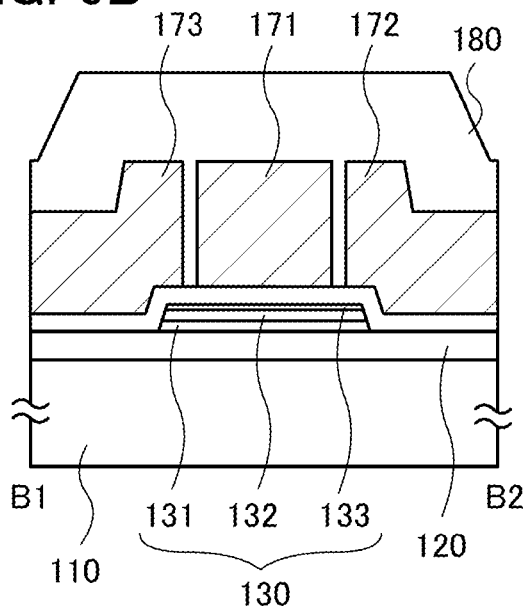
Figure 6C:
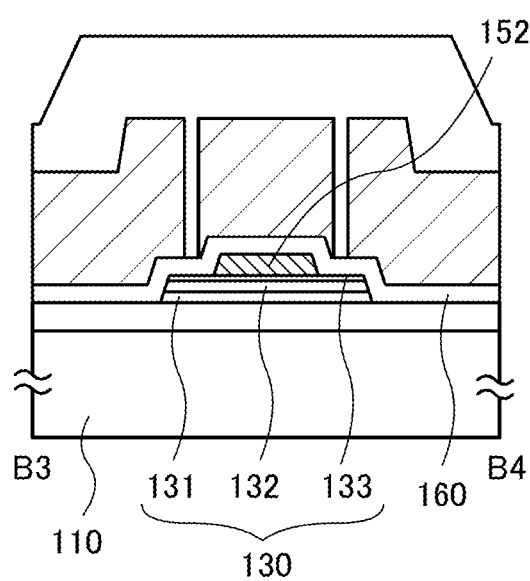

Note that in the transistor having the structure illustrated in FIGS. 6A to 6C, a channel length refers to a distance between the second source electrode layer 142 and the second drain electrode layer 152.

Further, in the transistor having the structure illustrated in FIGS. 6A to 6C, a channel refers to a region of the second oxide semiconductor layer 132, which is between the second source electrode layer 142 and the second drain electrode layer 152.

Furthermore, in the transistor having the structure illustrated in FIGS. 6A to 6C, a channel formation region refers to a region of the stack including the first oxide semiconductor layer 131, the second oxide semiconductor layer 132, and the third oxide semiconductor layer 133, which is between the second source electrode layer 142 and the second drain electrode layer 152.

By the use of the above conductive material which is not easily bonded to oxygen for the second source electrode layer 142 and the second drain electrode layer 152, generation of oxygen vacancies in the channel formation region of the oxide semiconductor layer 130 can be suppressed, so that change of the channel to an n-type can be suppressed. In this manner, even a transistor with an extremely short channel length can have favorable electrical characteristics.

In the case where the source electrode layer and the drain electrode layer are formed using only the above conductive material which is not easily bonded to oxygen, the contact resistance with the oxide semiconductor layer 130 becomes too high; thus, it is preferable that as illustrated in FIG. 6C, the first source electrode layer 141 and the first drain electrode layer 151 be formed over the oxide semiconductor layer 130 and the second source electrode layer 142 and the second drain electrode layer 152 be formed so as to cover the first source electrode layer 141 and the first drain electrode layer 151.

At this time, it is preferable that the oxide semiconductor layer 130 have a large contact area with the first source electrode layer 141 or the first drain electrode layer 151, and the oxide semiconductor layer 130 have a small contact area with the second source electrode layer 142 or the second drain electrode layer 152. The region of the oxide semiconductor layer 130, which is in contact with the first source electrode layer 141 or the first drain electrode layer 151, is changed to an n-type region due to generation of oxygen vacancies. Owing to the n-type region, the contact resistance between the oxide semiconductor layer 130 and the first source electrode layer 141 or the first drain electrode layer 151 can be reduced. Accordingly, when the oxide semiconductor layer 130 has a large contact area with the first source electrode layer 141 or the first drain electrode layer 151, the area of the n-type region can also be large.

Note that the oxide semiconductor layer 130 does not necessarily have a large contact area with the first source electrode layer 141 or the first drain electrode layer 151 in the case where a nitride such as tantalum nitride or titanium nitride is used for the second source electrode layer 142 and the second drain electrode layer 152. This is because when nitrogen in the nitride is slightly diffused to a region of the oxide semiconductor layer 130 which is close to the interface with the second source electrode layer 142 and the second drain electrode layer 152, nitrogen acts as a donor and forms an n-type region in the oxide semiconductor layer 130; accordingly, the contact resistance between the oxide semiconductor layer 130 and the second source electrode layer 142 or the second drain electrode layer 152 can be reduced.

The distance between the first source electrode layer 141 and the first drain electrode layer 151 is set to 0.8 µm or longer, preferably 1.0 µm or longer. In the case where the distance is shorter than 0.8 µm, influence of oxygen vacancies generated in the channel formation region cannot be eliminated, which causes deterioration of the electrical characteristics of the transistor.

Even when the distance between the second source electrode layer 142 and the second drain electrode layer 152 is, for example, 30 nm or shorter, the transistor can have favorable electrical characteristics.

Further, it is preferable to employ a structure in which a gate electrode layer does not overlap with a source electrode layer or a drain electrode layer as much as possible in order to make small parasitic capacitance which is caused between a gate and a drain and between the gate and a source, which enables the frequency characteristics of a semiconductor device to be improved.

Figure 29A:
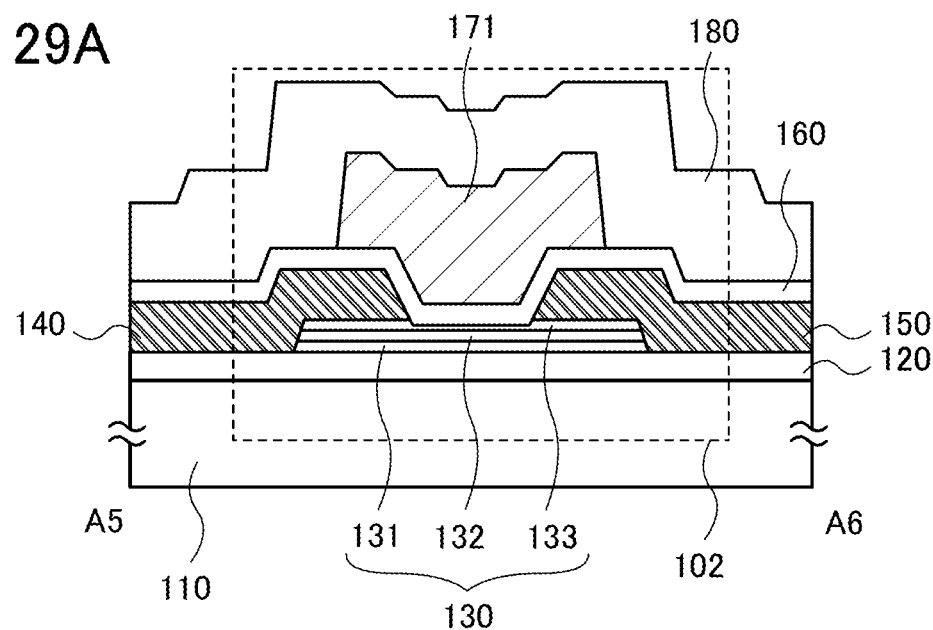
FIGS. 29A and 29B are cross-sectional views each illustrating a transistor.
Figure 29B:
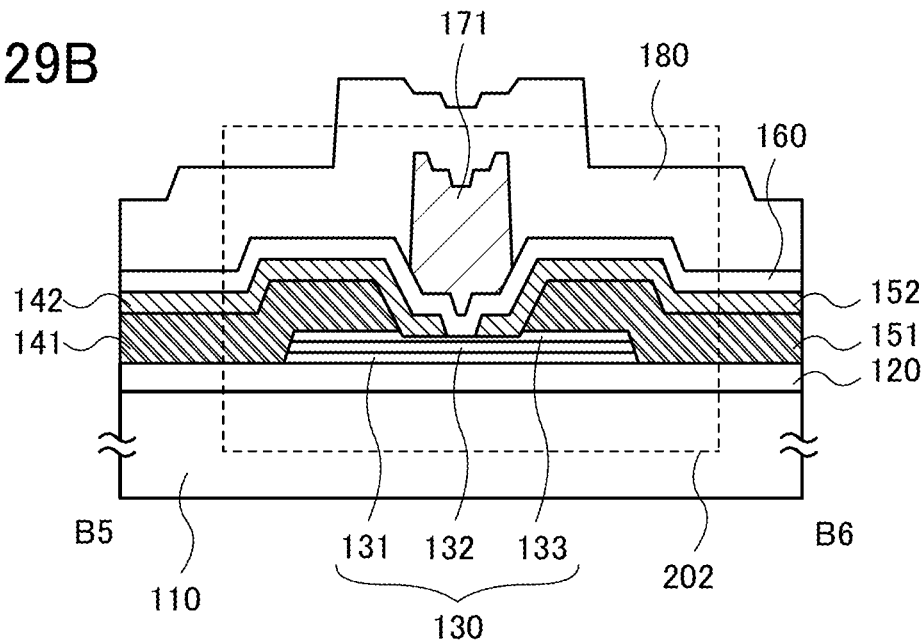

Furthermore, end portions of the source electrode layer 140 and the drain electrode layer 150 in the transistor 100 or end portions of the first source electrode layer 141 and the first drain electrode layer 151 in the transistor 200 are preferably formed to be tapered and to have staircase-like shapes including a plurality of steps as illustrated in the drawings. With such shapes including a plurality of steps, coverage with the films formed over the source electrode layer 140 and the drain electrode layer 150, or the first source electrode layer 141 and the first drain electrode layer 151 can be improved, whereby the electrical characteristics and long-term reliability of the transistor can be improved. Note that as in a transistor 102 illustrated in FIG. 29A and a transistor 202 illustrated in FIG. 29B, the end portions of the source electrode layer 140 and the drain electrode layer 150 or the end portions of the first source electrode layer 141 and the first drain electrode layer 151 do not necessarily have staircase-like shapes.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack containing any of the above materials.

For the first gate electrode layer 171, the second gate electrode layer 172, and the third gate electrode layer 173, a conductive film formed using Al, Ti, Cr, Co, Ni, Cu, Y, Zr, Mo, Ru, Ag, Ta, W, or the like can be used. Each of the gate electrode layers may be a stack containing any of the above materials.

Figure 22A:
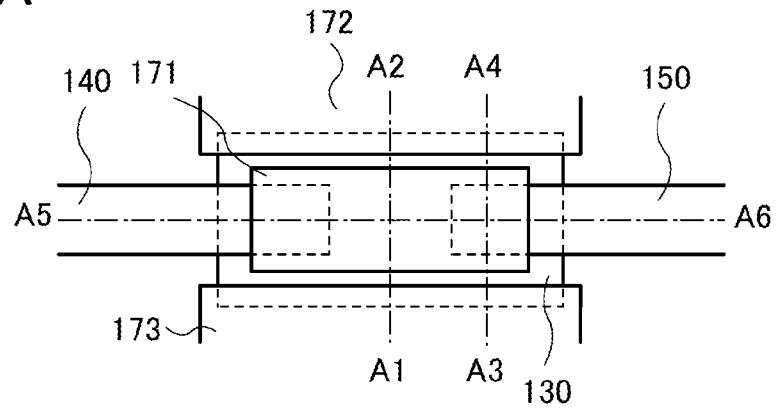
FIGS. 22A to 22D are top views each illustrating a transistor.
Figure 22B:
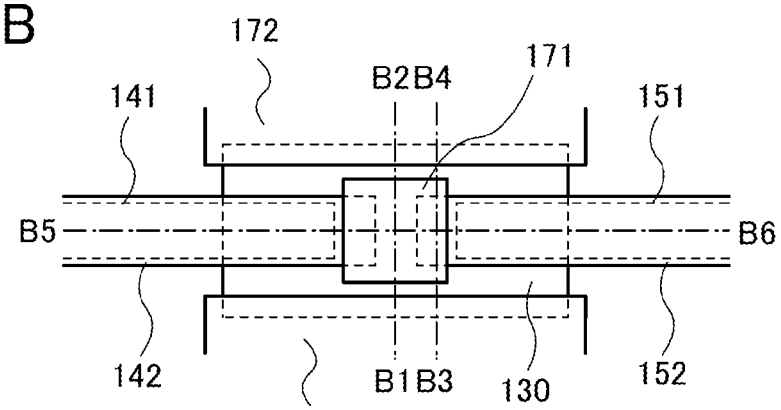

The first gate electrode layer 171, the second gate electrode layer 172, and the third gate electrode layer 173 are each provided separately. The first gate electrode layer 171 overlaps with the oxide semiconductor layer 130 with the gate insulating film 160 provided therebetween. Each of the second gate electrode layer 172 and the third gate electrode layer 173 is formed so as to cover part of the end portion of the oxide semiconductor layer 130 with the gate insulating film 160 provided therebetween. Further, in the transistor 100, the length in the channel length direction of each of the second gate electrode layer 172 and the third gate electrode layer 173 may be longer than that of the oxide semiconductor layer 130 as illustrated in FIG. 22A. In the transistor 200, the length in the channel length direction of each of the second gate electrode layer 172 and the third gate electrode layer 173 may be longer than that of the oxide semiconductor layer 130 as illustrated in FIG. 22B.

Figure 28:
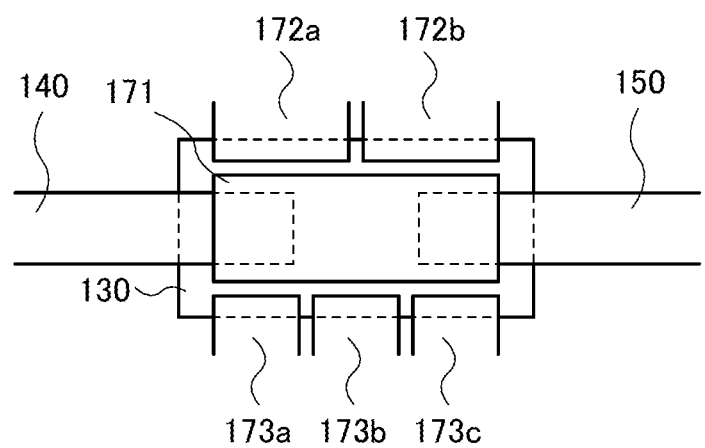
FIG. 28 is a top view illustrating the shapes of gate electrode layers.

The second gate electrode layer 172 and the third gate electrode layer 173 may each be divided over the oxide semiconductor layer 130 as illustrated in FIG. 28, for example. Although FIG. 28 illustrates, as an example, a structure in which a second gate electrode layers 172a and 172b and third gate electrode layers 173a, 173b, and 173c are provided, the second gate electrode layer 172 and the third gate electrode layer 173 can each be divided into any number of regions.

To form a semiconductor device with low power consumption, it is effective to reduce an off-state current of a transistor, in particular, a current thereof when a gate voltage is 0 V (such a current is also referred to as Icut). To reduce Icut, what is called a back gate structure which controls the threshold voltage of a transistor in the following manner is known: an active layer is provided between an electrode and a gate electrode with an insulating layer provided between the active layer and the electrode, and an appropriate potential is supplied to the electrode. However, in the case where the active layer is formed using an oxide semiconductor as in the transistor of one embodiment of the present invention, it is appropriate to use a thick oxide insulating layer as a base insulating film which supplies oxygen to the oxide semiconductor. Therefore, in the back gate structure, there are problems in that the potential of the back gate needs to be set high and the number of steps is increased to provide a back gate.

In the transistor of one embodiment of the present invention, the first gate electrode layer 171 controls switching of the transistor, and the second gate electrode layer 172 and the third gate electrode layer 173 each control the threshold voltage of the transistor. In the operation of the transistor, a potential for turning on or off the transistor is supplied to the first gate electrode layer 171, and a constant potential for controlling the threshold voltage of the transistor is supplied to each of the second gate electrode layer 172 and the third gate electrode layer 173. The second gate electrode layer 172 and the third gate electrode layer 173 may be supplied with the same potential or different potentials.

When the second gate electrode layer 172 and the third gate electrode layer 173 each having an effect similar to that of a back gate are formed on a thin gate insulating film side as described above, a potential for controlling the threshold voltage can be lowered. Note that the first gate electrode layer 171, the second gate electrode layer 172, and the third gate electrode layer 173 can be simultaneously formed; thus, the number of steps is not increased. Moreover, an adverse effect of forming the oxide insulating layer serving as a base insulating film thick disappears.

As described above, the threshold voltage of the transistor can be controlled by supply of an appropriate constant potential to each of the second gate electrode layer 172 and the third gate electrode layer 173; accordingly, Icut can be reduced and the long-term reliability of the semiconductor device can be improved.

In the transistor of one embodiment of the present invention, the length in the channel width direction of each of the source electrode layer and the drain electrode layer is shorter than that of the oxide semiconductor layer 130 as described above. Further, it is preferable that the length in the channel width direction of each of the source electrode layer and the drain electrode layer be shorter than that of the first gate electrode layer 171, which overlaps with the source electrode layer and the drain electrode layer. With such a structure, an electric field is applied from the second gate electrode layer 172 and the third gate electrode layer 173 to the oxide semiconductor layer 130 without interruption by the source electrode layer or the drain electrode layer. Thus, a potential supplied to the second gate electrode layer 172 and the third gate electrode layer 173 to control the threshold voltage of the transistor can be made small.

Note that the transistor of one embodiment of the present invention may have a structure without the third gate electrode layer 173 as illustrated in FIGS. 23A to 23D and FIGS. 24A to 24D. In a transistor 101 and a transistor 201 each having such a structure, a potential for controlling on/off of the transistor is supplied to the first gate electrode layer 171 and a constant potential for controlling the threshold voltage of the transistor is supplied to the second gate electrode layer 172. Thus, the threshold voltage of the transistor can be controlled in a manner similar to that of a transistor including the third gate electrode layer 173; accordingly, Icut can be reduced and a semiconductor device can have higher long-term reliability. In addition, in the transistor 101 and the transistor 201, the first gate electrode layer 171 can be easily connected to a wiring from which a potential is supplied to the first gate electrode layer 171.

The oxide insulating layer 180 may be formed over the gate insulating film 160, the first gate electrode layer 171, the second gate electrode layer 172, and the third gate electrode layer 173. The oxide insulating layer 180 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer 180 may be a stack containing any of the above materials.

Here, the oxide insulating layer 180 preferably contains excess oxygen. An oxide insulating layer containing excess oxygen refers to an oxide insulating layer from which oxygen can be released by heat treatment or the like. The oxide insulating layer containing excess oxygen is preferably a film in which the amount of released oxygen when converted into oxygen atoms is $1.0 \times 10^{19}$ atoms/cm$^3$ or more in thermal desorption spectroscopy analysis. Oxygen released from the oxide insulating layer 180 can be diffused to a channel formation region of the oxide semiconductor layer 130 through the gate insulating film 160, so that oxygen vacancies which are undesirably formed can be filled with the oxygen. In this manner, stable electrical characteristics of the transistor can be achieved.

Figure 27A:
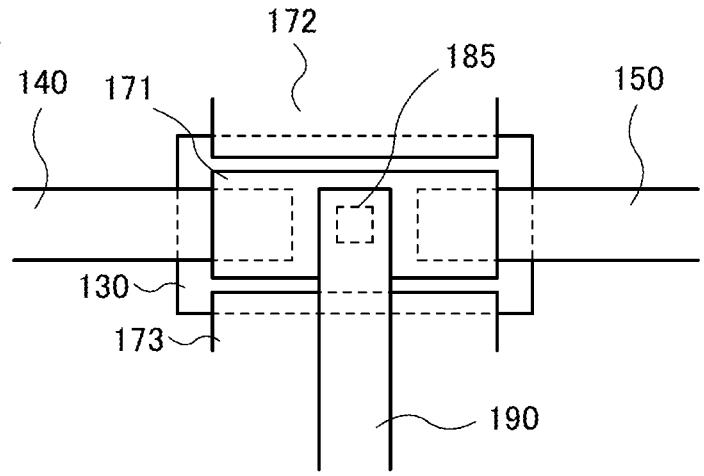
FIGS. 27A to 27C are top views each illustrating a manner for connecting a gate electrode layer and a wiring.
Figure 27B:
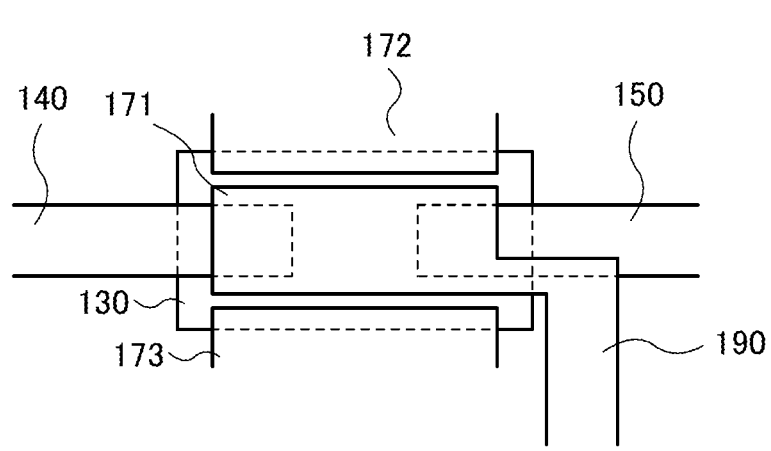
Figure 27C:
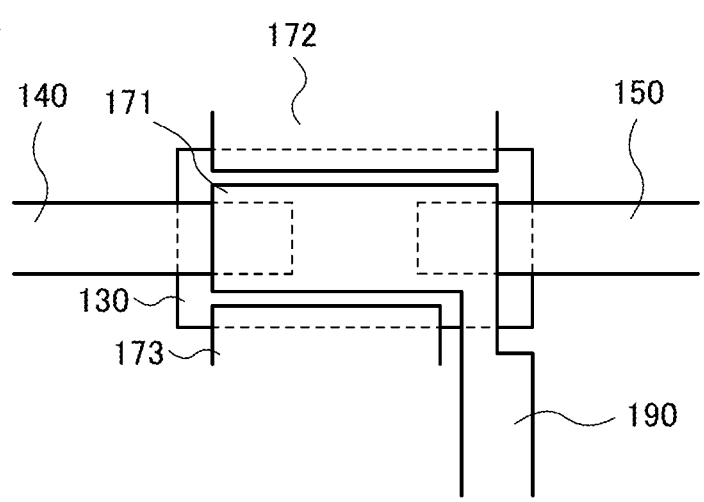

Note that the first gate electrode layer 171 can be electrically connected to a wiring 190 from which a potential is supplied to the first gate electrode layer 171 as illustrated in FIG. 27A, FIG. 27B, or FIG. 27C, for example. In a structure illustrated in FIG. 27A, a contact hole 185 which reaches the first gate electrode layer 171 is formed in the oxide insulating layer 180, and the first gate electrode layer 171 is connected to the wiring 190 with the use of the contact hole 185. In a structure illustrated in FIG. 27B, the wiring 190 which is connected to the first gate electrode layer 171 is led to the source electrode layer 140 side or the drain electrode layer 150 side. In that case, the wiring 190 can be provided so as not to overlap with the source electrode layer 140 or the drain electrode layer 150. In a structure illustrated in FIG. 27C, the wiring 190 which is connected to the first gate electrode layer 171 is led to the second gate electrode layer 172 side or the third gate electrode layer 173 side. In that case, the length in the channel length direction of the second gate electrode layer 172 or the third gate electrode layer 173 can be short small as illustrated in FIG. 27C.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

Embodiment 2

In this embodiment, the simulation results of the structure of the transistor of one embodiment of the present invention which is described in Embodiment 1 are described.

Figure 7A:
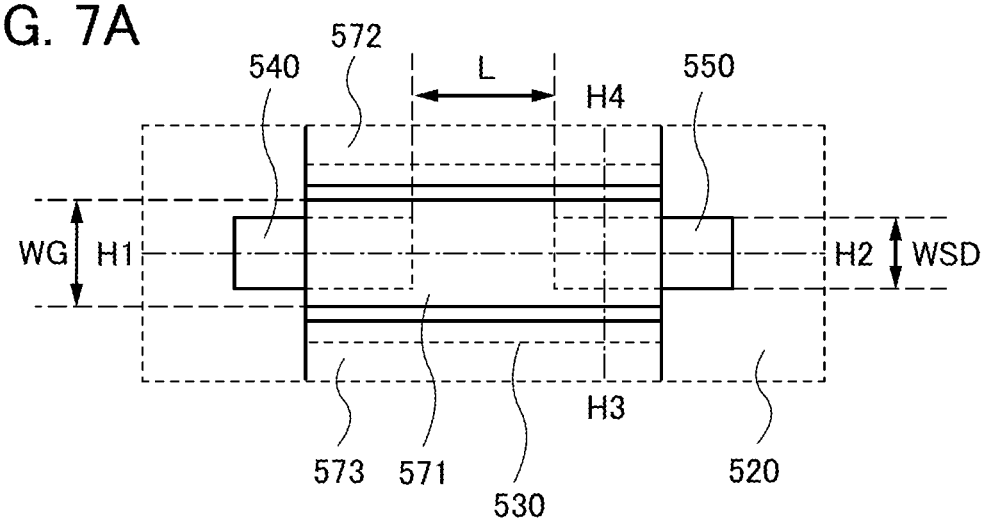
FIGS. 7A to 7C are a top view and cross-sectional views illustrating a model used for a device simulation.
Figure 7B:
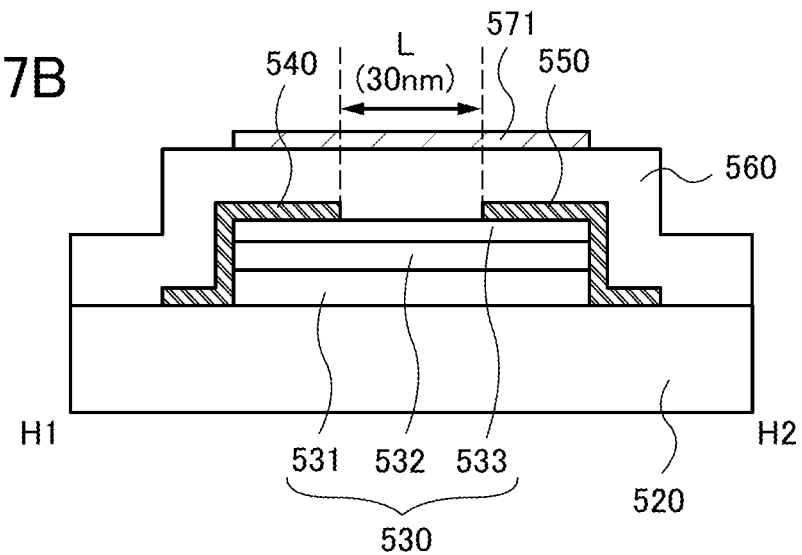
Figure 7C:
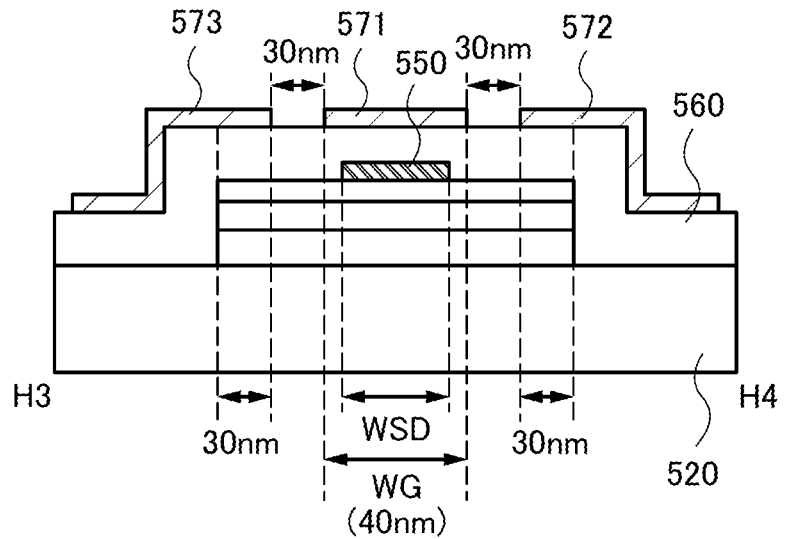
Figure 8A:
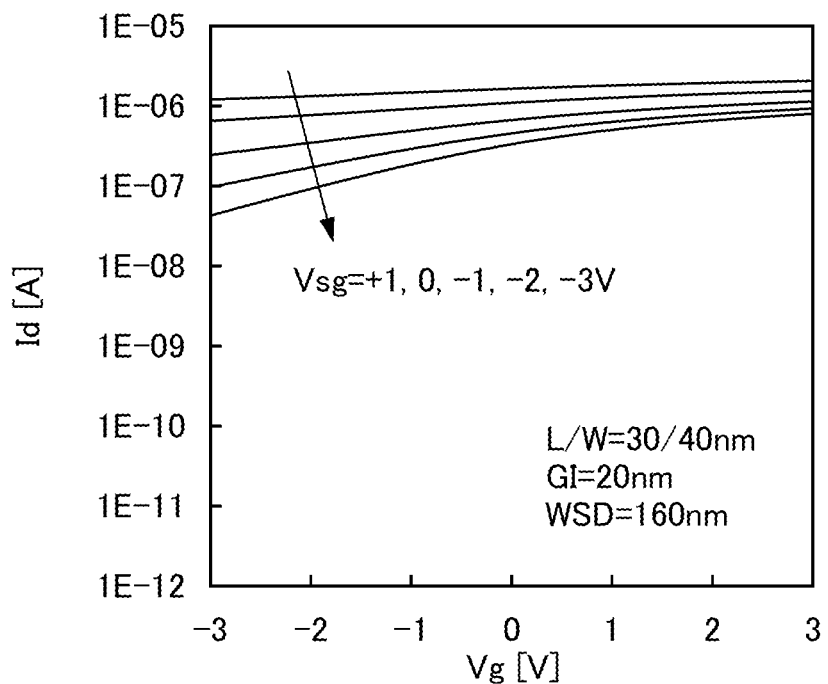
FIGS. 8A and 8B show results of a device simulation.
Figure 8B:
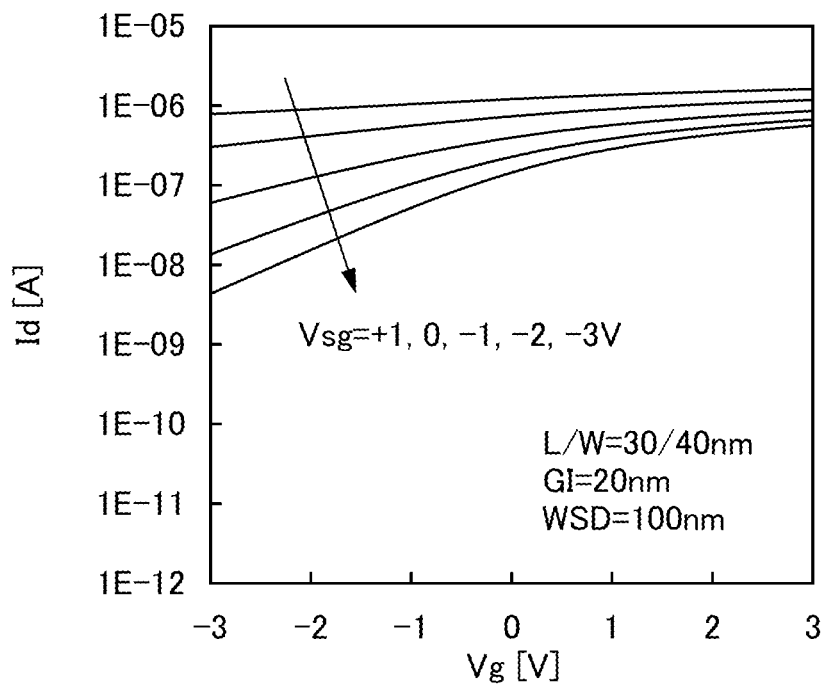
Figure 9A:
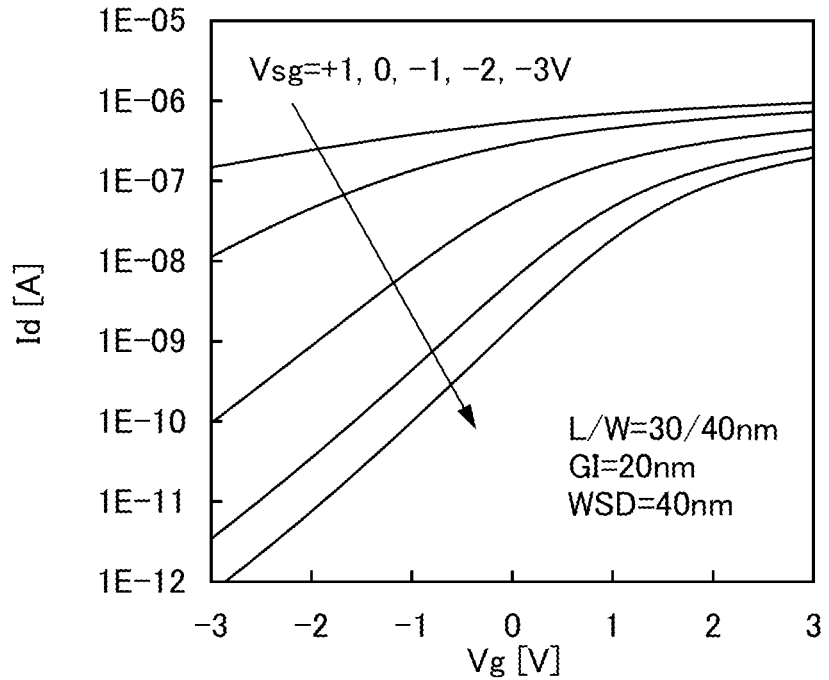
FIGS. 9A and 9B show results of a device simulation.
Figure 9B:
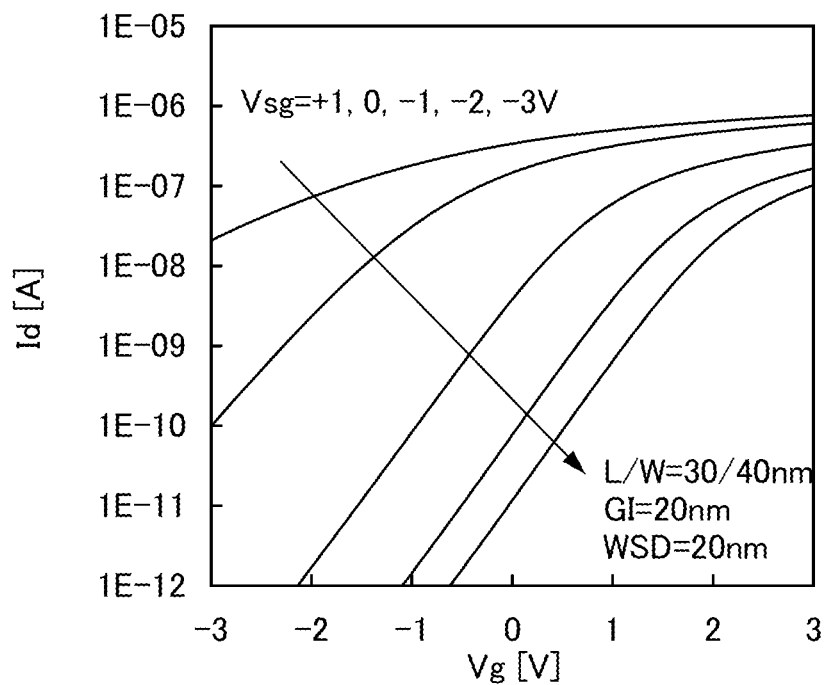

FIGS. 7A to 7C illustrate device a model used for a simulation. FIG. 7A is a top view. A cross section taken along dashed-dotted line H1-H2 in FIG. 7A corresponds to FIG. 7B. A cross section taken along dashed-dotted line H3-H4 in FIG. 7A corresponds to FIG. 7C. In some cases, the direction of the dashed-dotted line H1-H2 is referred to as a channel length direction, and the direction of the dashed-dotted lines H3-H4 is referred to as a channel width direction.

The device model illustrated in FIGS. 7A to 7C includes, over a base insulating film 520, an oxide semiconductor layer 530 including a first oxide semiconductor layer 531, a second oxide semiconductor layer 532, and a third oxide semiconductor layer 533, a source electrode layer 540, a drain electrode layer 550, a gate insulating film 560, a first gate electrode layer 571, a second gate electrode layer 572, and a third gate electrode layer 573.

In the device model, the channel length L of the transistor was 30 nm; the thickness of the base insulating film 520 was 300 nm; the dielectric constant of the gate insulating film 560 was 4.1; the thickness of the gate insulating film 560 was 20 nm; the work function of the gate electrode layer was 4.9 eV; and the work function of each of the source electrode layer 540 and the drain electrode layer 550 was 4.4 eV. The atomic ratios (In:Ga:Zn) of In—Ga—Zn oxides used for the first oxide semiconductor layer 531 (S1), the second oxide semiconductor layer 532 (S2), and the third oxide semiconductor layer 533 (S3) and values used for the simulation are shown in Table 1. For the simulation, software Sentaurus Device manufactured by Synopsys, Inc. was used. Fixed charge, electron traps, and the like localized in the layers or at the interface of the layers were not considered.

TABLE 1

|    | Atomic Ratio | Electron Affinity [eV] | Eg [eV] | Dielectric Constant | Nd [cm$^{-3}$] | Electron Mobility [cm$^2$/Vs] | Hole Mobility [cm$^2$/Vs] | Thickness [nm] |
|----|--------------|------------------------|---------|---------------------|----------------|-------------------------------|---------------------------|----------------|
| S1 | 1:3:2        | 4.4                    | 3.4     | 15                  | 1.00E+13       | 2                             | 0.1                       | 20             |
| S2 | 1:1:1        | 4.6                    | 3.15    | 15                  | 1.00E+13       | 10                            | 0.1                       | 15             |
| S3 | 1:3:2        | 4.4                    | 3.4     | 15                  | 1.00E+13       | 2                             | 0.1                       | 5              |

The length in the channel width direction of the gate electrode (WG) in the cross section in FIG. 7C, which was regarded as a channel width, was fixed to 40 nm. The space between the first gate electrode layer 571 and the second gate electrode layer 572 and the space between the first gate electrode layer 571 and the third gate electrode layer 573 were each fixed to 30 nm. The lengths of regions where the oxide semiconductor layer 530 overlaps with the second gate electrode layer 572 and the third gate electrode layer 573 were each fixed to 30 nm.

Further, in a manner similar to that of the transistor 100 illustrated in FIGS. 1A to 1D and the transistor 200 illustrated in FIGS. 6A to 6D, the length in the channel width direction of each of the source electrode layer 540 and the drain electrode layer 550 (WSD) was made shorter than that of the oxide semiconductor layer 530. Then, the simulation of the side gate voltage (Vsg) dependence of the Id-Vg characteristics was performed with different lengths of the source electrode layer 540 and the drain electrode layer 550 in the channel width direction. Note that the side gate voltage (Vsg) is voltage applied to the second gate electrode layer 572 and the third gate electrode layer 573.

FIGS. 8A and 8B and FIGS. 9A and 9B show the Id-Vg characteristics of the transistor obtained by the simulation under the above conditions. FIG. 8A, FIG. 8B, FIG. 9A, and FIG. 9B show simulation results with WSD of 160 nm, 100 nm, 40 nm, and 20 nm, respectively. Note that FIGS. 8A and 8B and FIGS. 9A and 9B each show the simulation results with Vsg of +1 V, 0 V, −1 V, −2 V, and −3 V toward the direction of an arrow.

As apparent from the results in FIGS. 8A and 8B and FIGS. 9A and 9B, the Id-Vg characteristics are improved as WSD becomes small. It is also found that as WSD becomes small, Vsg influences more effectively and Icut is reduced.

Figure 10A:
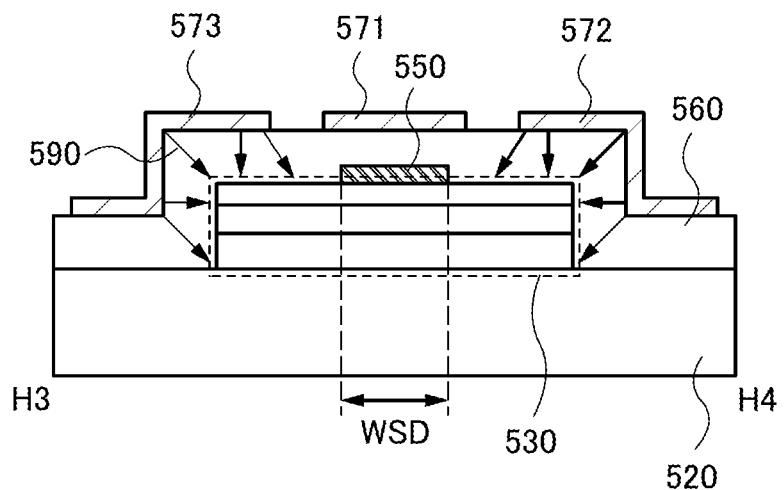
FIGS. 10A and 10B illustrate results of a device simulation.
Figure 10B:
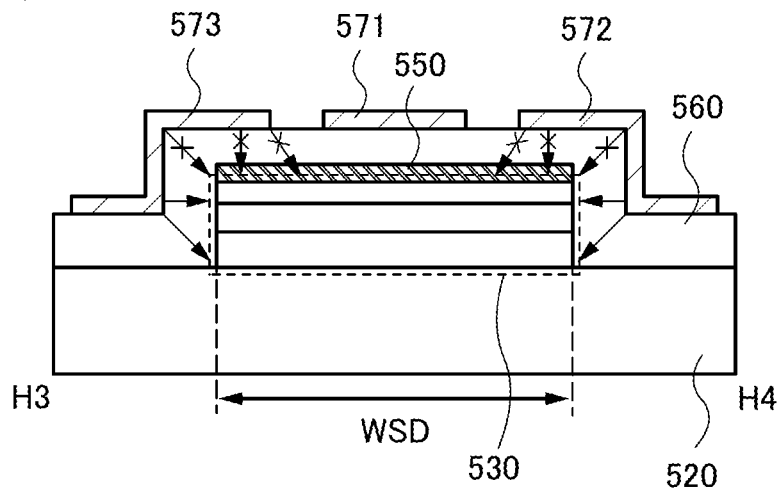

This is because, in the case where WSD is small as illustrated in FIG. 10A, there are less obstructions, which block an electric field, between the oxide semiconductor layer 130 and the second gate electrode layer 572 and between the oxide semiconductor layer 130 and the third gate electrode layer 573, so that an electric field 590 from the second gate electrode layer 572 and the third gate electrode layer 573 is efficiently applied to the oxide semiconductor layer 530. In the case where WSD is large as illustrated in FIG. 10B, on the other hand, some of the electric fields 590 from the second gate electrode layer 572 and the third gate electrode layer 573 are blocked by the source electrode layer 540 and the drain electrode layer 550; thus, the influence of Vsg might be small.

Accordingly, in the transistor of one embodiment of the present invention, it is preferable that the length in the channel width direction of each of the source electrode layer 540 and the drain electrode layer 550 (WSD) be shorter than that of the oxide semiconductor layer 530, so that the electric fields 590 from the second gate electrode layer 572 and the third gate electrode layer 573 are efficiently applied to the oxide semiconductor layer 530. Further, to apply the electric fields 590 from the second gate electrode layer 572 and the third gate electrode layer 573 to the oxide semiconductor layer 530 more efficiently, the length in the channel width direction of each of the source electrode layer 540 and the drain electrode layer 550 (WSD) is preferably shorter than the length in the channel width direction of the first gate electrode layer 571 (WG).

This embodiment can be combined as appropriate with any of the other embodiments in this specification.

Embodiment 3

In this embodiment, a transistor having a structure different from that of the transistor described in Embodiment 1 will be described.

Figure 11A:
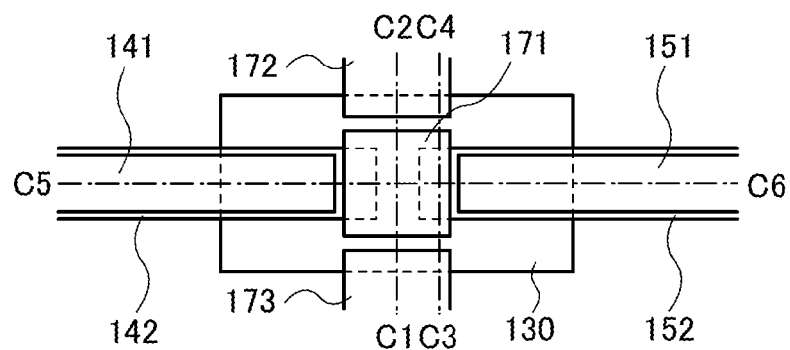
FIGS. 11A to 11D are a top view and cross-sectional views illustrating a transistor.
Figure 11B:
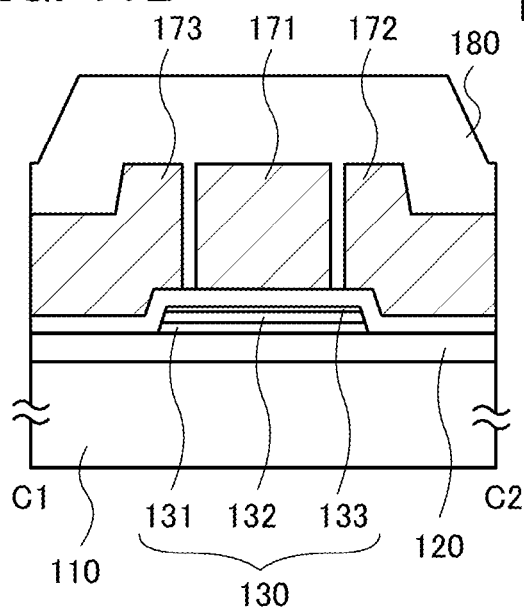
Figure 11C:
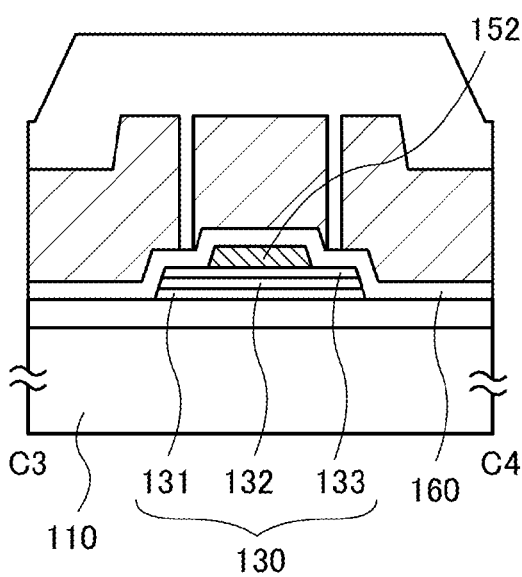

FIGS. 11A to 11D are a top view and cross-sectional views which illustrate a transistor of one embodiment of the present invention. FIG. 11A is the top view. A cross section taken along dashed-dotted line C1-C2 in FIG. 11A corresponds to FIG. 11B. A cross section taken along dashed-dotted line C3-C4 in FIG. 11A corresponds to FIG. 11C. A cross section taken along dashed-dotted line C5-C6 in FIG. 11A corresponds to FIG. 11D. Note that for simplification of the drawing, some components in the top view in FIG. 11A are not illustrated. In some cases, the direction of the dashed-dotted line C1-C2 is referred to as a channel width direction, and the direction of the dashed-dotted line C5-C6 is referred to as a channel length direction.

A transistor 300 illustrated in FIGS. 11A to 11D includes the base insulating film 120 formed over the substrate 110; the oxide semiconductor layer 130 formed over the base insulating film 120; the second source electrode layer 142 and the second drain electrode layer 152 formed over the oxide semiconductor layer 130; the first source electrode layer 141 and the first drain electrode layer 151 formed over the second source electrode layer 142 and the second drain electrode layer 152, respectively; the gate insulating film 160 formed over the first source electrode layer 141, the second source electrode layer 142, the first drain electrode layer 151, the second drain electrode layer 152, and the oxide semiconductor layer 130; the first gate electrode layer 171, the second gate electrode layer 172, and the third gate electrode layer 173 formed over the gate insulating film 160; and the oxide insulating layer 180 formed over the gate insulating film 160, the first gate electrode layer 171, the second gate electrode layer 172, and the third gate electrode layer 173. Note that the oxide insulating layer 180 may be provided as needed and another insulating layer may be further provided thereover.

Figure 22C:
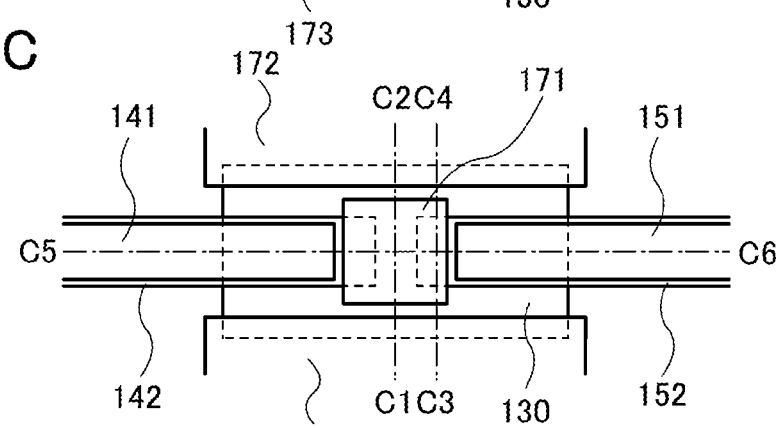

The transistor 300 illustrated in FIGS. 11A to 11D is similar to the transistor 200 illustrated in FIGS. 6A to 6D except for the stack order of the first source electrode layer 141 and the second source electrode layer 142 and the stack order of the first drain electrode layer 151 and the second drain electrode layer 152. Further, in a manner similar to that of the transistor 100 and the transistor 200 described in Embodiment 1, the length in the channel width direction of each of the first source electrode layer 141, the second source electrode layer 142, the stack order of the first drain electrode layer 151, and the second drain electrode layer 152 is shorter than that of the oxide semiconductor layer 130 or the first gate electrode layer 171 of the transistor 300. In addition, the length in the channel length direction of each of the second gate electrode layer 172 and the third gate electrode layer 173 can be larger than that of the oxide semiconductor layer 130 as illustrated in FIG. 22C.

Since the first source electrode layer 141 and the first drain electrode layer 151 are not in contact with the oxide semiconductor layer 130 in the transistor 300, an oxygen vacancy due to the first source electrode layer 141 and the first drain electrode layer 151 is not generated in the oxide semiconductor layer 130. Thus, an n-type region formed by the oxygen vacancy, which serves as a source or a drain, is not formed.

Figure 6D:
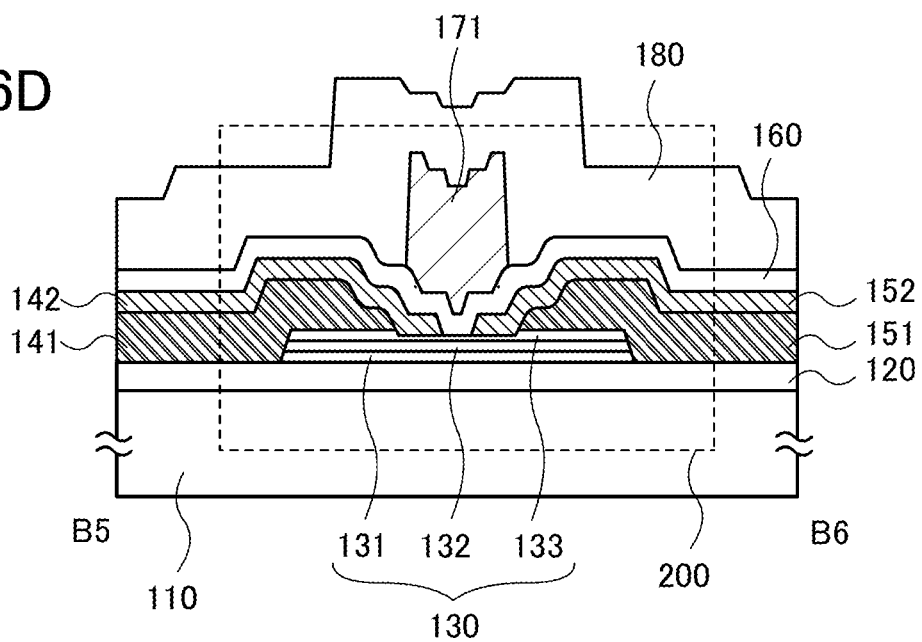
Figure 11D:
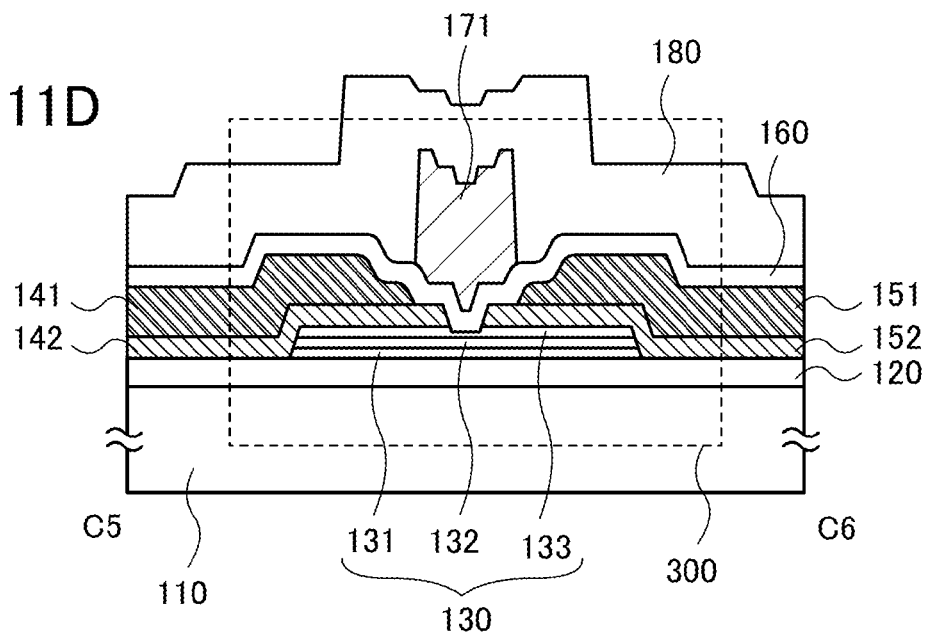

In the transistor 300, the conductive nitride (tantalum nitride or titanium nitride) described in Embodiment 1 is used for the second source electrode layer 142 and the second drain electrode layer 152. Therefore, nitrogen acting as a donor can be diffused from the nitride to a region of the oxide semiconductor layer 130 which is close to the interface with the second source electrode layer 142 and the second drain electrode layer 152, so that the region to which nitrogen is diffused can serve as a source or a drain. Note that nitrogen is sometimes diffused in a channel length direction; thus, it is preferable to remove part of a channel formation region as illustrated in FIGS. 6D and 11D. The part of the channel formation region can be removed through an etching step at the formation of the second source electrode layer 142 and the second drain electrode layer 152. Note that it is not necessary to diffuse nitrogen deeply to the oxide semiconductor layer 130 because the region of the oxide semiconductor layer 130 which is close to the interface with the second source electrode layer 142 and the second drain electrode layer 152 can sufficiently serve as a source or a drain by diffusing nitrogen only thereto.

Further, since an oxygen vacancy due to the first source electrode layer 141 and the first drain electrode layer 151 is not generated in the oxide semiconductor layer 130 in the transistor 300, the distance between the first source electrode layer 141 and the first drain electrode layer 151 can be made shorter than the distance between the source electrode layer 140 and the drain electrode layer 150 in the transistor 100. For example, an end surface of the second source electrode layer 142 may be aligned with an end surface of the first source electrode layer 141, and an end surface of the second drain electrode layer 152 may be aligned with an end surface of the first drain electrode layer 151. With such a structure, the resistance of the whole source electrode layer and the whole drain electrode layer can be reduced.

Figure 30A:
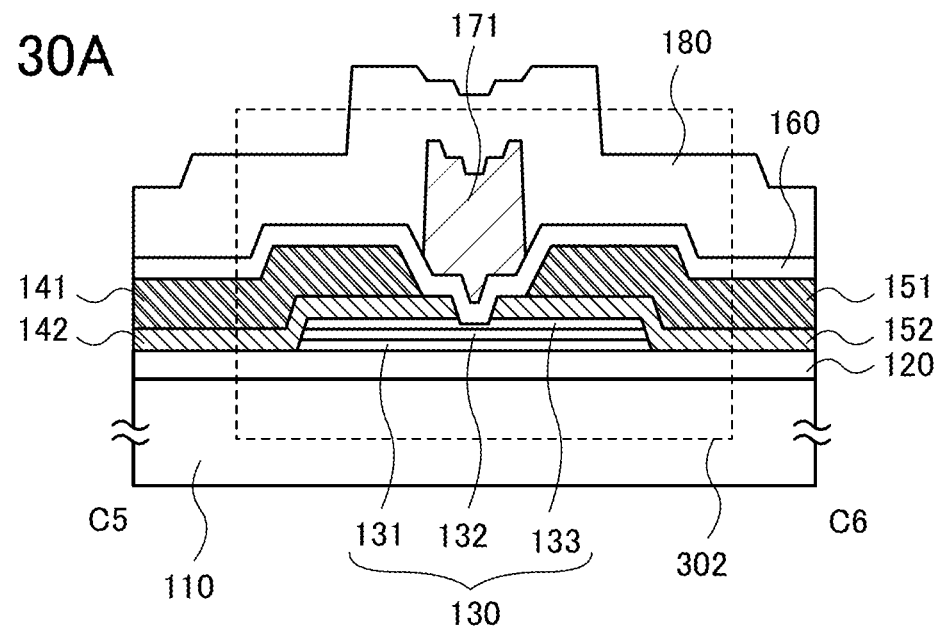
FIGS. 30A and 30B are cross-sectional views each illustrating a transistor.

Each of end portions of the first source electrode layer 141 and the first drain electrode layer 151 of the transistor 300 is preferably formed to be tapered and to have a staircase-like shape including a plurality of steps. With such a shape including a plurality of steps, the coverage with a film formed thereover is improved, so that the electrical characteristics and long-term reliability of the transistor can be improved. Like a transistor 302 illustrated in FIG. 30A, each of the end portions of the first source electrode layer 141 and the first drain electrode layer 151 does not have to have a staircase-like shape.

In the transistor of one embodiment of the present invention, the first gate electrode layer 171 controls switching of the transistor, and the second gate electrode layer 172 and the third gate electrode layer 173 each control the threshold voltage of the transistor. In the operation of the transistor, a potential for turning on or off the transistor is supplied to the first gate electrode layer 171, and a constant potential for controlling the threshold voltage of the transistor is supplied to each of the second gate electrode layer 172 and the third gate electrode layer 173. The second gate electrode layer 172 and the third gate electrode layer 173 may be supplied with the same potential or different potentials.

When the second gate electrode layer 172 and the third gate electrode layer 173 each having an effect similar to that of a back gate are formed on a thin gate insulating film side as described above, a potential for controlling the threshold voltage can be lowered. Note that the first gate electrode layer 171, the second gate electrode layer 172, and the third gate electrode layer 173 can be simultaneously formed; thus, the number of steps is not increased. Moreover, an adverse effect of forming the oxide insulating layer serving as a base insulating film thick disappears.

As described above, the threshold voltage of the transistor can be controlled by supply of an appropriate constant potential to each of the second gate electrode layer 172 and the third gate electrode layer 173; accordingly, Icut can be reduced and the long-term reliability of the semiconductor device can be improved.

In the transistor of one embodiment of the present invention, the length in the channel width direction of each of the source electrode layer and the drain electrode layer is shorter than that of the oxide semiconductor layer 130 as described above. Further, it is preferable that the length in the channel width direction of each of the source electrode layer and the drain electrode layer be shorter than that of the first gate electrode layer 171, which overlaps with the source electrode layer and the drain electrode layer. With such a structure, an electric field is applied from the second gate electrode layer 172 and the third gate electrode layer 173 to the oxide semiconductor layer 130 without interruption by the source electrode layer or the drain electrode layer. Thus, a potential supplied to the second gate electrode layer 172 and the third gate electrode layer 173 to control the threshold voltage of the transistor can be made small.

Note that the transistor of one embodiment of the present invention may have a structure without the third gate electrode layer 173 as illustrated in FIGS. 25A to 25D. Also in a transistor 301 having such a structure, a potential for controlling on/off of the transistor is supplied to the first gate electrode layer 171 and a constant potential for controlling the threshold voltage of the transistor is supplied to the second gate electrode layer 172. Thus, the threshold voltage of the transistor can be controlled in a manner similar to that of a transistor including the third gate electrode layer 173; accordingly, Icut can be reduced and a semiconductor device can have higher long-term reliability. In addition, in the transistor 301, the first gate electrode layer 171 can be easily connected to a wiring from which a potential is supplied to the first gate electrode layer 171.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

Embodiment 4

In this embodiment, a transistor having a structure different from that of the transistor described in Embodiments 1 and 3 will be described.

Figure 12A:
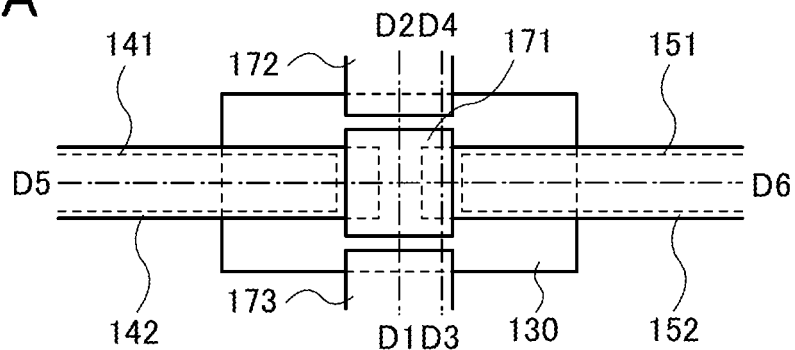
FIGS. 12A to 12D are a top view and cross-sectional views illustrating a transistor.
Figure 12B:
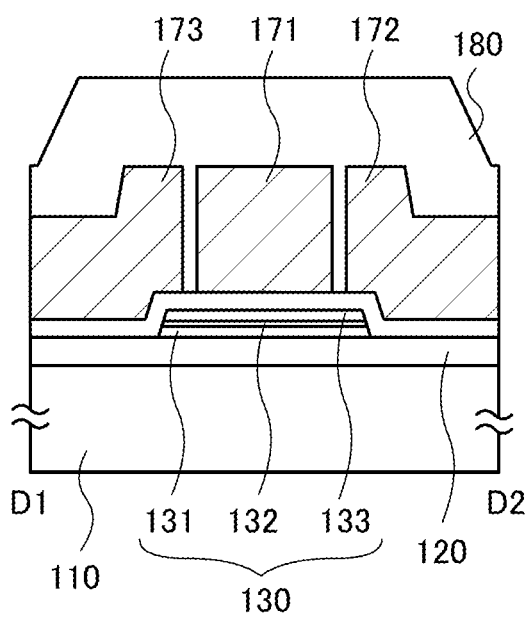
Figure 12C:
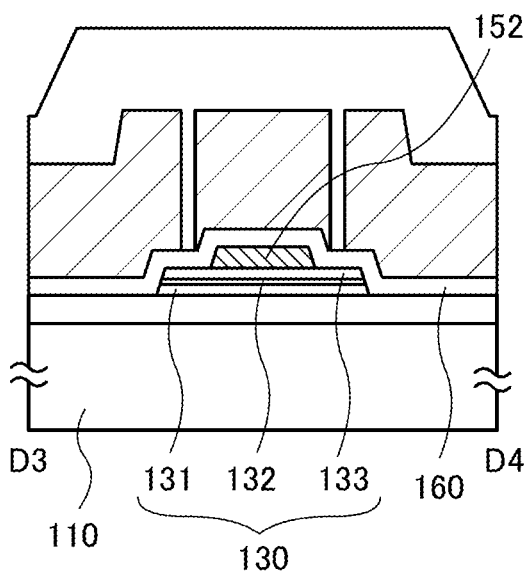

FIGS. 12A to 12D are a top view and cross-sectional views which illustrate a transistor of one embodiment of the present invention. FIG. 12A is the top view. A cross section taken along dashed-dotted line D1-D2 in FIG. 12A corresponds to FIG. 12B. A cross section taken along dashed-dotted line D3-D4 in FIG. 12A corresponds to FIG. 12C. A cross section taken along dashed-dotted line D5-D6 in FIG. 12A corresponds to FIG. 12D. Note that for simplification of the drawing, some components in the top view in FIG. 12A are not illustrated. In some cases, the direction of the dashed-dotted line D1-D2 is referred to as a channel width direction, and the direction of the dashed-dotted line D5-D6 is referred to as a channel length direction.

A transistor 400 illustrated in FIGS. 12A to 12D includes the base insulating film 120 formed over the substrate 110; the first oxide semiconductor layer 131 and the second oxide semiconductor layer 132 formed over the base insulating film 120; the first source electrode layer 141 and the first drain electrode layer 151 formed over the second oxide semiconductor layer 132; the third oxide semiconductor layer 133 formed over the second oxide semiconductor layer 132, the first source electrode layer 141, and the first drain electrode layer 151; the second source electrode layer 142 which covers the first source electrode layer 141 and is in contact with the first source electrode layer 141 and the third oxide semiconductor layer 133; the second drain electrode layer 152 which covers the first drain electrode layer 151 and is in contact with the first drain electrode layer 151 and the third oxide semiconductor layer 133; the gate insulating film 160 formed over the third oxide semiconductor layer 133, the second source electrode layer 142, and the second drain electrode layer 152; the first gate electrode layer 171, the second gate electrode layer 172, and the third gate electrode layer 173 formed over the gate insulating film 160; and the oxide insulating layer 180 formed over the gate insulating film 160, the first gate electrode layer 171, the second gate electrode layer 172, and the third gate electrode layer 173. Note that the oxide insulating layer 180 may be provided as needed and another insulating layer may be further provided thereover.

Figure 22D:
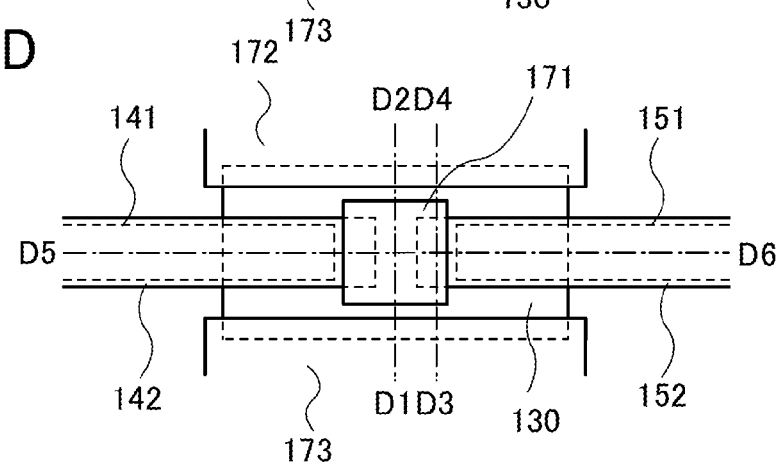
Figure 23A:
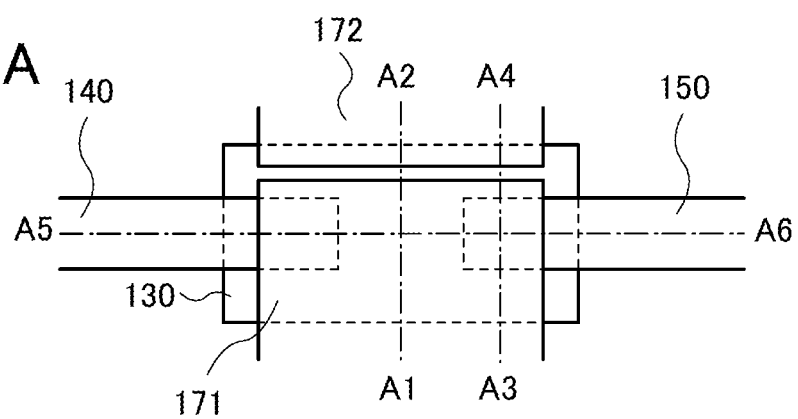
FIGS. 23A to 23D are a top view and cross-sectional views illustrating a transistor.
Figure 23B:
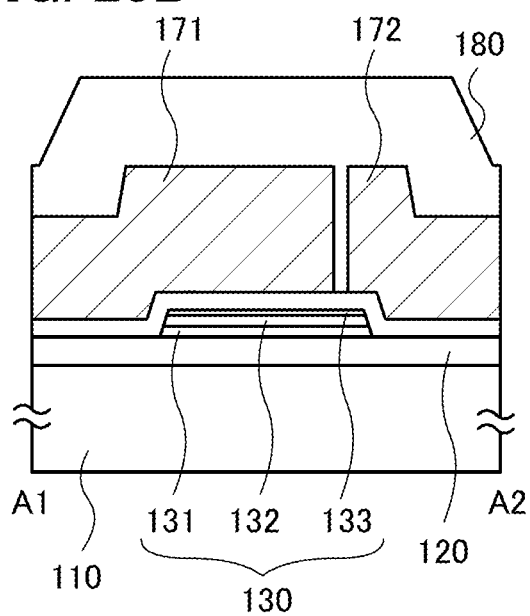
Figure 23C:
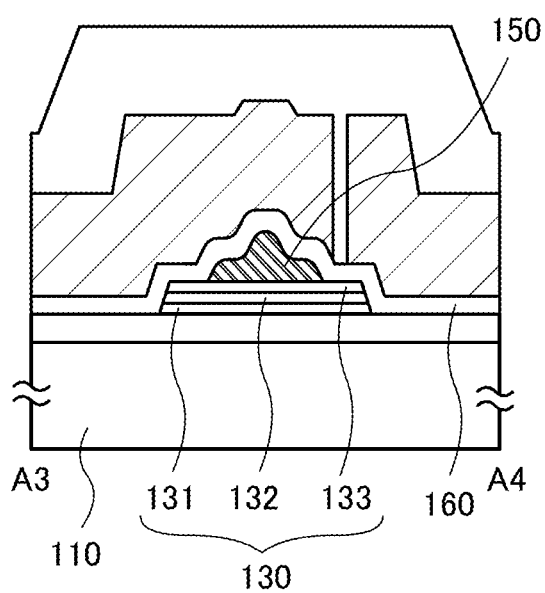
Figure 23D:
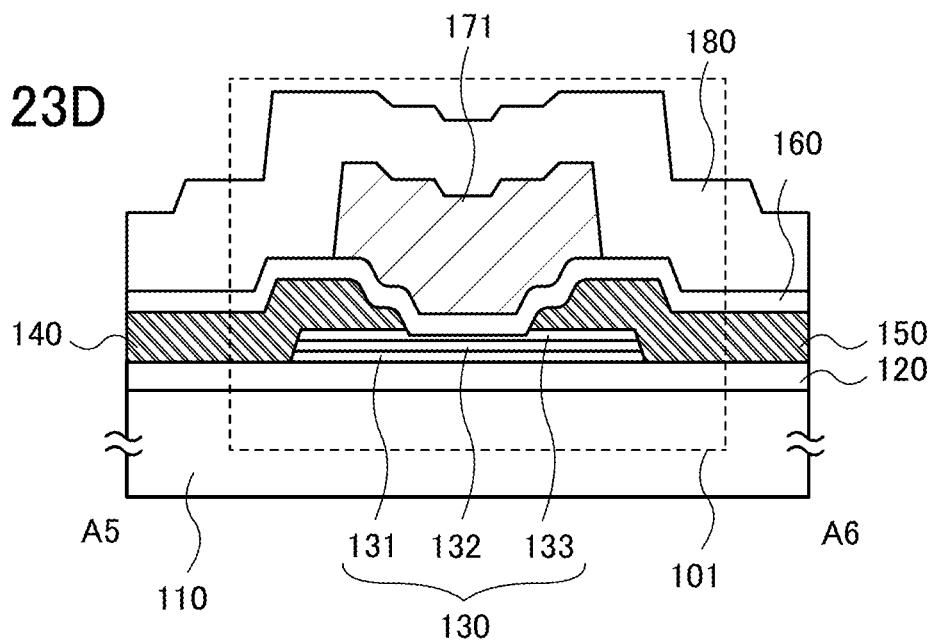
Figure 24A:
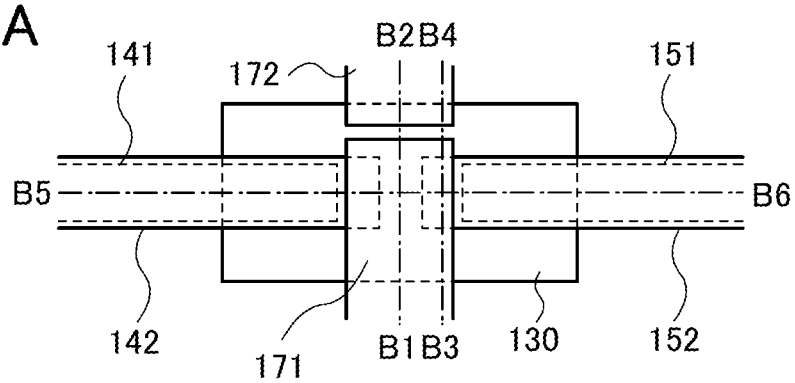
FIGS. 24A to 24D are a top view and cross-sectional views illustrating a transistor.
Figure 24B:
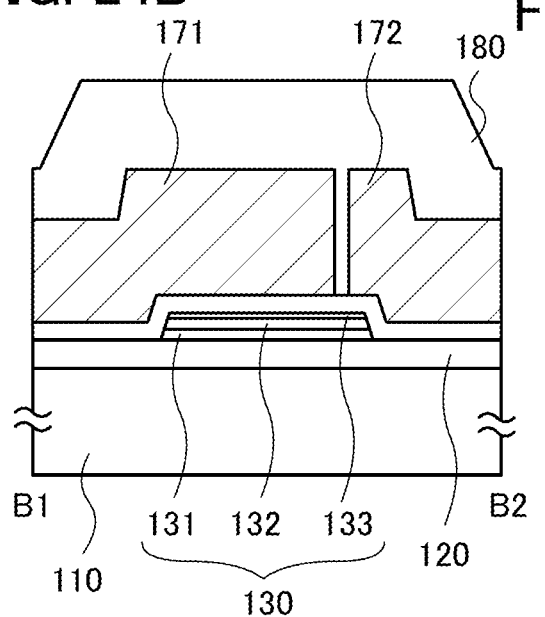
Figure 24C:
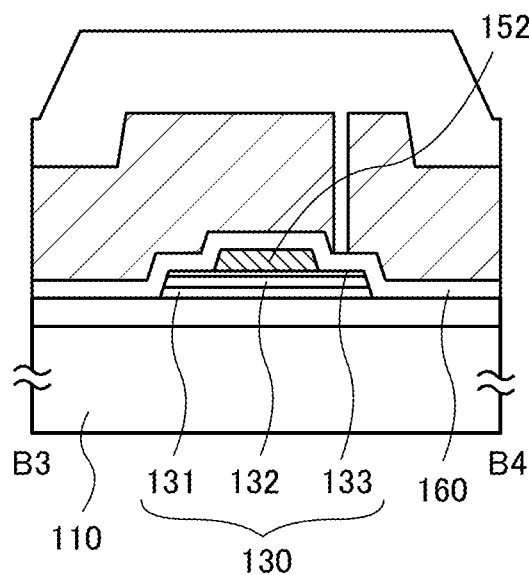
Figure 24D:
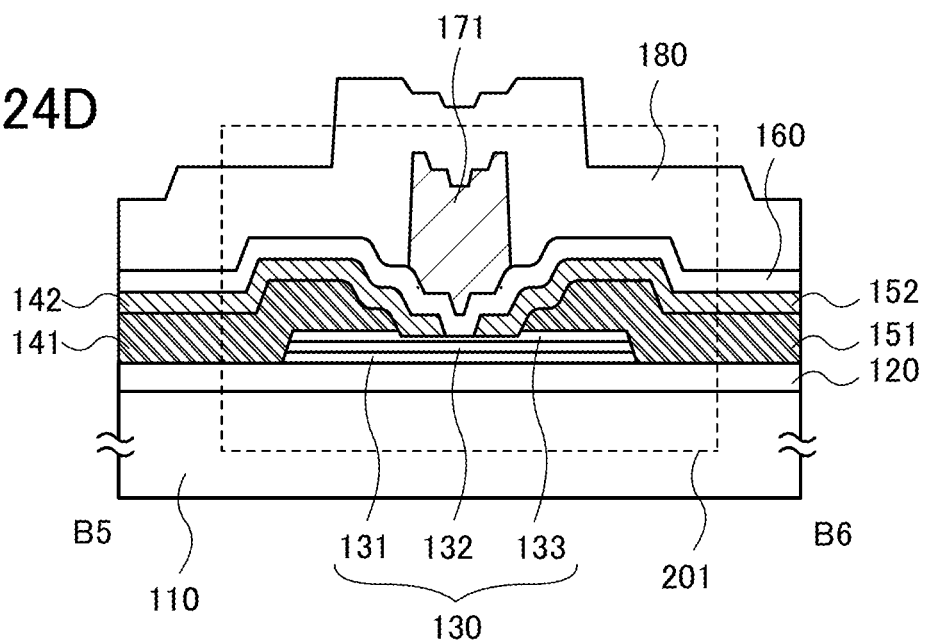
Figure 25A:
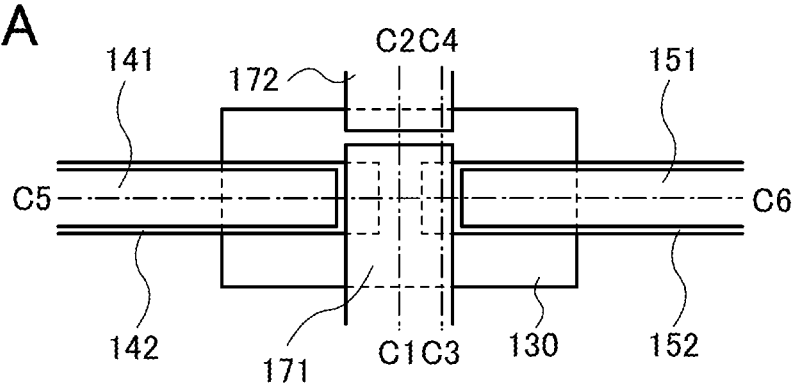
FIGS. 25A to 25D are a top view and cross-sectional views illustrating a transistor.
Figure 25B:
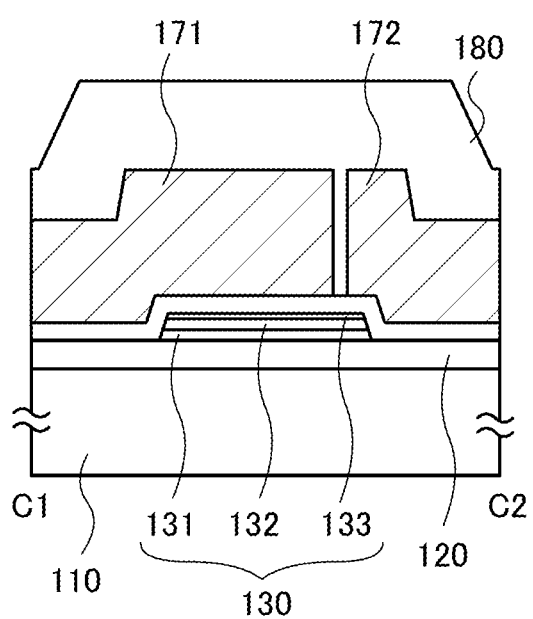
Figure 25C:
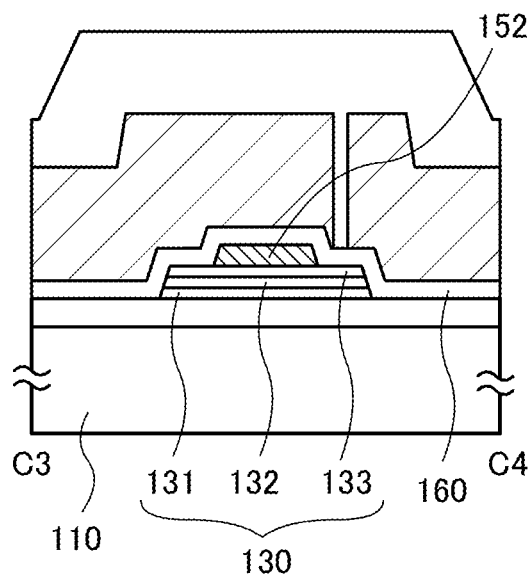
Figure 25D:
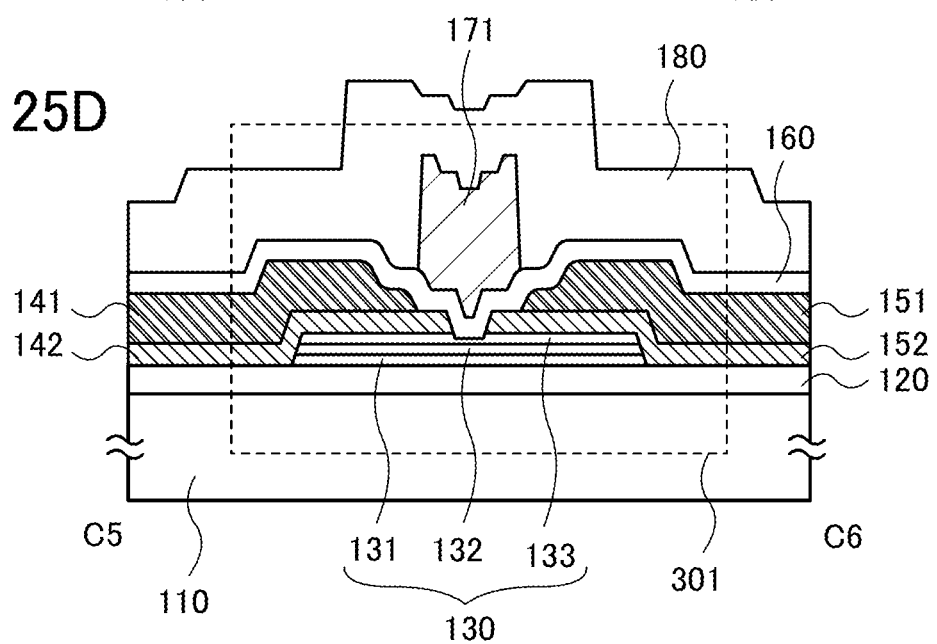
Figure 26A:
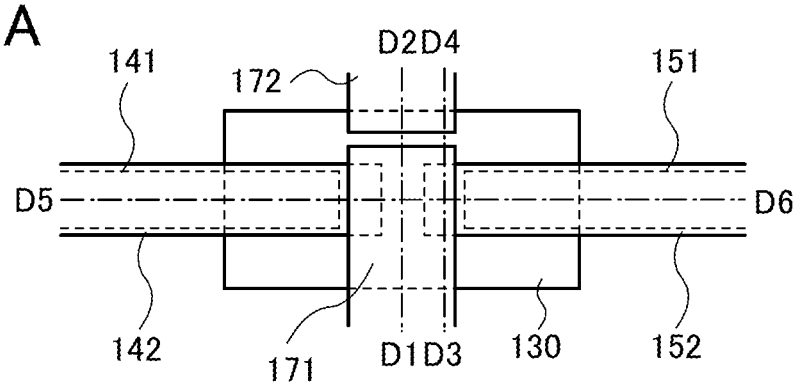
FIGS. 26A to 26D are a top view and cross-sectional views illustrating a transistor.
Figure 26B:
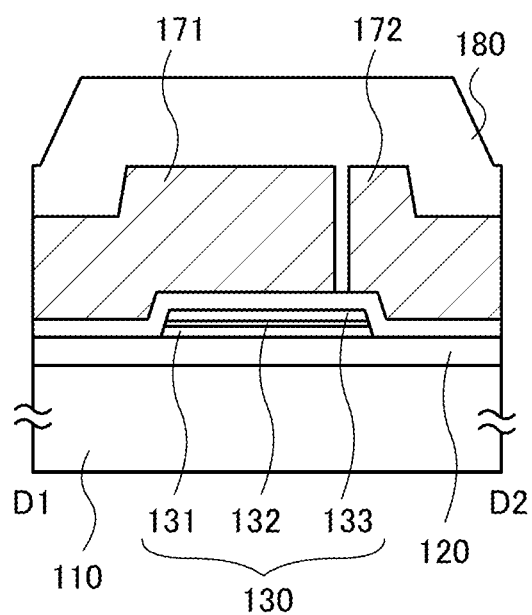
Figure 26C:
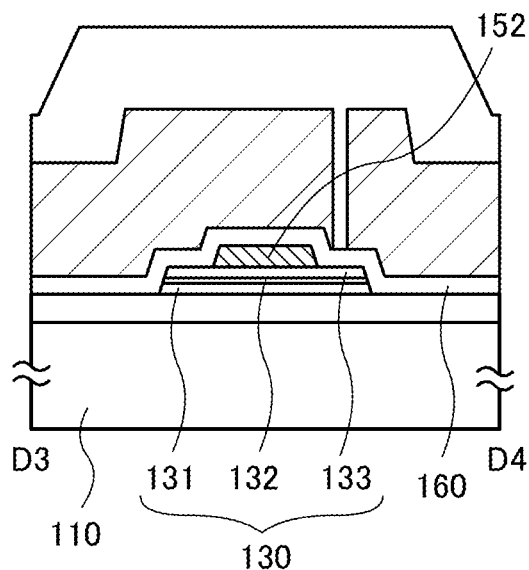
Figure 26D:
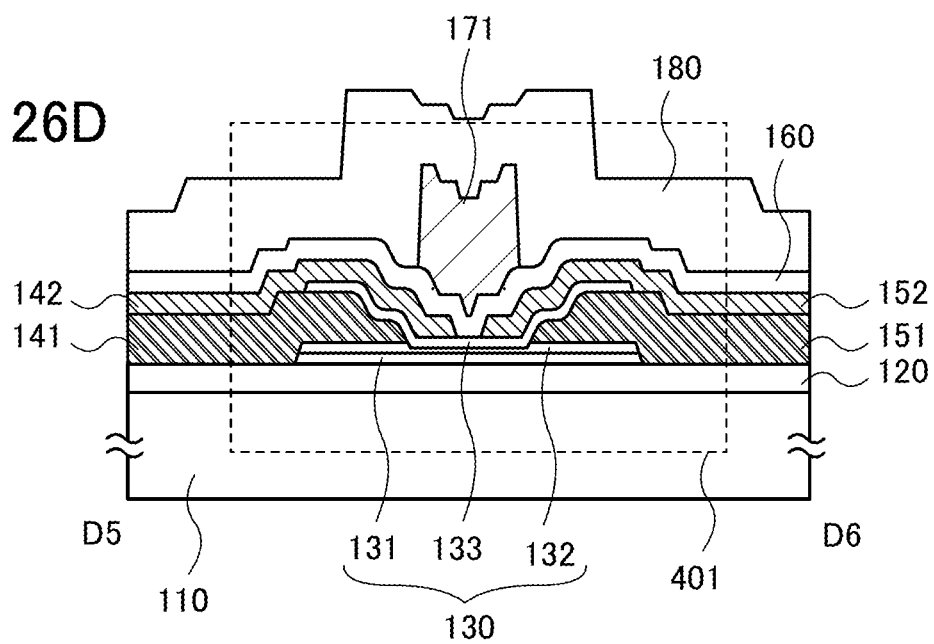

The transistor 400 illustrated in FIGS. 12A to 12D is similar to the transistor 200 illustrated in FIGS. 6A to 6D except that the third oxide semiconductor layer 133 is formed over the first source electrode layer 141 and the first drain electrode layer 151. Further, in a manner similar to that of the transistor 100 and the transistor 200 described in Embodiment 1, the length in the channel width direction of each of the first source electrode layer 141, the second source electrode layer 142, the stack order of the first drain electrode layer 151, and the second drain electrode layer 152 is shorter than that of the oxide semiconductor layer 130 or the first gate electrode layer 171 of the transistor 300. In addition, the length in the channel length direction of each of the second gate electrode layer 172 and the third gate electrode layer 173 can be longer than that of the oxide semiconductor layer 130 as illustrated in FIG. 22D.

In the transistor 400, the second oxide semiconductor layer 132 where a channel is formed is in contact with the first source electrode layer 141 and the first drain electrode layer 151; thus, high-density oxygen vacancies are generated in the second oxide semiconductor layer 132 and accordingly an n-type region is formed. Therefore, there is a few resistance components in a carrier path and carriers can be transported efficiently.

Further, since the third oxide semiconductor layer 133 is formed after the first source electrode layer 141 and the first drain electrode layer 151 are formed, the third oxide semiconductor layer 133 is not over-etched when the first source electrode layer 141 and the first drain electrode layer 151 are formed. Therefore, the second oxide semiconductor layer 132 where a channel is formed can be sufficiently separated from the gate insulating film 160, and the effect of suppressing influence of diffusion of impurities from the interface between the third oxide semiconductor layer 133 and the gate insulating film 160 can be enhanced.

Figure 12D:
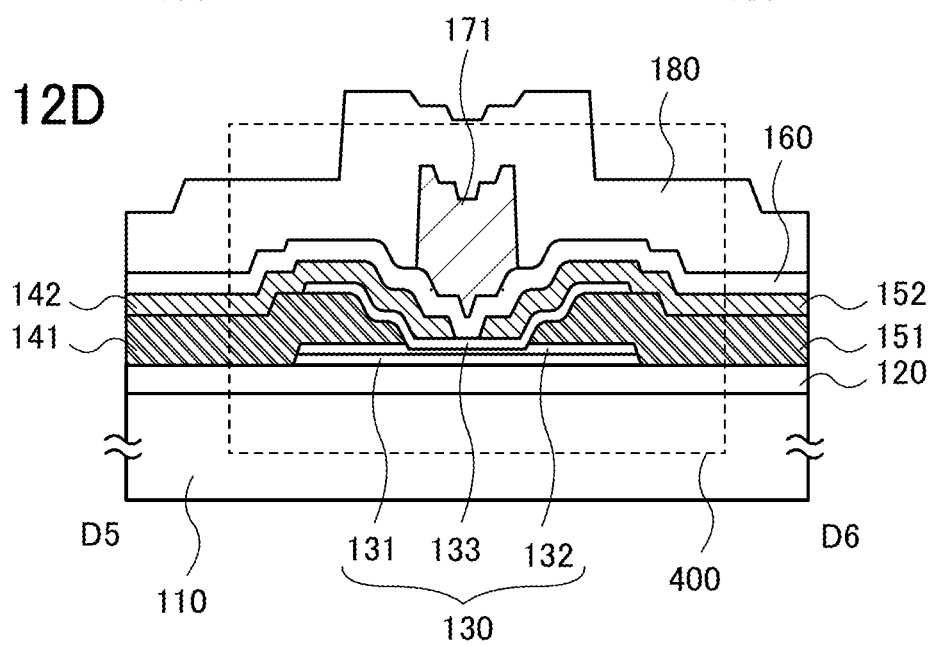
Figure 30B:
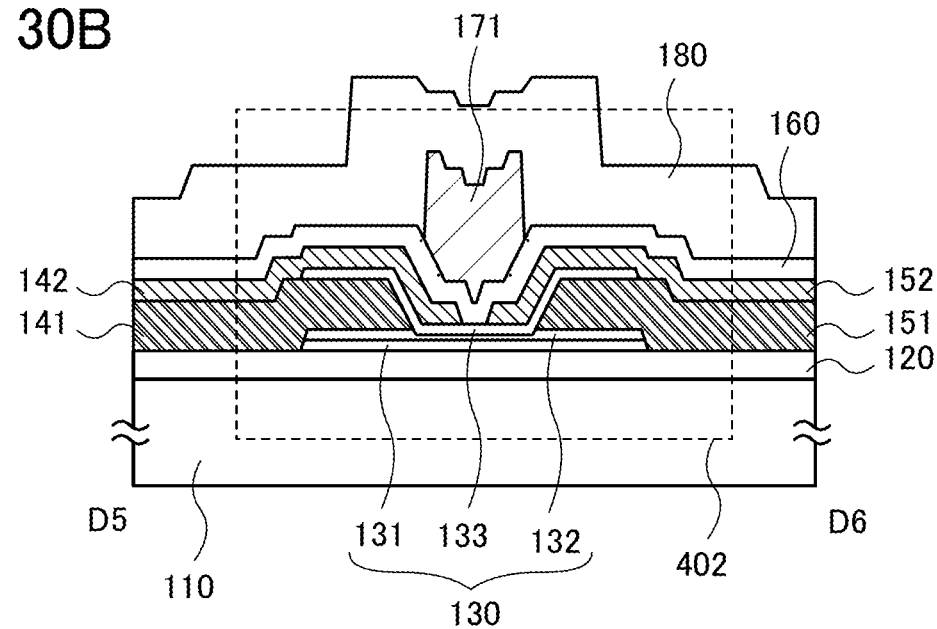

Each of end portions of the first source electrode layer 141 and the first drain electrode layer 151 of the transistor 400 is preferably formed to be tapered and to have a staircase-like shape including a plurality of steps as illustrated in FIG. 12D. With such a shape including a plurality of steps, the coverage with a film formed thereover is improved, so that the electrical characteristics and long-term reliability of the transistor can be improved. Like a transistor 402 illustrated in FIG. 30B, each of the end portions of the first source electrode layer 141 and the first drain electrode layer 151 does not have to have a staircase-like shape.

In the transistor of one embodiment of the present invention, the first gate electrode layer 171 controls switching of the transistor, and the second gate electrode layer 172 and the third gate electrode layer 173 each control the threshold voltage of the transistor. In the operation of the transistor, a potential for turning on or off the transistor is supplied to the first gate electrode layer 171, and a constant potential for controlling the threshold voltage of the transistor is supplied to each of the second gate electrode layer 172 and the third gate electrode layer 173. The second gate electrode layer 172 and the third gate electrode layer 173 may be supplied with the same potential or different potentials.

When the second gate electrode layer 172 and the third gate electrode layer 173 each having an effect similar to that of a back gate are formed on a thin gate insulating film side as described above, a potential for controlling the threshold voltage can be lowered. Note that the first gate electrode layer 171, the second gate electrode layer 172, and the third gate electrode layer 173 can be simultaneously formed; thus, the number of steps is not increased. Moreover, an adverse effect of forming the oxide insulating layer serving as a base insulating film thick disappears.

As described above, the threshold voltage of the transistor can be controlled by supply of an appropriate constant potential to each of the second gate electrode layer 172 and the third gate electrode layer 173; accordingly, Icut can be reduced and the long-term reliability of the semiconductor device can be improved.

In the transistor of one embodiment of the present invention, the length in the channel width direction of each of the source electrode layer and the drain electrode layer is shorter than that of the oxide semiconductor layer 130 as described above. Further, it is preferable that the length in the channel width direction of each of the source electrode layer and the drain electrode layer be shorter than that of the first gate electrode layer 171, which overlaps with the source electrode layer and the drain electrode layer. With such a structure, an electric field is applied from the second gate electrode layer 172 and the third gate electrode layer 173 to the oxide semiconductor layer 130 without interruption by the source electrode layer or the drain electrode layer. Thus, a potential supplied to the second gate electrode layer 172 and the third gate electrode layer 173 to control the threshold voltage of the transistor can be made small.

Note that the transistor of one embodiment of the present invention may have a structure without the third gate electrode layer 173 as illustrated in FIGS. 26A to 26D. Also in a transistor 401 having such a structure, a potential for controlling on/off of the transistor is supplied to the first gate electrode layer 171 and a constant potential for controlling the threshold voltage of the transistor is supplied to the second gate electrode layer 172. Thus, the threshold voltage of the transistor can be controlled in a manner similar to that of a transistor including the third gate electrode layer 173; accordingly, Icut can be reduced and a semiconductor device can have higher long-term reliability. In addition, in the transistor 401, the first gate electrode layer 171 can be easily connected to a wiring from which a potential is supplied to the first gate electrode layer 171.

The above is the description of the transistor of one embodiment of the present invention. The transistor has favorable electrical characteristics, so that a semiconductor device having high long-term reliability can be provided.

This embodiment can be combined as appropriate with any of the other embodiments in this specification.

Embodiment 5

In this embodiment, a method for forming the transistor 200 described in Embodiment 1 with reference to FIGS. 6A to 6D will be described with reference to FIGS. 13A to 13C, FIGS. 14A to 14C, and FIGS. 15A and 15B.

For the substrate 110, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like can be used. Still alternatively, any of these substrates further provided with a semiconductor element can be used.

The base insulating film 120 can be formed by a plasma CVD method, a sputtering method, or the like using an oxide insulating film of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a stack containing any of the above materials may be used, and at least an upper layer of the base insulating film 120, which is in contact with the oxide semiconductor layer 130, is preferably formed using a material containing oxygen that might serve as a supply source of oxygen to the oxide semiconductor layer 130.

In the case where a surface of the substrate 110 is made of an insulator and there is no influence of impurity diffusion to the oxide semiconductor layer 130 to be formed later, the base insulating film 120 is not necessarily provided.

Figure 13A:
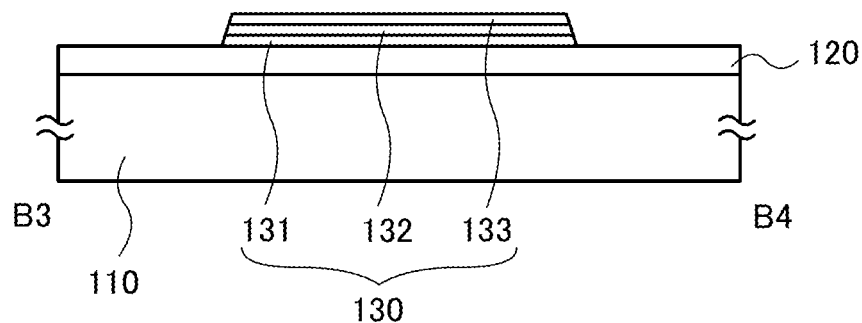
FIGS. 13A to 13C illustrate a method for forming a transistor.

Then, the first oxide semiconductor layer 131, the second oxide semiconductor layer 132, and the third oxide semiconductor layer 133 are formed over the base insulating film 120 by a sputtering method, a CVD method, an MBE method, an ALD method, or a PLD method and selectively etched, so that the oxide semiconductor layer 130 is formed (see FIG. 13A). Note that heating may be performed before etching.

For the first oxide semiconductor layer 131, the second oxide semiconductor layer 132, and the third oxide semiconductor layer 133, the material described in Embodiment 1 can be used. For example, the first oxide semiconductor layer 131 can be formed using an In—Ga—Zn oxide whose atomic ratio of In to Ga and Zn is 1:3:2, the second oxide semiconductor layer 132 can be formed using an In—Ga—Zn oxide whose atomic ratio of In to Ga and Zn is 1:1:1, and the third oxide semiconductor layer 133 can be formed using an In—Ga—Zn oxide whose atomic ratio of In to Ga and Zn is 1:3:2.

An oxide semiconductor that can be used for each of the first oxide semiconductor layer 131, the second oxide semiconductor layer 132, and the third oxide semiconductor layer 133 preferably contains at least indium (In) or zinc (Zn). Alternatively, the oxide semiconductor preferably contains both In and Zn. In order to reduce variation in electrical characteristics of the transistor including the oxide semiconductor, the oxide semiconductor preferably contains a stabilizer in addition to In and/or Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), and the like can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that an In—Ga—Zn oxide refers to, for example, an oxide containing In, Ga, and Zn as its main components and there is no particular limitation on the ratio of In to Ga and Zn. The In—Ga—Zn oxide may contain a metal element other than In, Ga, and Zn. Further, in this specification, a film formed using an In—Ga—Zn oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Further alternatively, a material represented by $In_2SnO_5(ZnO)_n$ (n>0, where n is an integer) may be used.

Note that as described in Embodiment 1 in detail, a material of the first oxide semiconductor layer 131 and the third oxide semiconductor layer 133 is selected so that the first oxide semiconductor layer 131 and the third oxide semiconductor layer 133 each have an electron affinity higher than that of the second oxide semiconductor layer 132.

Note that the oxide semiconductor layers are each preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case where an In—Ga—Zn oxide is used for each of the first oxide semiconductor layer 131, the second oxide semiconductor layer 132, and the third oxide semiconductor layer 133, a material whose atomic ratio of In to Ga and Zn is any of 1:1:1, 2:2:1, 3:1:2, 1:3:2, 1:4:3, 1:5:4, 1:6:6, 2:1:3, 1:6:4, 1:9:6, 1:1:4, and 1:1:2 is used so that the first oxide semiconductor layer 131 and the third oxide semiconductor layer 133 each have an electron affinity higher than that of the second oxide semiconductor layer 132.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The indium content of the second oxide semiconductor layer 132 is preferably higher than those of the first oxide semiconductor layer 131 and the third oxide semiconductor layer 133. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the second oxide semiconductor layer 132, a transistor having high mobility can be achieved.

A structure of an oxide semiconductor film is described below.

Note that in this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the layer is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis (q, scan) is performed under conditions where the sample is rotated around a normal vector of a sample surface as an axis (q, axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases.

Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

In a transistor including the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor layer, a microcrystalline oxide semiconductor layer, and a CAAC-OS layer, for example.

A CAAC-OS film can be deposited by a sputtering method using a polycrystalline oxide semiconductor sputtering target, for example.

For the deposition of the CAAC-OS film, the following conditions are preferably employed.

The amount of impurities entering the CAAC-OS film during the deposition is reduced, so that the crystal state can be prevented from being broken by the impurities. For example, impurities (e.g., hydrogen, water, carbon dioxide, or nitrogen) which exist in the deposition chamber is reduced. Further, impurities in a deposition gas are reduced. Specifically, a deposition gas whose dew point is lower than or equal to −80° C., preferably lower than or equal to −100° C. is used.

When the substrate heating temperature during the deposition is increased, migration of a sputtered particle occurs after the sputtered particle reaches the substrate. Specifically, the substrate heating temperature during the deposition is higher than or equal to 100° C. and lower than or equal to 740° C., preferably higher than or equal to 200° C. and lower than or equal to 500° C. An increase in substrate heating temperature during the deposition causes migration to occur over the substrate when the flat-plate-like sputtered particle reaches the substrate, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As a sputtering target, an In—Ga—Zn—O compound target can be used, for example. The In—Ga—Zn—O compound target is a polycrystalline body which is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The grain size of the polycrystalline body is preferably as small as possible, for example, less than or equal to 1 μm. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the second oxide semiconductor layer 132 can be improved, and in addition, impurities such as hydrogen and water can be removed from the base insulating film 120, the first oxide semiconductor layer 131, and the third oxide semiconductor layer 133. Note that the first heat treatment may be performed before etching for formation of the oxide semiconductor layer 130.

In the case where the oxide semiconductor layer 130 is a stacked layer and an amorphous layer is formed as a lower layer, a CAAC-OS film can be easily formed thereover. Thus, it is preferable that the first oxide semiconductor layer 131 be an amorphous layer and the second oxide semiconductor layer 132 be a CAAC-OS film.

Then, a first conductive film to be the first source electrode layer 141 and the first drain electrode layer 151 is formed over the oxide semiconductor layer 130. For the first conductive film, Al, Cr, Cu, Ta, Ti, Mo, W, or an alloy material containing any of these as its main component can be used. For example, a 100-nm-thick titanium film is formed by a sputtering method or the like.

Figure 13B:
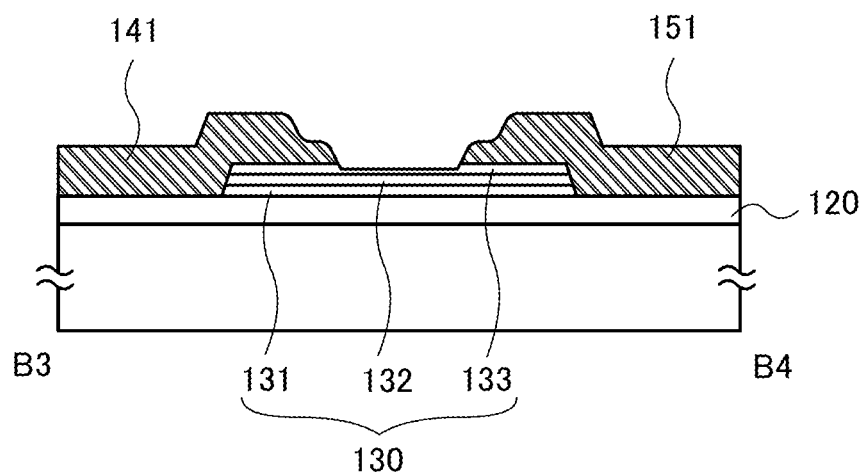

Next, the first conductive film is etched so as to be divided over the oxide semiconductor layer 130, so that the first source electrode layer 141 and the first drain electrode layer 151 are formed (see FIG. 13B). At this time, the end portions of the first source electrode layer 141 and the first drain electrode layer 151 are each formed so as to have a staircase-like shape as illustrated in FIG. 13B. The end portions can be formed in such a manner that a step of making a resist mask recede by ashing and an etching step are alternately performed plural times.

At this time, the first conductive film is over-etched, so that the oxide semiconductor layer 130 is partly etched as illustrated in FIG. 13B. However, when the etching selectivity of the first conductive film to the oxide semiconductor layer 130 is high, the oxide semiconductor layer 130 is hardly etched.

Then, a second conductive film 800 to be the second source electrode layer 142 and the second drain electrode layer 152 is formed over the oxide semiconductor layer 130, the first source electrode layer 141, and the first drain electrode layer 151. For the second conductive film 800, a material containing tantalum nitride, titanium nitride, or ruthenium can be used. For example, a 20-nm-thick tantalum nitride film is formed by a sputtering method or the like.

Figure 13C:
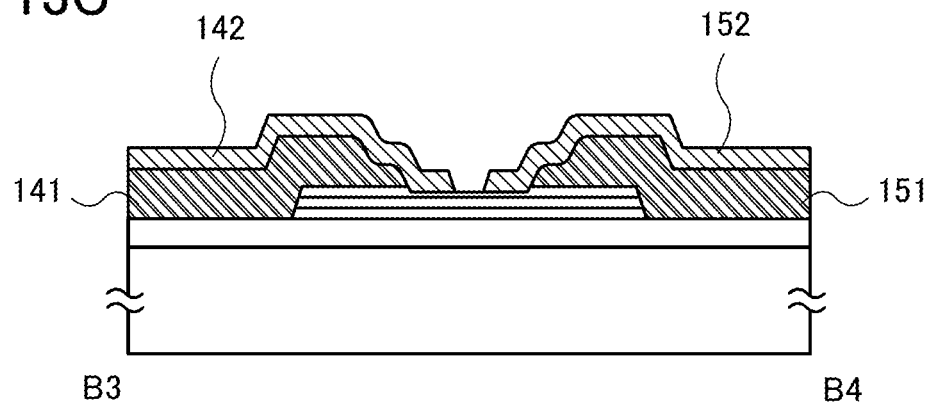

Next, the second conductive film 800 is etched so as to be divided over the oxide semiconductor layer 130, so that the second source electrode layer 142 and the second drain electrode layer 152 are formed (see FIG. 13C). At this time, part of the oxide semiconductor layer 130 may be etched.

Figure 15A:
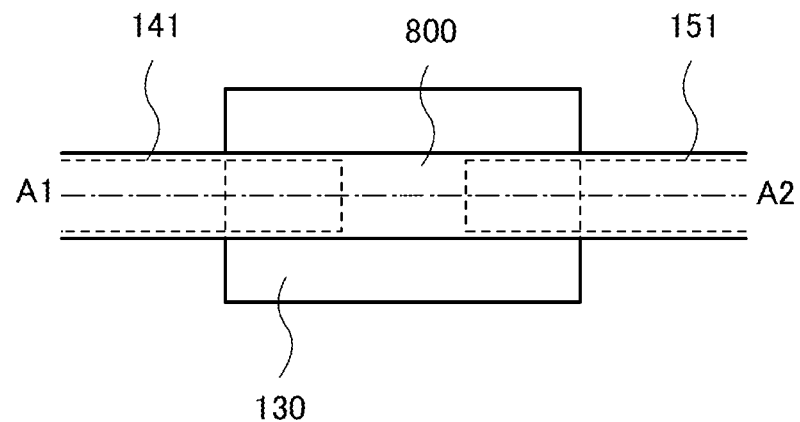
FIGS. 15A and 15B illustrate a method for forming a transistor.
Figure 15B:
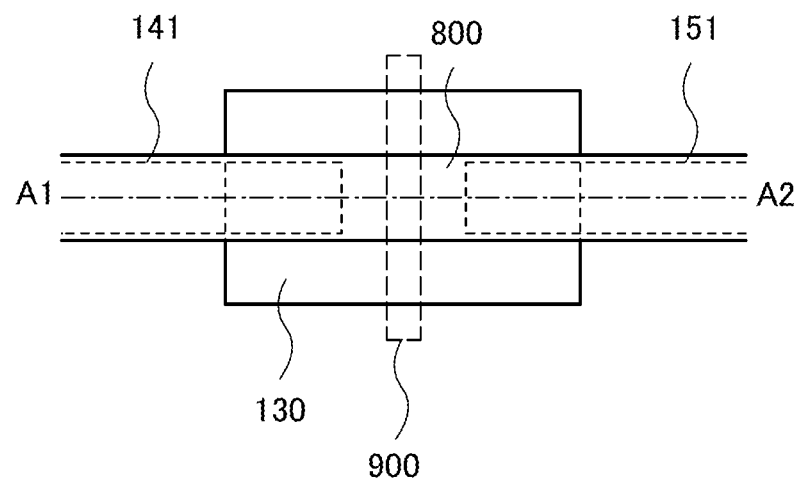

Note that in the case of forming a transistor whose channel length (a distance between the second source electrode layer 142 and the second drain electrode layer 152) is extremely short, the second conductive film 800 is etched first so as to cover the first source electrode layer 141 and the first drain electrode layer 151, as illustrated in a top view in FIG. 15A. Then, a region 900 for dividing the second conductive film 800, which is illustrated in FIG. 15B is etched using a resist mask that is processed by a method suitable for fine line processing, such as electron beam exposure; accordingly, the second source electrode layer 142 and the second drain electrode layer 152 are formed. Note that with the use of a positive type resist for the resist mask, the exposed region can be minimized and throughput can be thus improved. In the above manner, a transistor having a channel length of 30 nm or less can be formed.

Next, second heat treatment is preferably performed. The second heat treatment can be performed under conditions similar to those of the first heat treatment. By the second heat treatment, impurities such as hydrogen and water can be further removed from the oxide semiconductor layer 130.

Figure 14A:
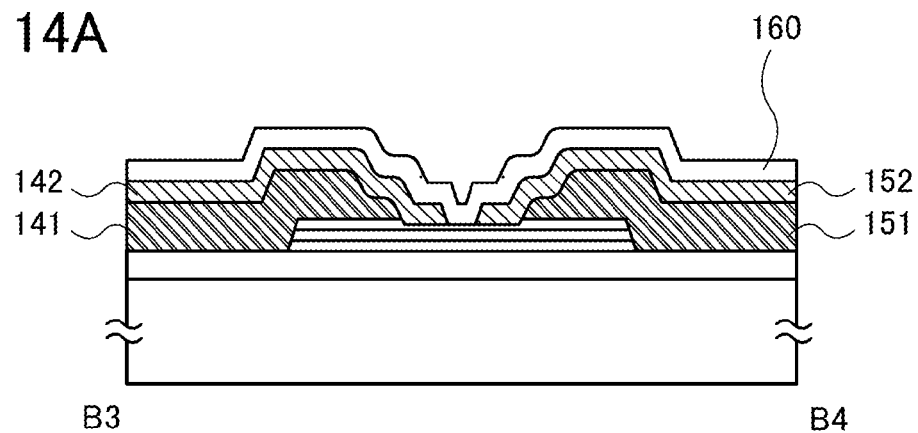
FIGS. 14A to 14C illustrate a method for forming a transistor.
Figure 14B:
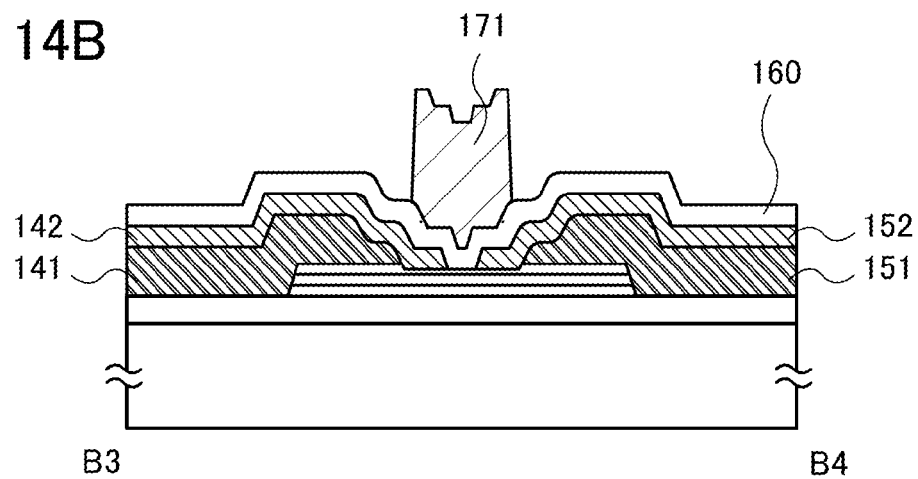

Next, the gate insulating film 160 is formed over the oxide semiconductor layer 130, the second source electrode layer 142, and the second drain electrode layer 152 (see FIG. 14A). The gate insulating film 160 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 160 may be a stack containing any of the above materials. The gate insulating film 160 can be formed by a sputtering method, a CVD method, an MBE method, an ALD method, a PLD method, or the like.

After that, a third conductive film to be the first gate electrode layer 171, the second gate electrode layer 172, and the third gate electrode layer 173 is formed over the gate insulating film 160. For the third conductive film, Al, Ti, Cr, Co, Ni, Cu, Y, Zr, Mo, Ru, Ag, Ta, W, or an alloy material containing any of these as its main component can be used. The third conductive film can be formed by a sputtering method or the like. The third conductive film is etched so that the first gate electrode layer 171, the second gate electrode layer 172, and the third gate electrode layer 173 are formed to overlap with the channel formation region and to be separated from one another (see FIG. 14B). Note that the second gate electrode layer 172 and the third gate electrode layer 173 are not illustrated in FIGS. 13A to 13C, FIGS. 14A to 14C, and FIGS. 15A and 15B.

Although the conductive film can be formed by a sputtering method, another method, e.g., a thermal CVD method, may be employed. A metal organic chemical vapor deposition (MOCVD) method or an atomic layer deposition (ALD) method may be employed as an example of a thermal CVD method.

In the case where a tungsten film is formed using a deposition apparatus employing ALD, for example, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 14C:
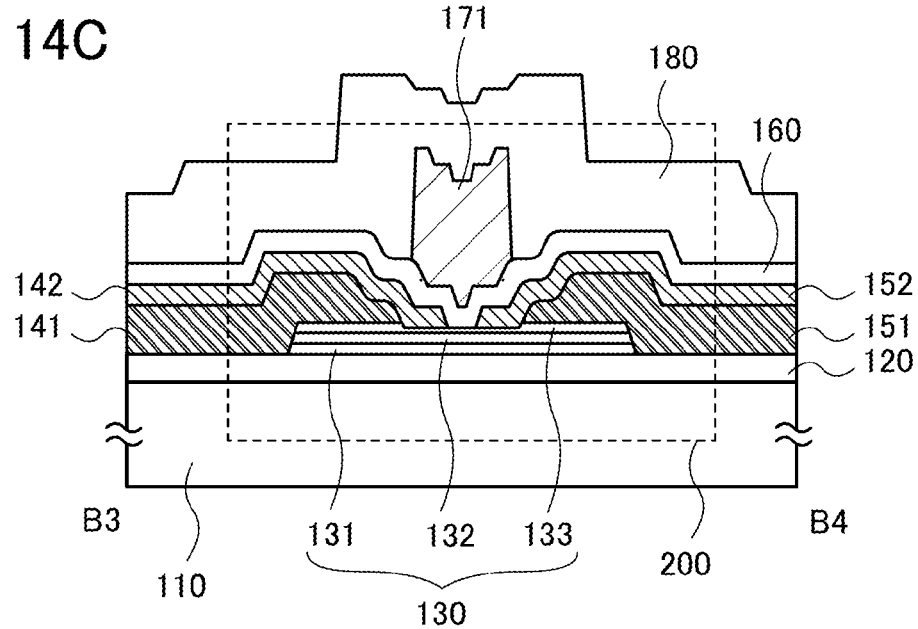

Next, the oxide insulating layer 180 is formed over the gate insulating film 160, the first gate electrode layer 171, the second gate electrode layer 172, and the third gate electrode layer 173 (see FIG. 14C). The oxide insulating layer 180 can be formed using a material and a method which are similar to those of the base insulating film 120. The oxide insulating layer 180 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or an oxide insulating layer containing nitrogen. The oxide insulating layer 180 can be formed by a sputtering method, a CVD method, an MBE method, an ALD method, or a PLD method, and is preferably formed to contain excess oxygen so as to be able to supply oxygen to the oxide semiconductor layer 130.

Oxygen may be added to the oxide insulating layer 180 by an ion implantation method, an ion doping method, a plasma immersion ion implantation method, or the like. By addition of oxygen, the oxide insulating layer 180 can supply oxygen much easily to the oxide semiconductor layer 130.

Next, third heat treatment is preferably performed. The third heat treatment can be performed under conditions similar to those of the first heat treatment. By the third heat treatment, excess oxygen is easily released from the base insulating film 120, the gate insulating film 160, and the oxide insulating layer 180, so that oxygen vacancies in the oxide semiconductor layer 130 can be reduced.

Through the above process, the transistor 200 illustrated in FIGS. 6A to 6D can be formed.

This embodiment can be combined as appropriate with any of the other embodiments in this specification.

Embodiment 6

In this embodiment, an example of a semiconductor device (memory device) which includes a transistor of one embodiment of the present invention, which can retain stored data even when not powered, and which has an unlimited number of write cycles will be described with reference to drawings.

Figure 16A:
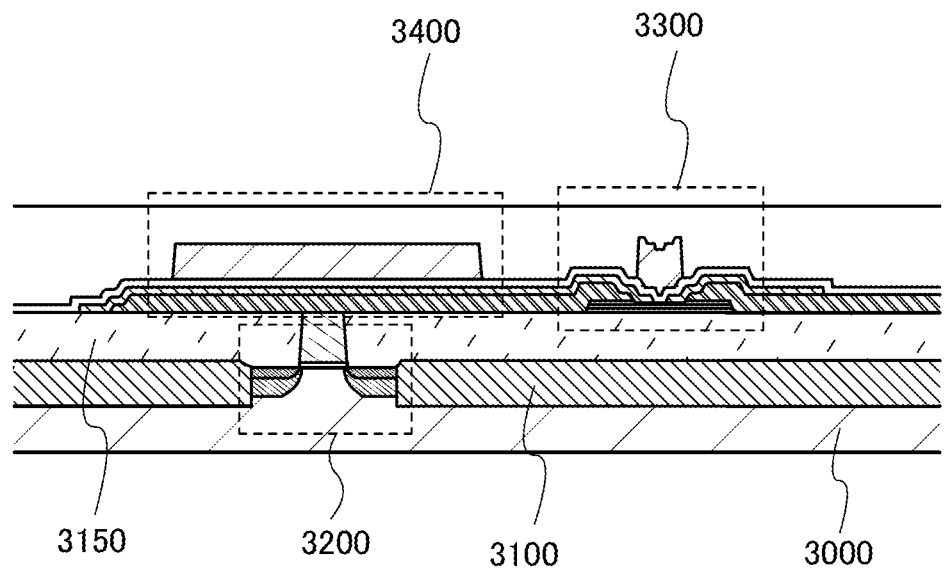
FIGS. 16A and 16B are a cross-sectional view and a circuit diagram of a semiconductor device.
Figure 16B:
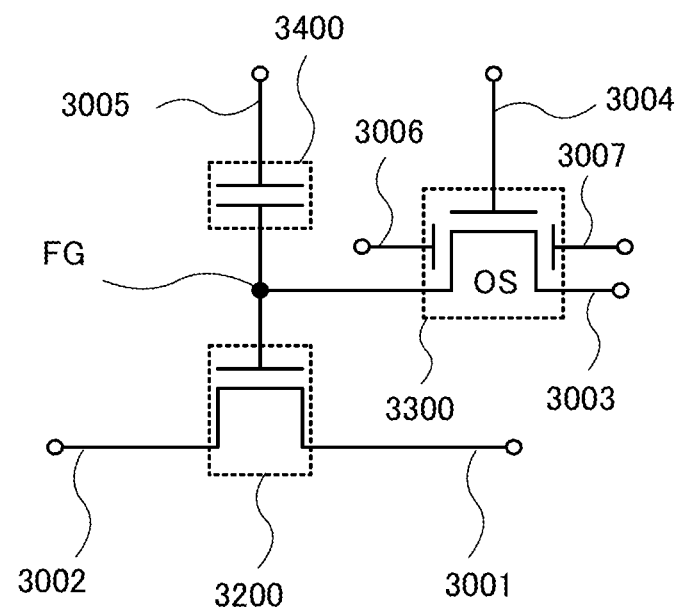

FIG. 16A is a cross-sectional view of the semiconductor device, and FIG. 16B is a circuit diagram of the semiconductor device.

The semiconductor device illustrated in FIGS. 16A and 16B includes a transistor 3200 including a first semiconductor material in a lower portion, and a transistor 3300 including a second semiconductor material and a capacitor 3400 in an upper portion. As the transistor 3300, the transistor described in Embodiment 1, 3, or 4 can be used, and an example in which the transistor 200 described in Embodiment 1 with reference to FIGS. 6A to 6D is applied to the transistor 3300 is described in this embodiment. Note that FIG. 16A illustrates a cross section of the portion taken along dashed-dotted line B5-B6 in FIG. 6A.

One electrode of the capacitor 3400 is formed using the same material as a source electrode layer and a drain electrode layer of the transistor 3300, the other electrode of the capacitor 3400 is formed using the same material as a gate electrode layer of the transistor 3300, and a dielectric of the capacitor 3400 is formed using the same material as the gate insulating film 160 of the transistor 3300; thus, the capacitor 3400 can be formed at the same time as the transistor 3300.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be held for a long time owing to its electrical characteristics, that is, the low off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to that described here except for the use of the transistor described in Embodiment 1, 3, or 4, which is formed using an oxide semiconductor for holding data.

The transistor 3200 in FIG. 16A includes a channel formation region provided in a substrate 3000 including a semiconductor material (such as crystalline silicon), impurity regions provided such that the channel formation region is provided therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region.

Further, an element isolation insulating layer 3100 is formed on the substrate 3000 so as to surround the transistor 3200, and an insulating layer 3150 is formed so as to cover the transistor 3200. Note that the element isolation insulating layer 3100 can be formed by an element isolation technique such as local oxidation of silicon (LOCOS) or shallow trench isolation (STI).

For example, in the case where the transistor 3200 is formed using a crystalline silicon substrate, the transistor 3200 can operate at high speed. Thus, when the transistor is used as a reading transistor, data can be read at high speed. As treatment prior to formation of the transistor 3300 and the capacitor 3400, CMP treatment is performed on the insulating layer 3150 covering the transistor 3200, whereby the insulating layer 3150 is planarized and, at the same time, an upper surface of the gate electrode layer of the transistor 3200 is exposed.

The transistor 3300 is provided over the insulating layer 3150, and one of the source electrode layer and the drain electrode layer thereof is extended so as to function as the one electrode of the capacitor 3400. Further, the one electrode of the capacitor 3400 is electrically connected to the gate electrode layer of the transistor 3200.

The transistor 3300 in FIG. 16A is a top-gate transistor in which a channel is formed in an oxide semiconductor layer. Since the off-state current of the transistor 3300 is low, stored data can be retained for a long period owing to such a transistor. In other words, refresh operation becomes unnecessary or the frequency of the refresh operation in a semiconductor memory device can be extremely low, which leads to a sufficient reduction in power consumption.

Although not illustrated, the transistor 3300 includes a second gate electrode layer and a third gate electrode layer each of which covers an end portion of the oxide semiconductor layer with the gate insulating film provided therebetween. The threshold voltage of the transistor 3300 can be controlled by supply of an appropriate potential to the second gate electrode layer and the third gate electrode layer. In addition, long-term reliability of the transistor 3300 can be improved. In the transistor 3300, the length in the channel width direction of each of the source electrode layer and the drain electrode layer is shorter than that of the first gate electrode layer, so that the controllability of the threshold voltage by the second gate electrode layer and the third gate electrode layer can be further improved.

The transistor 3200 and the transistor 3300 can be formed so as to overlap with each other as illustrated in FIG. 16A, whereby the area occupied by them can be reduced. Accordingly, the degree of integration of the semiconductor device can be increased.

An example of a circuit configuration corresponding to FIG. 16A is illustrated in FIG. 16B. Note that the circuit symbol of the transistor 3300 includes portions corresponding to the second gate electrode layer and the third gate electrode layer described in Embodiment 1.

In FIG. 16B, a first wiring 3001 is electrically connected to a source electrode layer of the transistor 3200. A second wiring 3002 is electrically connected to a drain electrode layer of the transistor 3200. A third wiring 3003 is electrically connected to the other of the source electrode layer and the drain electrode layer of the transistor 3300. A fourth wiring 3004 is electrically connected to the first gate electrode layer of the transistor 3300. A sixth wiring 3006 is electrically connected to the second gate electrode layer of the transistor 3300. A seventh wiring 3007 is electrically connected to the third gate electrode layer of the transistor 3300. The gate electrode layer of the transistor 3200 and the one of the source electrode layer and the drain electrode layer of the transistor 3300 are electrically connected to the one electrode of the capacitor 3400. A fifth wiring 3005 is electrically connected to the other electrode of the capacitor 3400.

Here, the fourth wiring 3004 which is electrically connected to the first gate electrode layer of the transistor 3300 is supplied with a potential for turning on or off the transistor 3300, and the sixth wiring 3006 and the seventh wiring 3007 which are electrically connected to the second gate electrode layer and the third gate electrode layer of the transistor 3300, respectively, are supplied with a constant potential, such as a ground potential or a negative potential, for controlling the threshold voltage of the transistor 3300. Note that the sixth wiring 3006 and the seventh wiring 3007 may be electrically connected to each other.

In the case where the transistor in one embodiment of the present invention without the third gate electrode layer is used, the above description for the third gate electrode layer can be ignored.

The semiconductor device in FIG. 16B utilizes a characteristic in which the potential of the gate electrode layer of the transistor 3200 can be held, and thus enables writing, holding, and reading of data as follows.

Writing and holding of data are described. First, the potential of the fourth wiring 3004 is set to a potential at which the transistor 3300 is turned on, so that the transistor 3300 is turned on. Accordingly, the potential of the third wiring 3003 is supplied to the gate electrode layer of the transistor 3200 and the capacitor 3400. That is, a predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode layer of the transistor 3200 is held (holding).

Since the off-state current of the transistor 3300 is extremely low, the charge of the gate electrode layer of the transistor 3200 is held for a long time.

In each of the writing and holding operations, a constant potential for reducing the absolute value of the threshold voltage and Icut of the transistor 3300 is supplied to the second gate electrode layer and the third gate electrode layer of the transistor 3300. Thus, data can be written with a smaller potential and leakage current in holding data can be made extremely low.

Next, reading of data is described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode layer can be read by determining the potential of the second wiring 3002.

Note that in the case where memory cells are arrayed, it is necessary that only data of a desired memory cell be able to be read. The fifth wiring 3005 in the case where data is not read may be supplied with a potential at which the transistor 3200 is turned off regardless of the state of the gate electrode layer, that is, a potential lower than $V_{th\_H}$. Alternatively, the fifth wiring 3005 may be supplied with a potential at which the transistor 3200 is turned on regardless of the state of the gate electrode layer, that is, a potential higher than $V_{th\_L}$.

When including a transistor having a channel formation region formed using an oxide semiconductor and having an extremely low off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics can be provided.

This embodiment can be combined as appropriate with any of the other embodiments in this specification.

Embodiment 7

In this embodiment, a semiconductor device including a transistor of one embodiment of the present invention, which can retain stored data even when not powered, which does not have a limitation on the number of write cycles, and which has a structure different from that described in Embodiment 6, will be described.

Figure 17:
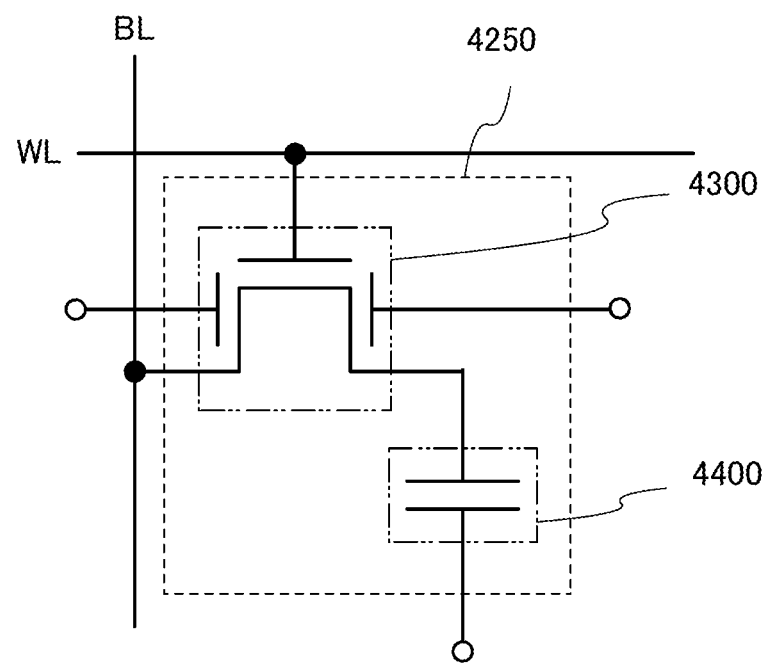
FIG. 17 is a circuit diagram of a semiconductor device.

FIG. 17 illustrates an example of a circuit configuration of the semiconductor device. In the semiconductor device, a bit line BL is electrically connected to a source electrode layer of a transistor 4300, a word line WL is electrically connected to a first gate electrode layer of the transistor 4300, and a drain electrode layer of the transistor 4300 is electrically connected to a first terminal of a capacitor 4400. Note that the transistor described in Embodiment 1, 3, or 4 can be used as the transistor 4300 included in the semiconductor device and the transistor 4300 includes portions corresponding to the second gate electrode layer and the third gate electrode layer described in Embodiment 1. Further, a wiring which is connected to a second gate electrode layer may be electrically connected to a wiring which is connected to a third gate electrode layer.

The semiconductor device (a memory cell 4250) can have a connection mode similar to that of the transistor 3300 and the capacitor 3400 illustrated in FIG. 16A. Thus, the capacitor 4400 can be formed through the same process and at the same time as the transistor 4300 in a manner similar to that of the capacitor 3400 described in Embodiment 6.

Next, writing and holding of data in the semiconductor device (a memory cell 4250) illustrated in FIG. 17 will be described.

First, a potential at which the transistor 4300 is turned on is supplied to the word line WL, so that the transistor 4300 is turned on. Accordingly, the potential of the bit line BL is supplied to the first terminal of the capacitor 4400 (writing). After that, the potential of the word line WL is set to a potential at which the transistor 4300 is turned off, so that the transistor 4300 is turned off. Thus, the potential of the first terminal of the capacitor 4400 is held (holding).

In addition, the transistor 4300 including an oxide semiconductor has an extremely low off-state current. For that reason, the potential of the first terminal of the capacitor 4400 (or a charge accumulated in the capacitor 4400) can be held for an extremely long time by turning off the transistor 4300.

In each of the writing and holding operations, a constant potential for reducing the absolute value of the threshold voltage and Icut of the transistor 4300 is supplied to the second gate electrode layer and the third gate electrode layer of the transistor 4300. Thus, data can be written with a smaller potential and leakage current in holding data can be made extremely low.

In the case where a transistor which does not include the third gate electrode layer in one embodiment of the present invention is used, the above description for the third gate electrode layer can be ignored.

Next, reading of data is described. When the transistor 4300 is turned on, the bit line BL which is in a floating state and the capacitor 4400 are electrically connected to each other, and the charge is redistributed between the bit line BL and the capacitor 4400. As a result, the potential of the bit line BL is changed. The amount of change in potential of the bit line BL varies depending on the potential of the first terminal of the capacitor 4400 (or the charge accumulated in the capacitor 4400).

For example, the potential of the bit line BL after charge redistribution is $(C_B \times V_{B0} + C \times V)/(C_B + C)$, where V is the potential of the first terminal of the capacitor 4400, C is the capacitance of the capacitor 4400, $C_B$ is the capacitance component of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4400 are $V_1$ and $V_0$ ($V_1 > V_0$), the potential of the bit line BL in the case of holding the potential $V_1$ (=$(C_B \times V_{B0} + C \times V_1)/(C_B + C)$) is higher than the potential of the bit line BL in the case of holding the potential $V_0$ (=$(C_B \times V_{B0} + C \times V_0)/(C_B + C)$).

Then, by comparing the potential of the bit line BL with a predetermined potential, data can be read.

As described above, the semiconductor device (the memory cell 4250) illustrated in FIG. 17 can hold charge that is accumulated in the capacitor 4400 for a long time because the off-state current of the transistor 4300 is extremely low. In other words, refresh operation becomes unnecessary or the frequency of the refresh operation can be extremely low, which leads to a sufficient reduction in power consumption. Moreover, stored data can be retained for a long period even when power is not supplied.

A substrate over which a driver circuit for the memory cell 4250 is formed and the memory cell 4250 illustrated in FIG. 17 are preferably stacked. When the memory cell 4250 and the driver circuit are stacked, the size of the semiconductor device can be reduced. Note that there is no limitation on the numbers of the memory cells 4250 and the driver circuits which are stacked.

It is preferable that a semiconductor material of a transistor included in the driver circuit be different from that of the transistor 4300. For example, silicon, germanium, silicon germanium, silicon carbide, or gallium arsenide can be used, and a single crystal semiconductor is preferably used. A transistor formed using such a semiconductor material can operate at higher speed than a transistor formed using an oxide semiconductor and is suitable for the driver circuit for the memory cell 4250.

As described above, a miniaturized and highly-integrated semiconductor device having high electric characteristics can be provided.

This embodiment can be combined as appropriate with any of the other embodiments in this specification.

Embodiment 8

In this embodiment, a CPU in which at least the transistor described in Embodiment 1, 3, or 4 can be used and the storage device described in Embodiment 6 is included will be described.

Figure 18:
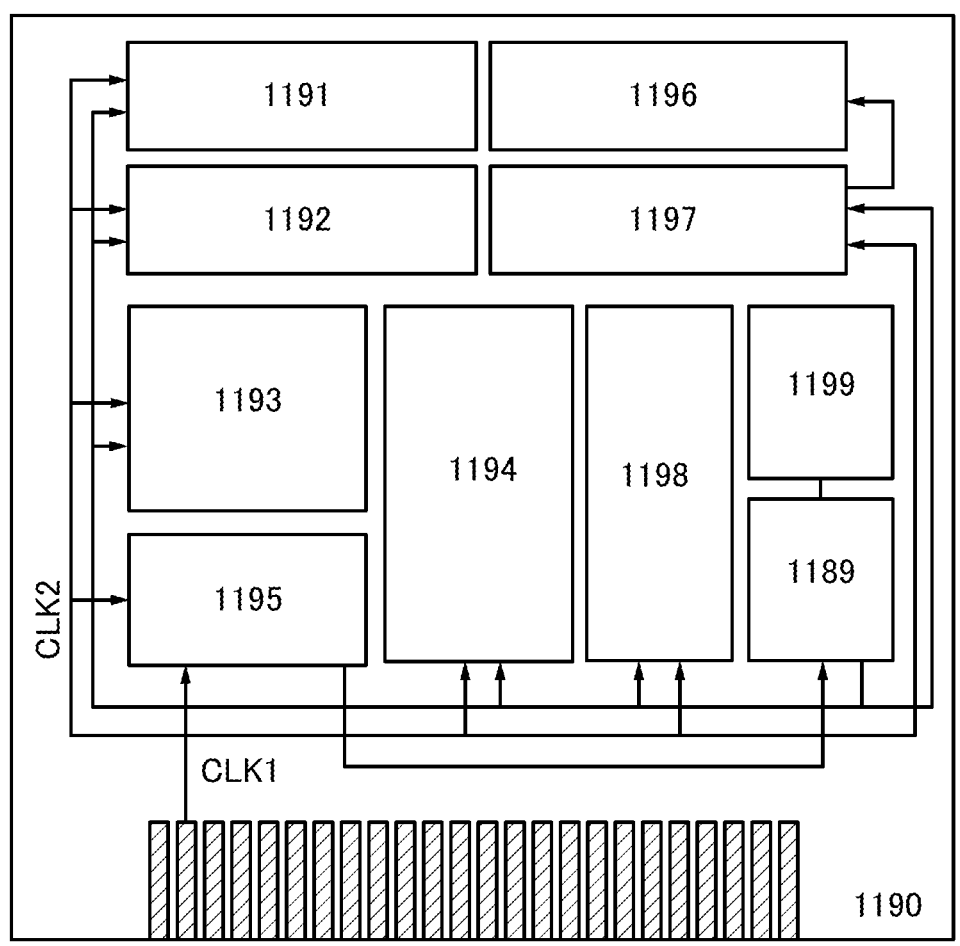
FIG. 18 is a block diagram of a semiconductor device.

FIG. 18 is a block diagram illustrating a configuration example of a CPU at least partly including any of the transistors described in Embodiment 1, 3, or 4.

The CPU illustrated in FIG. 18 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 18 is just an example in which the configuration has been simplified, and an actual CPU may have various configurations depending on the application. For example, the CPU in FIG. 18 may have the following configuration: the CPU illustrated in FIG. 18 is considered as one core and a plurality of the cores (e.g., 2, 4, or 8 cores) are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 18, a memory cell is provided in the register 1196. As the memory cell of the register 1196, any of the transistors described in the above embodiments can be used.

In the CPU illustrated in FIG. 18, the register controller 1197 selects operation of holding data in the register 1196 in accordance with an instruction from the ALU 1191. That is, the register controller 1197 selects whether data is stored by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 19:
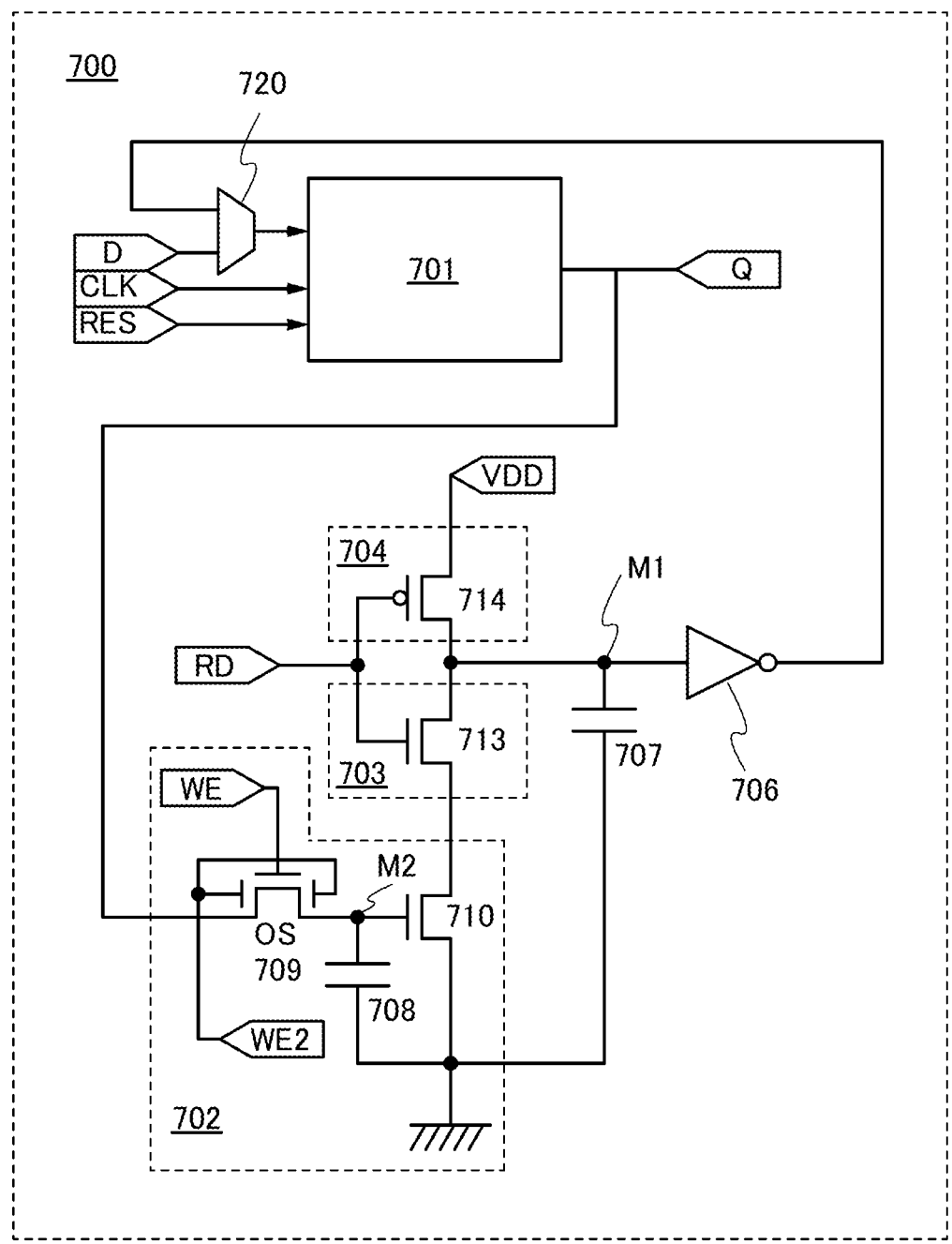
FIG. 19 is a circuit diagram illustrating a storage device.

FIG. 19 is an example of a circuit diagram of a storage element that can be used as the register 1196. A memory element 700 includes a volatile memory circuit 701, a nonvolatile memory circuit 702, a switch 703, a switch 704, a logic element 706, a capacitor 707, and a selector circuit 720. The nonvolatile memory circuit 702 includes a capacitor 708, a transistor 709, and a transistor 710. Note that the memory element 700 may further include another circuit element such as a diode, a resistor, or an inductor, as needed.

Here, the storage device described in Embodiment 6 can be used as the nonvolatile memory circuit 702. When supply of the power supply voltage to the memory element 700 is stopped, a ground potential (0 V) or a potential at which the transistor 709 in the nonvolatile memory circuit 702 is turned off continues to be input to a first gate of the transistor 709. For example, the first gate of the transistor 709 is grounded through a load such as a resistor.

An example in which the switch 703 is a transistor 713 having one conductivity type (e.g., an n-channel transistor) and the switch 704 is a transistor 714 having a conductivity type opposite to the one conductivity type (e.g., a p-channel transistor) is described. Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a low potential power supply line (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a power supply line to which a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the low potential power supply line (e.g., a GND line). The other of the pair of electrodes of the capacitor 708 can be supplied with a constant potential. For example, the other of the pair of electrodes of the capacitor 708 can be supplied with the low power supply potential (e.g., GND) or the high power supply potential (e.g., VDD). The other of the pair of electrodes of the capacitor 708 is electrically connected to the low potential power supply line (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode layer) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the volatile memory circuit 701 is input to the other of the source and the drain of the transistor 709. FIG. 19 illustrates an example in which a signal output from the volatile memory circuit 701 is input to the other of the source and the drain of the transistor 709. The logic value of a signal output from the second terminal of the switch 703 (the other of the source and the drain of the transistor 713) is inverted by the logic element 706, and the inverted signal is input to the volatile memory circuit 701 through the selector circuit 720.

In the example of FIG. 19, a signal output from the second terminal of the switch 703 (the other of the source and the drain of the transistor 713) is input to the volatile memory circuit 701 through the logic element 706 and the selector circuit 720; however, this embodiment is not limited thereto. The signal output from the second terminal of the switch 703 (the other of the source and the drain of the transistor 713) may be input to the volatile memory circuit 701 without its logic value being inverted. For example, in the case where a node in which a signal obtained by inversion of the logic value of a signal input from the input terminal is held is provided in the volatile memory circuit 701, the signal output from the second terminal of the switch 703 (the other of the source and the drain of the transistor 713) can be input to the node.

The transistor 709 in FIG. 19 can be the transistor described in Embodiment 1, 3, or 4, and includes the first gate (first gate electrode layer), a second gate (second gate electrode layer), and a third gate (third gate electrode layer). The control signal WE can be input to the first gate and the control signal WE2 can be input to the second gate and the third gate. Although a mode in which the second gate and the third gate are electrically connected to each other is illustrated, a signal may be supplied to the second gate and the third gate independently. The control signal WE2 is a signal having a constant potential. As the constant potential, a ground potential or a negative potential is selected, for example. The control signal WE2 is a potential signal for controlling the threshold voltage of the transistor 709, and Icut of the transistor 709 can be further reduced. Note that as the transistor 709 in FIG. 19, the transistor in one embodiment of the present invention without the third gate (third gate electrode layer) can be used.

Further, in FIG. 19, the transistors included in the memory element 700 except for the transistor 709 can each be a transistor in which a channel is formed in a layer formed using a semiconductor other than an oxide semiconductor or in the substrate 1190. For example, a transistor in which a channel is formed in a silicon layer or a silicon substrate can be used. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the volatile memory circuit 701 in FIG. 19, for example, a flip-flop circuit can be used. As the logic element 706, for example, an inverter, a clocked inverter, or the like can be used.

The above is the structure of the memory element 700. Next, a driving method of the memory element 700 will be described.

A driving method of the memory element 700 in the case where the supply of the power supply voltage is made, stopped for a reduction in power consumption at the time of data holding, and then made again, is described with reference to a timing chart in FIG. 20. In the timing chart in FIG. 20, reference numeral 701 denotes data held in the volatile memory circuit 701, reference symbol WE denotes the potential of the control signal WE, reference symbol WE2 denotes the potential of the control signal WE2, reference symbol RD denotes the potential of the control signal RD, reference symbol SEL denotes the potential of the control signal SEL of one path in the selector circuit 720, and reference symbol VDD denotes the power supply potential VDD. Reference symbol M1 denotes the potential of the node M1, and reference symbol M2 denotes the potential of the node M2. Note that the one path in the selector circuit 720 is a path connecting the output side of the nonvolatile memory circuit 702 and the input side of the volatile memory circuit 701.

In the driving method below, an example will be described where, in the case of using an n-channel transistor for the switch 703 and a p-channel transistor for the switch 704 in the structure illustrated in FIG. 19, the first terminal and the second terminal of the switch 703 are brought into conduction and the first terminal and the second terminal of the switch 704 are brought out of conduction when the control signal RD has a high-level potential, and the first terminal and the second terminal of the switch 703 are brought out of conduction and the first terminal and the second terminal of the switch 704 are brought into conduction when the control signal RD has a low-level potential. Further, in this example, a first terminal and a second terminal in one path in the selector circuit 720 are brought into conduction when the control signal SEL has a high-level potential, and the first terminal and the second terminal therein are brought out of conduction when the control signal SEL has a low-level potential. Furthermore, in the case of using an n-channel transistor for the transistor 709 in this example, the transistor 709 is turned on when the control signal WE has a high-level potential and the transistor 709 is turned off when the control signal WE has a low-level potential.

However, a driving method of the semiconductor device of one embodiment of the present invention is not limited to this, and in the following description, the potential of each control signal can be determined such that the switch 703, the switch 704, the selector circuit 720, and the transistor 709 are in the same state.

Figure 20:
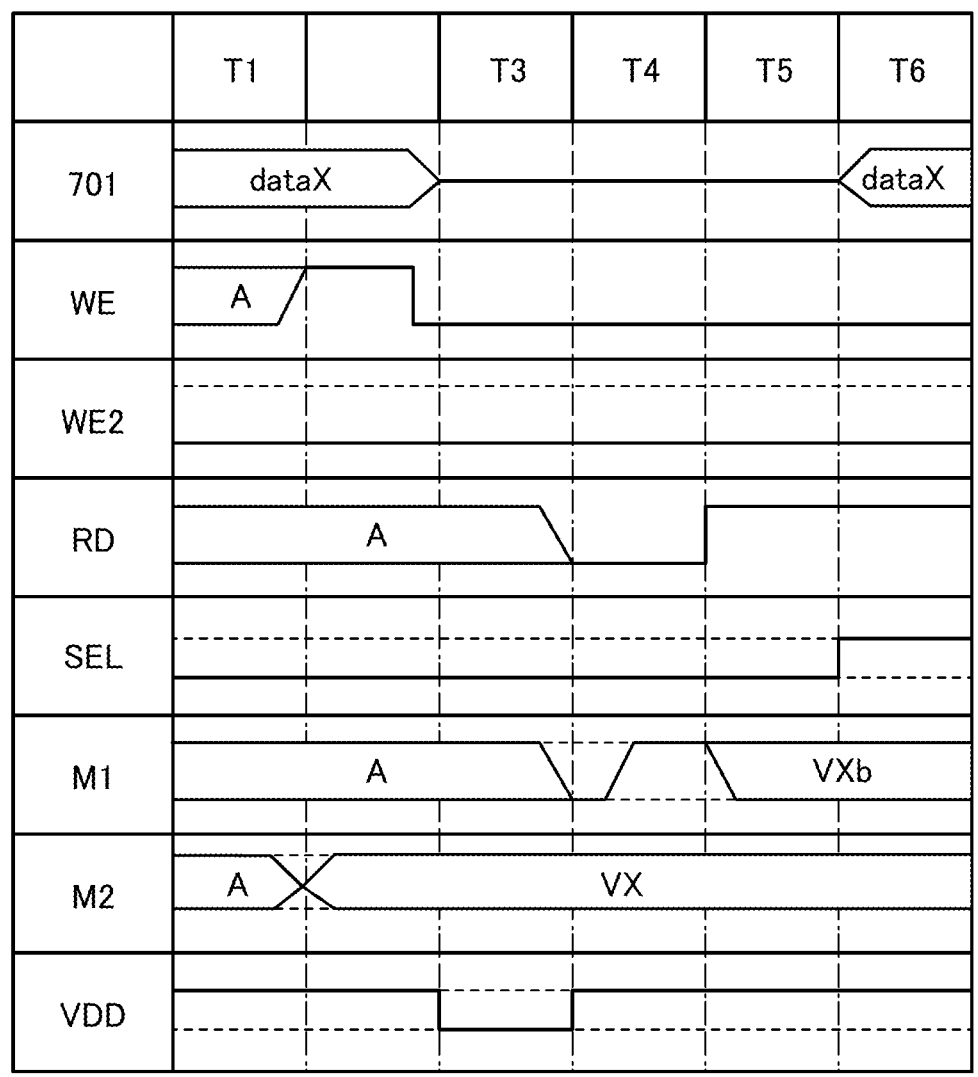
FIG. 20 is a timing chart showing operation of a storage device.

First, the operation in a period T1 in FIG. 20 is described. In T1, the power supply voltage VDD is supplied to the memory element 700. In a period during which the power supply voltage is supplied to the memory element 700, data (referred to as dataX in FIG. 20) is held in the volatile memory circuit 701. At this time, the control signal SEL has a low-level potential so that the first terminal and the second terminal in the one path in the selector circuit 720 are out of conduction. Note that the first terminal and the second terminal of each of the switch 703 and the switch 704 may be in either the conduction state or the non-conduction state. That is, the control signal RD may have either a high-level potential or a low-level potential (referred to as A in FIG. 20). Further, the transistor 709 may be either on or off. That is, the control signal WE may have either a high-level potential or a low-level potential (referred to as A in FIG. 20). In T1, the node M1 may have any potential (referred to as A in FIG. 20). In T1, the node M2 may have any potential (referred to as A in FIG. 20). The operation in T1 is referred to as normal operation. The control signal WE2 has a constant potential, for example, a low level potential in any period.

Next, the operation in a period T2 in FIG. 20 will be described. Before supply of the power supply voltage to the memory element 700 is stopped, the control signal WE is set to a high-level potential so that the transistor 709 is turned on. Thus, a signal corresponding to data (dataX) held in the volatile memory circuit 701 is input to the gate of the transistor 710 through the transistor 709. The signal input to the gate of the transistor 710 is held by the capacitor 708. In this manner, the potential of the node M2 becomes a signal potential (referred to as VX in FIG. 20) corresponding to the data held in the volatile memory circuit 701. After that, the control signal WE is set to a low-level potential so that the transistor 709 is turned off. Thus, a signal corresponding to the data held in the volatile memory circuit 701 is held in the nonvolatile memory circuit 702. Also in T2, the first terminal and the second terminal in the one path in the selector circuit 720 are kept in the non-conduction state owing to the control signal SEL. The first terminal and the second terminal of each of the switch 703 and the switch 704 may be in either the conduction state or the non-conduction state. That is, the control signal RD may have either a high-level potential or a low-level potential (referred to as A in FIG. 20). In T2, the node M1 may have any potential (referred to as A in FIG. 20). The operation in T2 is referred to as operation before stop of supply of the power supply voltage.

Next, the operation in a period T3 in FIG. 20 will be described. The operation before stop of supply of the power supply voltage is performed, and then, the supply of the power supply voltage to the memory element 700 is stopped at the beginning of T3. When the supply of the power supply voltage is stopped, the data (dataX) held in the volatile memory circuit 701 is lost. However, even after the supply of the power supply voltage to the memory element 700 is stopped, the signal potential (VX) corresponding to the data (dataX) held in the volatile memory circuit 701 is held in the node M2 by the capacitor 708. Here, as the transistor 709 in which the channel is formed in the oxide semiconductor layer, an n-channel enhancement (normally-off) transistor whose leakage current (off-state current) is extremely small is used. Therefore, since a ground potential (0 V) or a potential at which the transistor 709 is turned off continues to be input to the gate of the transistor 709 when supply of the power supply voltage to the memory element 700 is stopped, the transistor 709 can be kept in the off state even after the supply of the power supply voltage to the memory element 700 is stopped. As a result, a potential held by the capacitor 708 (the potential VX of the node M2) can be held for a long time. In this manner, even after the supply of the power supply voltage to the memory element 700 is stopped, data (dataX) is held. T3 corresponds to a period during which the supply of the power supply voltage to the memory element 700 is stopped.

Then, the operation in a period T4 in FIG. 20 will be described. After the supply of the power supply voltage to the memory element 700 is restarted, the control signal RD is set to a low-level potential; thus, the first terminal and the second terminal of the switch 704 are brought into conduction and the first terminal and the second terminal of the switch 703 are brought out of conduction. At this time, the control signal WE is a low-level potential, and the transistor 709 remains off. The control signal SEL is a low-level potential, and thus the first terminal and the second terminal in the one path in the selector circuit 720 are in the non-conduction state. In this manner, VDD is input to the second terminal of the switch 703 and the first terminal of the switch 704. Therefore, the second terminal of the switch 703 and the first terminal of the switch 704 (the potential of the node M1) can be set to a constant potential (here, VDD). The operation in T4 is referred to as pre-charge operation. The potential of the node M1 is held by the capacitor 707.

After the above pre-charge operation, in a period T5, the control signal RD is set to a high-level potential; thus, the first terminal and the second terminal of the switch 703 are brought into conduction and the first terminal and the second terminal of the switch 704 are brought out of conduction. At this time, the control signal WE is kept at a low-level potential, and the transistor 709 remains off. The control signal SEL has a low-level potential, and thus the first terminal and the second terminal in the one path in the selector circuit 720 are out of conduction. Depending on a signal held in the capacitor 708 (the potential VX of the node M2), the on/off state of the transistor 710 is selected, and the potential of the second terminal of the switch 703 and the first terminal of the switch 704, i.e., the potential of the node M1 is determined In the case where the transistor 710 is on, the low power supply potential (e.g., GND) is input to the node M1. On the other hand, in the case where the transistor 710 is off, the potential of the node M1 is kept at a constant potential (e.g., VDD) which is determined by the above pre-charge operation. In this manner, depending on the on state or the off state of the transistor 710, the potential of the node M1 becomes VDD or GND. For example, in the case where a signal held in the volatile memory circuit 701 is "1" and corresponds to a high-level signal (VDD), the potential of the node M1 becomes a low-level potential (GND) corresponding to a signal "0". On the other hand, in the case where a signal held in the volatile memory circuit 701 is "0" and corresponds to a low-level potential (GND), the potential of the node M1 becomes a high-level potential (VDD) corresponding to a signal "1". That is, an inverted signal of a signal held in the volatile memory circuit 701 is held in the node M1. This potential is denoted as VXb in FIG. 20. That is, a signal corresponding to the data (dataX) input from the volatile memory circuit 701 in T2 is converted into the potential of the node M1 (VXb).

After that, in a period T6, the control signal SEL is set to a high-level potential, so that the first terminal and the second terminal in the one path in the selector circuit 720 are brought into conduction. At this time, the control signal RD is kept at a high-level potential. The control signal WE is kept at a low-level potential, and thus the transistor 709 remains off. Consequently, the phase of a signal corresponding to the potential of the second terminal of the switch 703 and the first terminal of the switch 704 (the potential of the node M1 (VXb)) is inverted through the logic element 706, and this inverted signal can be input to the volatile memory circuit 701. In this manner, the data which has been held before the stop of supplying the power supply voltage to the memory element 700 (dataX) can be held in the volatile memory circuit 701 again.

The potential of the node M1 is set to a constant potential (VDD in FIG. 20) by the pre-charge operation in T4, and becomes the potential VXb corresponding to the data (dataX) in T5. Since the pre-charge operation is performed, the time required for the potential of the node M1 to be set to the constant potential VXb can be shortened. In this manner, the time required for the volatile memory circuit 701 to hold original data again after the supply of the power supply voltage is restarted can be shortened.

The above is the driving method of the memory element.

In the driving method of the semiconductor device of one embodiment of the present invention, in a period during which the memory element 700 is not supplied with the power supply voltage, data stored in the volatile memory circuit 701 can be held by the capacitor 708 which is provided in the nonvolatile memory circuit 702.

The off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the volatile memory circuit 701 to hold original data again after the supply of the power supply voltage is restarted can be shortened.

In the nonvolatile memory circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the nonvolatile memory circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory device can be returned to the same state as that before the power supply is stopped. Therefore, the power supply can be stopped even for a short time in the processor or one or a plurality of logic circuits included in the processor. Accordingly, power consumption can be suppressed.

Although the CPU is given as an example here, the transistor can also be applied to an LSI such as a digital signal processor (DSP), a custom LSI, or a field programmable gate array (FPGA).

Embodiment 9

In this embodiment, examples of an electronic device which can include the transistor described in Embodiment 1, 3, or 4, the storage device described in Embodiment 6, or 7, or the CPU described in Embodiment 8 will be described.

The transistor described in Embodiment 1, 3, or 4, the storage device described in Embodiment 6, or 7, or the CPU described in Embodiment 8 can be applied to a variety of electronic devices (including game machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipments such as dialyzers and X-ray diagnostic equipments. In addition, the examples of the electronic devices include alarm devices such as smoke detectors, heat detectors, gas alarm devices, and security alarm devices. Further, the examples of the electronic devices also include industrial equipments such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Some specific examples of these electronic devices are illustrated in FIGS. 21A to 21C.

Figure 21A:
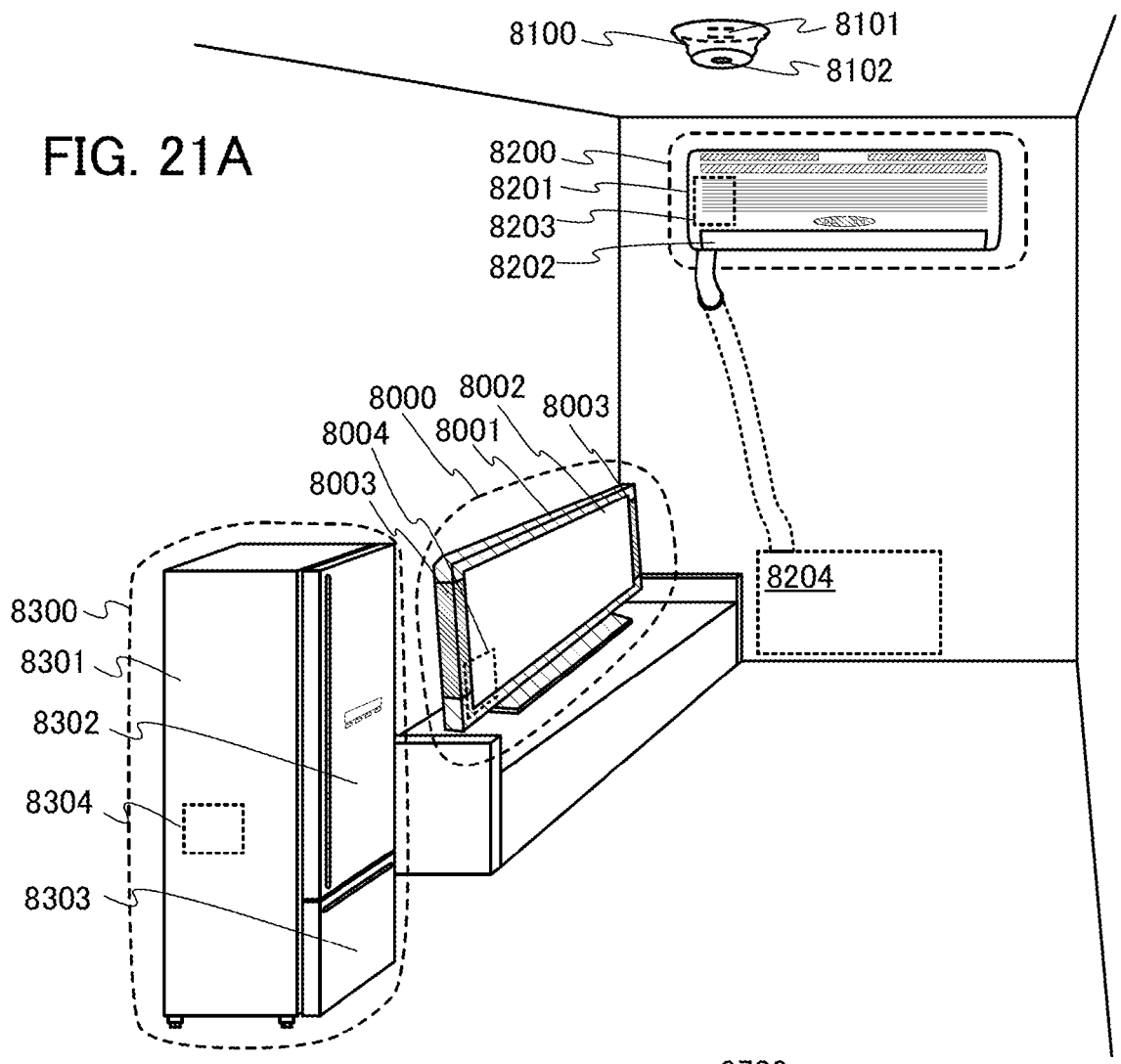
FIGS. 21A to 21C illustrate electronic devices to which semiconductor devices can be applied.
Figure 21B:
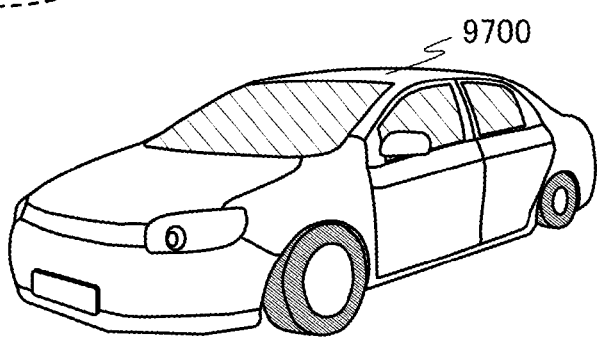
Figure 21C:
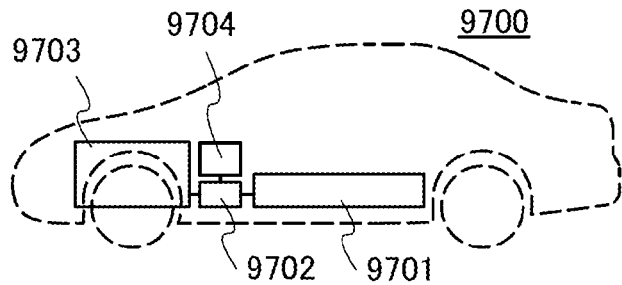

An alarm device 8100 illustrated in FIG. 21A is a residential fire alarm, which is an example of an electronic device including a sensor portion 8102 for smoke or heat and a microcomputer 8101. Note that the microcomputer 8101 is an example of an electronic device including the transistor, the storage device, or the CPU described in any of the above embodiments.

An air conditioner which includes an indoor unit 8200 and an outdoor unit 8204 illustrated in FIG. 21A is an example of an electronic device including the transistor, the storage device, or the CPU described in any of the above embodiments. Specifically, the indoor unit 8200 includes a housing 8201, an air outlet 8202, a CPU 8203, and the like. Although the CPU 8203 is provided in the indoor unit 8200 in FIG. 21A, the CPU 8203 may be provided in the outdoor unit 8204. Alternatively, the CPU 8203 may be provided in both the indoor unit 8200 and the outdoor unit 8204. By using any of the transistors described in the above embodiments for the CPU in the air conditioner, a reduction in power consumption of the air conditioner can be achieved.

An electronic refrigerator-freezer 8300 illustrated in FIG. 21A is an example of an electronic device including the transistor, the storage device, or the CPU described in any of the above embodiments. Specifically, the electric refrigerator-freezer 8300 includes a housing 8301, a door for a refrigerator 8302, a door for a freezer 8303, a CPU 8304, and the like. In FIG. 21A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

FIGS. 21B and 21C illustrate an example of an electronic vehicle which is an example of an electronic device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts a direct current into an alternate current is also incorporated.

This embodiment can be combined as appropriate with any of the other embodiments in this specification.

This application is based on Japanese Patent Application serial no. 2012-251496 filed with Japan Patent Office on Nov. 15, 2012, the entire contents of which are hereby incorporated by reference.

What is claimed is:

1. A semiconductor device comprising:
an oxide semiconductor layer over a substrate;
a source electrode layer and a drain electrode layer in contact with the oxide semiconductor layer;
a gate insulating film over the oxide semiconductor layer, the source electrode layer, and the drain electrode layer; and
a first gate electrode layer and a second gate electrode layer over the gate insulating film,
wherein the first gate electrode layer and the second gate electrode layer are separated from each other,
wherein the first gate electrode layer overlaps with the oxide semiconductor layer, the source electrode layer, and the drain electrode layer,
wherein the second gate electrode layer overlaps with an end portion of the oxide semiconductor layer, and
wherein a length of each of the source electrode layer and the drain electrode layer in a channel width direction is shorter than a length of the first gate electrode layer in the channel width direction.

2. The semiconductor device according to claim 1, further comprising a third gate electrode layer overlapping with an end portion of the oxide semiconductor layer,
wherein the first gate electrode layer is located between the second gate electrode layer and the third gate electrode layer.

3. The semiconductor device according to claim 1, further comprising a third gate electrode layer overlapping with the end portion of the oxide semiconductor layer,
wherein the third gate electrode layer is next to the second gate electrode layer in a channel length direction.

4. The semiconductor device according to claim 1, wherein a length of the second gate electrode layer in a channel length direction is shorter than a length of the first gate electrode layer in the channel length direction.

5. A semiconductor device comprising:
an oxide semiconductor layer over a substrate, the oxide semiconductor layer comprising a first oxide semiconductor layer, a second oxide semiconductor layer, and a third oxide semiconductor layer stacked in this order from the substrate side,
a source electrode layer and a drain electrode layer in contact with the oxide semiconductor layer;
a gate insulating film over the oxide semiconductor layer, the source electrode layer, and the drain electrode layer; and
a first gate electrode layer and a second gate electrode layer over the gate insulating film,
wherein the first gate electrode layer and the second gate electrode layer are separated from each other,
wherein the first gate electrode layer overlaps with the oxide semiconductor layer, the source electrode layer, and the drain electrode layer,
wherein the second gate electrode layer overlaps with an end portion of the oxide semiconductor layer, and
wherein a length of each of the source electrode layer and the drain electrode layer in a channel width direction is shorter than a length of the first gate electrode layer in the channel width direction.

6. The semiconductor device according to claim 5,
wherein energy of a bottom of a conduction band of each of the first oxide semiconductor layer and the third oxide semiconductor layer is closer to a vacuum level than energy of a bottom of a conduction band of the second oxide semiconductor layer is, and
wherein an energy difference between the second oxide semiconductor layer and the first oxide semiconductor layer and an energy difference between the second oxide semiconductor layer and the third oxide semiconductor layer are each greater than or equal to 0.05 eV and smaller than or equal to 2 eV.

7. The semiconductor device according to claim 5,
wherein each of the first oxide semiconductor layer, the second oxide semiconductor layer, and the third oxide semiconductor layer includes In, Zn, and an element selected from Al, Ti, Ga, Y, Zr, La, Ce, Nd, and Hf, and
wherein an atomic ratio of the element with respect to In in each of the first oxide semiconductor layer and the third oxide semiconductor layer is higher than an atomic ratio of the element with respect to In in the second oxide semiconductor layer.

8. The semiconductor device according to claim 5,
wherein the second oxide semiconductor layer includes a crystal whose c-axis is aligned in a direction approximately perpendicular to a surface of the second oxide semiconductor layer, and
wherein the third oxide semiconductor layer includes a crystal whose c-axis is aligned in a direction approximately perpendicular to a surface of the third oxide semiconductor layer.

9. The semiconductor device according to claim 5,
wherein the source electrode layer comprises a first source electrode layer in contact with the oxide semiconductor layer and a second source electrode layer covering the first source electrode layer and in contact with the oxide semiconductor layer, and
wherein the drain electrode layer comprises a first drain electrode layer in contact with the oxide semiconductor layer and a second drain electrode layer covering the first drain electrode layer and in contact with the oxide semiconductor layer.

10. The semiconductor device according to claim 9,
wherein each of the first source electrode layer and the first drain electrode layer is formed using Al, Cr, Cu, Ta, Ti, Mo, W, or an alloy material comprising any of Al, Cr, Cu, Ta, Ti, Mo, and W as a main component of the alloy material, and
wherein each of the second source electrode layer and the second drain electrode layer is formed using a material comprising tantalum nitride, titanium nitride, or ruthenium.

11. The semiconductor device according to claim 5,
wherein the source electrode layer comprises a first source electrode layer in contact with the oxide semiconductor layer and a second source electrode layer over the first source electrode layer and in contact with the oxide semiconductor layer, and
wherein the drain electrode layer comprises a first drain electrode layer in contact with the oxide semiconductor layer and a second drain electrode layer over the first drain electrode layer and in contact with the oxide semiconductor layer.

12. The semiconductor device according to claim 11,
wherein each of the first source electrode layer and the first drain electrode layer is formed using a material comprising tantalum nitride, titanium nitride, or ruthenium, and
wherein each of the second source electrode layer and the second drain electrode layer is formed using Al, Cr, Cu, Ta, Ti, Mo, W, or an alloy material comprising any of Al, Cr, Cu, Ta, Ti, Mo, and W as a main component of the alloy material.

13. The semiconductor device according to claim 5, further comprising a third gate electrode layer overlapping with an end portion of the oxide semiconductor layer,
   wherein the first gate electrode layer is located between the second gate electrode layer and the third gate electrode layer.

14. The semiconductor device according to claim 5, further comprising a third gate electrode layer overlapping with the end portion of the oxide semiconductor layer,
   wherein the third gate electrode layer is next to the second gate electrode layer in a channel length direction.

15. The semiconductor device according to claim 5, wherein a length of the second gate electrode layer in a channel length direction is shorter than a length of the first gate electrode layer in the channel length direction.

16. A semiconductor device comprising:
   a first oxide semiconductor layer over a substrate;
   a second oxide semiconductor layer over the first oxide semiconductor layer;
   a first source electrode layer and a first drain electrode layer over the second oxide semiconductor layer;
   a third oxide semiconductor layer over the second oxide semiconductor layer, the first source electrode layer, and the first drain electrode layer;
   a gate insulating film over the third oxide semiconductor layer; and
   a first gate electrode layer and a second gate electrode layer over the gate insulating film,
   wherein each of the first source electrode layer and the first drain electrode layer is in contact with the first oxide semiconductor layer, the second oxide semiconductor layer, and the third oxide semiconductor layer,
   wherein the first gate electrode layer and the second gate electrode layer are separated from each other,
   wherein the first gate electrode layer overlaps with the first oxide semiconductor layer, the second oxide semiconductor layer, the third oxide semiconductor layer, the first source electrode layer, and the first drain electrode layer,
   wherein the second gate electrode layer overlaps with an end portion of the first oxide semiconductor layer, an end portion of the second oxide semiconductor layer, and an end portion of the third oxide semiconductor layer, and
   wherein a length of each of the first source electrode layer and the first drain electrode layer in a channel width direction is smaller than a length of the first gate electrode layer in the channel width direction.

17. The semiconductor device according to claim 16, further comprising a second source electrode layer and a second drain electrode layer over the third oxide semiconductor layer,
   wherein a length of each of the second source electrode layer and the second drain electrode layer in the channel width direction is shorter than the length of the first gate electrode layer in the channel width direction.

18. The semiconductor device according to claim 16, further comprising a third gate electrode layer overlapping with an end portion of the oxide semiconductor layer,
   wherein the first gate electrode layer is located between the second gate electrode layer and the third gate electrode layer.

19. The semiconductor device according to claim 16, further comprising a third gate electrode layer overlapping with the end portion of the first oxide semiconductor layer, the end portion of the second oxide semiconductor layer, and the end portion of the third oxide semiconductor layer,
   wherein the third gate electrode layer is next to the second gate electrode layer in a channel length direction.

20. The semiconductor device according to claim 16, wherein a length of the second gate electrode layer in a channel length direction is shorter than a length of the first gate electrode layer in the channel length direction.

* * * * *